(12) United States Patent
Yokokawa

(10) Patent No.: US 7,937,648 B2
(45) Date of Patent: May 3, 2011

(54) DECODING DEVICE, CONTROL METHOD, AND PROGRAM

(75) Inventor: Takashi Yokokawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 1170 days.

(21) Appl. No.: 11/640,256

(22) Filed: Dec. 18, 2006

(65) Prior Publication Data

US 2007/0204197 A1 Aug. 30, 2007

(30) Foreign Application Priority Data

Dec. 20, 2005 (JP) ................................. 2005-365909

(51) Int. Cl.
*H03M 13/11* (2006.01)
*H03M 13/45* (2006.01)

(52) U.S. Cl. ........................................................ 714/780

(58) Field of Classification Search ................... 714/780
See application file for complete search history.

(56) References Cited

U.S. PATENT DOCUMENTS

| | | | |
|---|---|---|---|
| 6,938,196 B2 | 8/2005 | Richardson et al. | |
| 7,383,485 B2 * | 6/2008 | Tran et al. ...................... | 714/780 |
| 7,398,453 B2 * | 7/2008 | Yu ................................. | 714/778 |
| 7,500,168 B2 * | 3/2009 | Yoshida ........................ | 714/752 |
| 2005/0240853 A1 | 10/2005 | Yokokawa et al. | |
| 2005/0257124 A1 | 11/2005 | Richardson et al. | |
| 2005/0268206 A1 | 12/2005 | Tran et al. | |
| 2008/0104474 A1 * | 5/2008 | Gao et al. ...................... | 714/752 |
| 2008/0195913 A1 * | 8/2008 | Bates et al. ................... | 714/752 |
| 2008/0320214 A1 * | 12/2008 | Ma et al. ....................... | 711/103 |
| 2009/0013239 A1 * | 1/2009 | Blanksby ...................... | 714/801 |
| 2009/0083604 A1 * | 3/2009 | Tong et al. .................... | 714/752 |

FOREIGN PATENT DOCUMENTS

| | | |
|---|---|---|
| JP | 2004-186940 | 7/2004 |
| JP | 2004-364233 | 12/2004 |
| JP | 2005-064735 | 3/2005 |
| JP | 2005-065065 | 3/2005 |
| JP | 2005-065066 | 3/2005 |
| JP | 2005-506733 | 3/2005 |
| JP | 2006-019889 | 1/2006 |
| JP | 2006-121686 | 5/2006 |
| JP | 2006-148937 | 6/2006 |

(Continued)

OTHER PUBLICATIONS

Guilloud, F., "Architecture générique de décodeur de codes LDPC" Thésé Présentéé Pour Obtenir Le Grade De Docteur De L'Écolenationale Supéreure Des Télécommunications, Jul. 2, 2004, pp. 43-58 (XP002370625).

(Continued)

*Primary Examiner* — Stephen M Baker
(74) *Attorney, Agent, or Firm* — Finnegan, Henderson, Farabow, Garrett & Dunner, L.L.P.

(57) ABSTRACT

A decoding device for decoding LDPC (Low Density Parity Check) codes includes a message calculation unit for performing a variable node calculation for decoding the LPDC codes using a message to be supplied, or performing a check node calculation, and outputting the message to be obtained as a result of the calculation, a storing unit for storing the message, and a control unit for performing writing control for writing the message that the message calculation unit outputs in the storing unit, and readout control for reading out the same message to be employed for the calculation of the message calculation unit from the storing unit twice, and supplying these to the message calculation unit.

14 Claims, 40 Drawing Sheets

FOREIGN PATENT DOCUMENTS

| | | |
|---|---|---|
| JP | 2006-339799 | 12/2006 |
| WO | WO-03/032499 A1 | 4/2003 |

OTHER PUBLICATIONS

Mansour, M. M. et al "Low-Power VLSI Decoder Architectures for LDPC Codes" Low Power Electronics and Design, 2002, ISLPED '02 Proceedings of the 2002 International Symposium on Aug. 12-14, 2002, Piscataway, NJ, USA, IEEE, Aug. 12, 2002. pp. 284-289 (XP010800916).

Howland, "Parallel Decoding Architectures for Low Density Parity Check Codes," IEEE, High Speed Communications VLSI Research Department, Agere Systems, pp. IV-742-IV-745, (2001).

\* cited by examiner

FIG. 1

$$H = \begin{bmatrix} & \cdots 1 \cdots 1 \cdot 1 & \cdots \cdots 1 \cdots 1 \cdots 1 \\ & \vdots \\ & 1 \\ & \vdots \\ & 1 \end{bmatrix}$$

FIG. 4

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 11

| | | | | | |
|---|---|---|---|---|---|
| RAM #A | R(node#1) | W(node#1) | R(node#3) | R(node#3) | R(node#5) |
| RAM #B | | R(node#2) | W(node#2) | R(node#4) | W(node#4) |

FIG. 16

RAM #A: R1 (node#1) | R2 (node#1) | W (node#1) | R1 (node#3) | R2 (node#3) | W (node#3) | R1 (node#5)

RAM #B: R1 (node#2) | R2 (node#2) | W (node#2) | R1 (node#4) | R2 (node#4) | W (node#4)

FIG. 40

| RAM #A | R1 (node#1) | R2 (node#1) | W (node#1) | | R1 (node#3) | R2 (node#3) | W (node#3) | | R1 (node#5) |
| RAM #B | | | | R1 (node#2) | R2 (node#2) | W (node#2) | | R1 (node#4) | R2 (node#4) | W (node#4) |

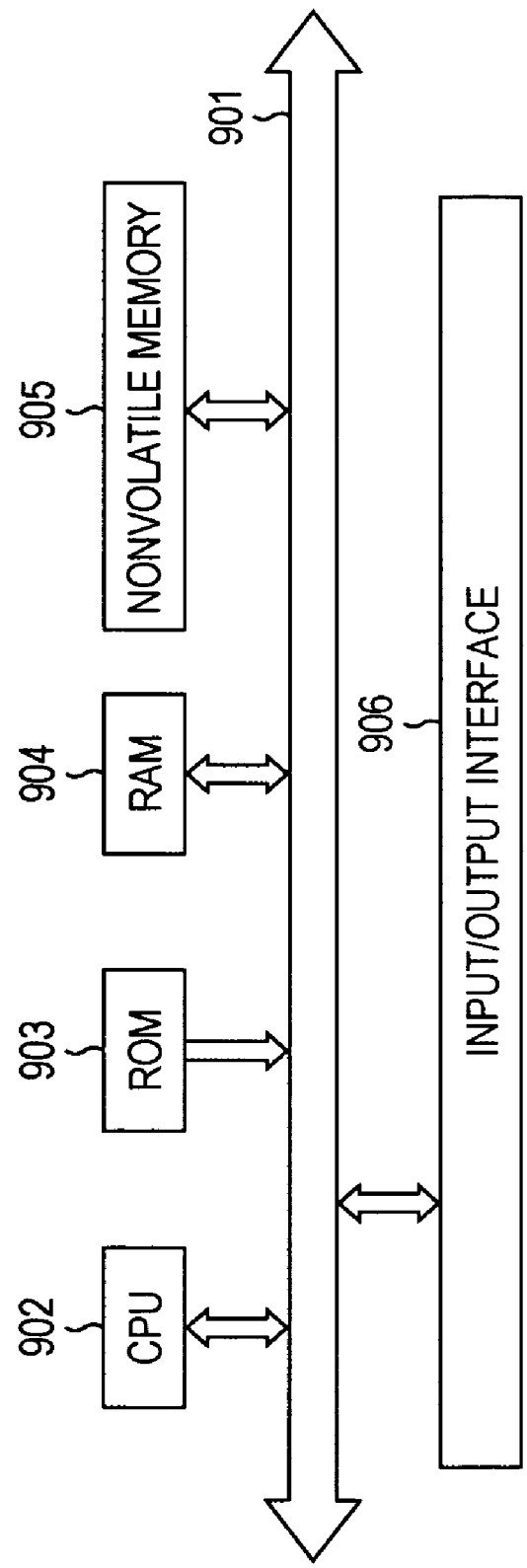

DECODING DEVICE, CONTROL METHOD, AND PROGRAM

CROSS REFERENCES TO RELATED APPLICATIONS

The present invention contains subject matter related to Japanese Patent Application JP 2005-365909 filed in the Japanese Patent Office on Dec. 20, 2005, the entire contents of which are incorporated herein by reference.

BACKGROUND OF THE INVENTION

1. Field of the Invention

The present invention relates to a decoding device, a control method, and a program, and particularly, relates to a decoding device, a control method, and a program, whereby the scale of a decoding device for decoding LDPC (Low Density Parity Check) codes can be reduced for example.

2. Description of the Related Art

In recent years, study of telecommunications fields such as mobile communication or deep space telecommunication, and study of broadcasting fields such as terrestrial broadcasting or satellite digital broadcasting, for example, have been being advanced markedly, but along therewith, study relating to code theory is being actively pursued to improve the efficiency of error correction coding and decoding.

As for the theoretical limit of code capabilities, the Shannon limit provided by so-called C. E. Shannon's channel coding theorem has been known. Study relating to code theory is being performed as an object to develop codes indicating capabilities close to this Shannon limit. In recent years, as for an encoding method exhibiting capabilities close to the Shannon limit, for example, a technique so-called Turbo coding such as parallel concatenated convolutional codes (PCCC), and serially concatenated convolutional codes (SCCC) has been developed. Also, while such Turbo coding has been developed, low density parity check codes (hereafter, referred to as LDPC codes), which is an ancient known encoding method, have been being spotlighted.

LDPC codes have been proposed for the first time in "Low Density Parity Check Codes" by R. G. Gallager, Cambridge, Mass.: M. I. T. Press, 1963, and subsequently, have resulted in having been attracted in "Good error correcting codes based on very spare matrices" by D. J. C. MacKay, Submitted to IEEE Trans. Inf. Theory, IT-45, pp. 399-431, 1999, "Analysis of low density codes and improved designs using irregular graphs" by M. G. Luby, M. Mitzenmacher, M. A. Shokrollahi and D. A. Spielman, in Proceedings of ACM Symposium on Theory of Computing, pp. 249-258, 1998, and so forth.

LDPC codes have been known to obtain capabilities close to the Shannon limit as the code length has been lengthened, as with Turbo codes and so forth. Also, LDPC codes have a property wherein the minimum distance is in proportion to code length, and accordingly as for the features thereof, excellent block error probability property, and further the fact that so-called error floor phenomenon, which is observed in the decoding properties of Turbo codes or the like, seldom occurs, can be cited as advantages.

Specific description will be made below regarding such LDPC codes. Note that LDPC codes are linear codes, and while it is not always necessary to be binary, description will be made assuming that LDPC codes are binary.

With LDPC codes, it is the maximum feature that a parity check matrix defining the LDPC codes thereof is a nondense matrix. Here, a nondense matrix is a matrix made up of an extremely small number of "1" of matrix components, and if we say that a nondense parity check matrix is denoted as H, as for such a parity check matrix H, for example, as illustrated in FIG. 1, the hamming weight of each row (the number of "1") (weight) is "3", and also the hamming weight of each line is "6", and so on.

Thus, the LDPC codes defined by the parity check matrix H wherein the hamming weights of each line and each row are constant are referred to as regular LDPC codes. On the other hand, the LDPC codes defined by the parity check matrix H wherein the hamming weights of each line and each row are not constant are referred to as irregular LDPC codes.

Encoding using such LDPC codes is realized by generating a generator matrix G based on the parity check matrix H, and generating a codeword by multiplying a binary information message by the generator matrix G. Specifically, an encoding device for performing encoding using LDPC codes first calculates the generator matrix G wherein Expression $GH^T=0$ holds between the transposed matrix $H^T$ of the parity check matrix H and the generator matrix G. Here, in the event that the generator matrix G is a k×n matrix, the encoding device multiplies the generator matrix G by an information message (vector u) made up of k bits to generate a codeword c (=uG) made up of n bits. The codeword generated by this encoding device is subjected to mapping such as the value of a code bit "0" being mapped as "+1", and the value of a code bit "1" being mapped as "−1", and is transmitted, and is consequently received at the reception side via a predetermined communication channel.

On the other hand, decoding of LDPC codes is an algorithm proposed by Gallager calling this as probabilistic decoding, and can be performed by a message passing algorithm using probability propagation (belief propagation) on a so-called Tanner graph, which is made up of variable nodes (also referred to as message nodes), and check nodes. Here, variable nodes and check nodes are also simply referred to as nodes below as appropriate.

However, with probabilistic decoding, a message exchanged between nodes is an actual value, so in order to solve this analytically, it is necessary to trace the probabilistic distribution itself of the message indicating a continuous value, resulting in requiring an analysis accompanying extreme difficulty. Therefore, Gallager has proposed an algorithm A or an algorithm B as a decoding algorithm of LDPC codes.

Decoding of an LDPC code is performed in accordance with a procedure such as illustrated in FIG. 2, for example. Now, let us say that the i'th of reception data of an LDPC code having a code length is $U_0$ ($u_{0i}$), the j'th message output from a check node (message output from the j'th branch connected to a check node) is $u_j$, and the i'th message output from a variable node (message output from the i'th branch connected to a variable node) is $v_i$. Also, the term "message" mentioned here is an actual value that represents the identity of a value "0" using a so-called log likelihood ratio.

First, with decoding of an LDPC code, as illustrated in FIG. 2, in step S11, the reception data $U_0$ ($u_{0i}$) is received, the message $u_j$ is initialized to "0", and also a variable k representing an integer as a repeat processing counter is initialized to "0", the flow proceeds to step S12. In step S12, the message $v_i$ is obtained by performing the variable node calculation shown in Expression (1) based on the reception data $U_0$ ($u_{0i}$), and further the message $u_j$ is obtained by performing the check node calculation shown in Expression (2) based on the message $v_i$.

$$v_i = u_{0i} + \sum_{j=1}^{d_v-1} u_j \qquad (1)$$

$$\tanh\left(\frac{u_j}{2}\right) = \prod_{i=1}^{d_c-1} \tanh\left(\frac{v_i}{2}\right) \qquad (2)$$

Here, the $d_v$ and $d_c$ in Expression (1) and Expression (2) are parameters that indicate the number of "1" in the vertical direction (rows) and in the lateral direction (lines) of the parity check matrix H, and are arbitrarily selectable respectively. For example, (3, 6) code yields $d_v=3$, and $d_c=6$.

Note that with the calculation of Expression (1) or (2), the message input from a branch (edge) to output a message is not employed as the target of an OR or AND operation, and accordingly, the range of an OR or AND operation is 1 through $d_v-1$, or 1 through $d_c-1$. Also, the calculation shown in Expression (2) can be performed by creating the table of the function R(v1, v2) shown in Expression (3) that is defined as 1 output as to two inputs v1 and v2 beforehand, and employing this continuously (recursively) such as shown in Expression (4).

$$x = 2\tan h^{-1}\{\tan h(v_1/2)\tan h(v_2/2)\} = R(v_1, v_2) \qquad (3)$$

$$u_j = R(v_1, R(v_2, R(v_3, \ldots R(v_{d_c-2}, v_{d_c-1})))) \qquad (4)$$

In step S12, the variable k is further incremented by "1", and the flow proceeds to step S13. In step S13, determination is made whether or not the variable k is a predetermined number of repeated decoding times N or more. In step S13, in the event that determination is made that the variable k is less than the N, the flow returns to step S12, and thereafter, the same processing is repeatedly performed.

Also, in the event that determination is made in step S13 that the variable k is not less than the N, the flow proceeds to step S14, where the message v which is a decoding result finally output by performing the calculation shown in Expression (5) is obtained and output, and the decoding processing of the LDPC code is completed.

$$v = u_{0i} + \sum_{j=1}^{d_v} u_j \qquad (5)$$

Here, the calculation of Expression (5) is performed using the message $u_j$ from all of the branches connected to a variable node, which is different from the calculation of Expression (1).

With such decoding of an LDPC code, exchange of a message between nodes is performed in the event of (3, 6) code for example, such as illustrated in FIG. 3. Note that the nodes shown with in FIG. 3 represent variable nodes, where the variable node calculation shown in Expression (1) is performed. Note that the nodes shown with "+" in FIG. 3 represent check nodes, where the check node calculation shown in Expression (2) is performed. Particularly, with the algorithm A, a message is binarized, the exclusive OR logical operation of $d_c-1$ input messages (message $v_i$ input to a check node) is performed at the nodes shown with "+", and in the event that $d_v-1$ input messages (message $u_j$ input to a variable node) have all a different bit value as to reception data R at the variable nodes shown with "=", the signs thereof are inverted and output.

Also, on the other hand, in recent years, study relating to an implementation method of decoding of LDPC codes has been performed. First, decoding of an LDPC code will be schematically described prior to description regarding the implementation method.

FIG. 4 is an example of the parity check matrix H of (3, 6) LDPC code (encoding ratio of ½, code length of 12). The parity check matrix H of an LDPC code can be written and represented with a Tanner graph such as FIG. 5. Here, in FIG. 5, the nodes represented with "+" are check nodes, and the nodes represented with "=" are variable nodes. The check nodes and variable nodes correspond to the lines and rows of the parity check matrix respectively. A crossline between a check node and a variable node is a branch (edge), and corresponds to the "1" of the parity check matrix H. That is to say, in the event that the component of the j'th line and the i'th row of the parity check matrix is 1, the i'th variable node (node of "=") from the top, and the j'th check node (node of "+") from the top are connected by a branch in FIG. 5. A branch represents that the bits of the LDPC code (of reception data) corresponding to a variable node have the constraint condition corresponding to a check node. Note that FIG. 5 is the Tanner graph of the parity check matrix H in FIG. 4.

A sum product algorithm serving as a decoding method of LDPC codes repeatedly performs a variable node calculation and a check node calculation.

At a variable node the variable node calculation of Expression (1) is performed such as FIG. 6. That is to say, in FIG. 6, the message $v_i$ corresponding to a branch to be calculated (the i'th branch of the branches connected to a variable node) is calculated using the messages $u_1$ and $u_2$ from the residual branches connected to a variable node, and the reception data $u_{0i}$. The messages corresponding to other branches are also calculated in the same way.

Prior to description regarding a check node calculation, Expression (2) is rewritten such as Expression (6) using the relation of Expression $a \times b = \exp\{\ln(|a|)+\ln(|b|)\} \times \text{sign}(a) \times \text{sign}(b)$. However, sign(x) is 1 (logical 0) when $x \geq 0$, and is $-1$ (logical 1) when $x<0$.

$$u_j = 2\tanh^{-1}\left(\prod_{i=1}^{d_c-1} \tanh\left(\frac{v_i}{2}\right)\right) \qquad (6)$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

Further, when defining a nonlinear function $\Phi(x)=-\ln(\tan h(x/2))$ in $x \geq 0$, the inverse function $\Phi^{-1}(x)$ thereof is represented with Expression $\Phi^{-1}(x)=2\tan h^{-1}(e^{-x})$, so Expression (6) can be written such as Expression (7).

$$u_j = \phi^{-1}\left(\sum_{i=1}^{d_c-1} \phi(|v_i|)\right) \times \prod_{i=1}^{d_c-1} \text{sign}(v_i) \qquad (7)$$

At a check node the check node calculation of Expression (7) is performed such as FIG. 7. That is to say, in FIG. 7, the message $u_j$ corresponding to a branch to be calculated (the j'th branch of the branches connected to a check node) is calculated using the messages $v_1$, $v_2$, $v_3$, $v_4$, and $v_5$ from the residual branches connected to a check node. The messages corresponding to other branches are also calculated in the same way.

Note that the function $\Phi(x)$ can be also represented as $\Phi(x)=\ln((e^x+1)/(e^x-1))$, and with $x>0$, $\Phi(x)=\Phi^{-1}(x)$, i.e., the calculation result of the nonlinear $\Phi(x)$ and the calculation result of the inverse function $\Phi^{-1}(x)$ thereof are the same. When implementing the functions $\Phi(x)$ and $\Phi^{-1}(x)$ on hardware, implementation is sometimes made using an LUT (Look Up Table), but both share the same LUT.

Also, the variable node calculation of Expression (1) can be broken down into Expression (5) and the following Expression (8).

$$v_i = v - u_{d_v} \tag{8}$$

Therefore, the calculations of Expression (5), Expression (8), and Expression (7) are repeatedly performed, whereby the variable node calculation of Expression (1) and the check node calculation of Expression (7) can be repeatedly performed. In this case, of the variable node calculations of Expression (5) and Expression (8), the calculation result of Expression (5) can be determined as the final decoding result as it is.

In the event of implementing the sum product algorithm on hardware, it is necessary to perform the variable node calculation (the calculation of a variable node) represented with Expression (1) (or Expression (5) and Expression (8)), and the check node calculation (the calculation of a check node) represented with Expression (7) repeatedly with a suitable circuit scale and operating frequency.

Description will be made regarding the implementation method of full serial decoding for performing decoding by simply sequentially performing the calculation of each of the nodes one by one as an implementation example of a decoding device.

FIG. 8 illustrates a configuration example of a decoding device for performing decoding of LDPC codes.

With the decoding device in FIG. 8, the message corresponding to one branch is calculated for each one clock of an operating clock.

Specifically, the decoding device in FIG. 8 is made up of a message calculation unit 101, message memory 104, reception data memory 105, and a control unit 106. Also, the message calculation unit 101 is made up of a variable node calculator 102 and a check node calculator 103.

With the decoding device in FIG. 8, the message calculation unit 101 sequentially reads out a message from the message memory 104 one by one, and calculates the message corresponding to a desired branch using the message thereof. Subsequently, the message obtained by the calculation thereof is stored in the message memory 104. The decoding device in FIG. 8 performs repeat decoding by repeatedly performing the above processing.

That is to say, reception data (LDPC code) D100 which is a log likelihood ratio representing the identity of code 0 (or 1) that can be obtained by receiving an LDPC code transmitted is supplied to the reception data memory 105, and the reception data memory 105 stores the reception data D100 thereof.

At the time of a variable node calculation, the reception data memory 105 reads out the stored reception data in accordance with the control signal supplied from the control unit 106, and supplies this to the variable node calculator 103 of the message calculation unit 101 as reception data D101.

Also, at the time of a variable node calculation, the message memory 104 reads out the stored message (check node message $u_j$) D102 in accordance with the control signal supplied from the control unit 106, and supplies this to the variable node calculator 102. The variable node calculator 102 performs the variable node calculation of Expression (1) using the message D102 supplied from the message memory 104, and the reception data D101 supplied from the reception data memory 105, and supplies the message (variable node message) $v_i$ obtained as a result of the variable node calculation thereof to the message memory 104 as a message D103.

Subsequently, the message memory 104 stores the message D103 that is supplied from the variable node calculator 102 thus described above.

On the other hand, at the time of a check node calculation, the message memory 104 reads out the stored variable node message $v_i$ in accordance with the control signal supplied from the control unit 106 as a message D104, and supplies this to the check node calculator 103.

The check node calculator 103 performs the check node calculation of Expression (7) using the message D104 that is supplied from the message memory 104, and supplies the message (check node message) $u_j$ obtained by the check node calculation thereof to the message memory 104 as a message D105.

Subsequently, the message memory 104 stores the message D105 that is supplied from the check node calculator 103 thus described above.

The message D105 from the check node calculator 103 that the message memory 104 stored, i.e., the check node message $u_j$ is read out as the message D102 at the time of the next variable node calculation, and is supplied to the variable node calculator 102.

FIG. 9 illustrates a configuration example of the variable node calculator 102 in FIG. 8 for performing variable node calculations one by one.

The variable node calculator 102 includes two input ports P101 and P102 as input ports to which a message (data) is externally supplied (input), and one output port P103 as a port for supplying (outputting) a message externally. Subsequently, the variable node calculator 102 performs the variable node calculation of Expression (1) using the message that is input from each of the input ports P101 and P102, and outputs the message obtained as a result thereof from the output port P103.

That is to say, the input port P101 is supplied with the reception data D101 read out from the reception data memory 105. Also, the input port P102 is supplied with the message D102 (check node message $u_j$) read out from the message memory 104.

The variable node calculator 102 reads in the message D102 (message $u_j$) from the check node corresponding to each line of the parity check matrix from the input port P102 one by one, and supplies the message D102 thereof to a calculator 151 and FIFO memory 155. Also, the variable node calculator 102 reads in the reception data D101 from the reception data memory 105 from the input port P101 one by one, and supplies this to a calculator 157.

The calculator 151 integrates the message D102 by adding the message D102 (message $u_j$) and a value D151 stored in a register 152, and restores the integration value obtained as a result thereof in the register 152. Note that in the event of the messages D102 from all of the branches across one row of the parity check matrix being integrated, the register 152 is reset to zero.

In the event that the messages D102 across one row of the parity check matrix are read in one by one, and the integration value of the messages D102 of one row worth are stored in the register 152, i.e., in the event that the integration value ($\Sigma u_j$ of j=1 through $d_v$) wherein the messages D102 (messages $u_j$) from all of the branches across one row of the parity check matrix are integrated is stored in the register 152, a selector 153 selects the value stored in the register 152, i.e., the integration value D151 ($\Sigma u_j$ of j=1 through $d_v$) wherein the messages D102 (messages $u_j$) of all of the branches across one row of the parity check matrix are integrated, and outputs this to a register 154 to store this.

The register 154 supplies the stored value D151 to the selector 153 and a calculator 156 as a value D152. The selector 153 selects the value D152 supplied from the register 154, and outputs this to the register 154 to restore this until immediately before the value wherein the messages D102 of one row worth are integrated is stored in the register 152. That is to say, the register 154 supplies the value previously integrated to the selector 153 and the calculator 156 until the messages D102 (messages $u_j$) from all of the branches across one row of the parity check matrix are integrated.

On the other hand, the FIFO memory 155 delays the message D102 from a check node to supply this to the calculator 156 as a value D153 until a new value D152 ($\Sigma u_j$ of j=1 through $d_v$) is output from the register 154. The calculator 156 subtracts the value D153 supplied from the FIFO memory 155 from the value D152 supplied from the register 154. That is to say, the calculator 156 subtracts the message $u_j$ supplied from a desired branch from the integration value ($\Sigma u_j$ of j=1 through $d_v$) of the messages D102 (messages $u_j$) of all of the branches across one row of the parity check matrix to obtain the subtraction value thereof ($\Sigma u_j$ of j=1 through $d_v-1$), and supplies this to the calculator 157.

The calculator 157 adds the reception data D101 from the input port P101, and the subtraction value from the calculator 156 ($\Sigma u_j$ of j=1 through $d_v-1$), and outputs the addition value obtained as a result thereof from the output port P103 as a message D103 (message $v_i$).

As described above, the variable node calculator 102 performs the variable node calculation of Expression (1) ($v_i=u_{0i}+\Sigma u_j$), and outputs the message (variable node message) $v_i$ obtained as a result thereof from the output port P103.

FIG. 10 illustrates a configuration example of the check node calculator 103 in FIG. 8 for performing check node calculations one by one.

The check node calculator 103 includes one input port P111 as an input port to which a message (data) is externally supplied (input), and one output port P112 as a port for supplying (outputting) a message externally. Subsequently, the variable node calculator 103 performs the check node calculation of Expression (7) using the message that is input from the input port P111, and outputs the message obtained as a result thereof from the output port P112.

That is to say, the input port P111 is supplied with the message D104 (variable node message $V_i$) read out from the message memory 104.

With the check node calculator 103, the message D104 (message $v_i$) from the variable node corresponding to each row of the parity check matrix is read in from the input port P111 one by one, and the lower bits except for the most significant bit thereof, i.e., the absolute value D122 ($|v_i|$) of the message D104 is supplied to an LUT 121, and also the most significant bit, i.e., the sign bit D121 of the message D104 is supplied to an EXOR circuit 129 and FIFO (First In First Out) memory 133.

The LUT 121 is an LUT for outputting the calculation result of the nonlinear function $\Phi(x)$ in the check node calculation of Expression (7) with the value that is input thereto as an argument x, reads out the calculation result D123 ($\Phi(|v_i|)$) of the calculation of the nonlinear function $\Phi(|v_i|)$ in response to supply of the absolute value D122 ($|v_i|$), and supplies this to a calculator 122 and FIFO memory 127.

The calculator 122 integrates the calculation result D123 by adding the calculation result D123 ($\Phi(|v_i|)$) and a value D124 stored in a register 123, and restores the integration value obtained as a result thereof in the register 123. Note that in the event that the calculation result D123 ($\Phi(|v_i|)$) as to the absolute values D122 ($|v_i|$) of the messages D104 of all of the branches across one line of the parity check matrix are integrated, the register 123 is reset to zero.

In the event that the messages D104 across one line of the parity check matrix are read in one by one, and the integration value wherein the calculation result D123 of one line worth is integrated is stored in the register 123, a selector 124 selects the value stored in the register 123, i.e., the integration value D124 ($\Sigma\Phi(|v_i|)$ of i=1 through $i=d_c$) wherein $\Phi(|v_i|)$ obtained from the messages D104 (messages $v_i$) from all of the branches across one line of the parity check matrix is integrated, and outputs this to a register 125 as a value D125 to store this. The register 125 supplies the stored value D125 to the selector 124 and a calculator 126 as a value D126.

The selector 124 selects the value D126 supplied from the register 125, and outputs this to the register 125 to restore this until immediately before the integration value wherein the calculation results D123 of one line worth are integrated is stored in the register 123. That is to say, the register 125 supplies the integration value of $\Phi(|v_i|)$ previously integrated to the selector 124 and the calculator 126 until $\Phi(|v_i|)$ obtained from the messages D104 (messages $u_j$) from all of the branches across one line of the parity check matrix is integrated.

On the other hand, the FIFO memory 127 delays the calculation result D123 ($\Phi(|v_i|)$) that the LUT 121 outputs until a new value D126 ($\Sigma\Phi(|v_i|)$ of i=1 through $i=d_c$) is output from the register 125, and supplies this to the calculator 126 as a value D127. The calculator 126 subtracts the value D127 supplied from the FIFO memory 127 from the value D126 supplied from the register 125, and supplies the subtraction result thereof to an LUT 128 as a subtraction value D128. That is to say, the calculator 126 subtracts $\Phi(|v_i|)$ obtained through the message supplied from a desired branch (message $v_i$ of $i=d_c$) from the integration value ($\Sigma\Phi(|v_i|)$ of i=1 through $i=d_c$) of $\Phi(|v_i|)$ obtained from the messages D104 (messages $v_i$) from all of the branches across one line of the parity check matrix, and supplies the subtraction value thereof ($\Sigma\Phi(|v_i|)$ of i=1 through $i=d_c-1$) to the LUT 128 as a subtraction value D128.

The LUT 128 is an LUT for outputting the calculation result of the inverse function $\Phi^{-1}(x)$ of the nonlinear function $\Phi(x)$ in the check node calculation of Expression (7) with the value that is input thereto as an argument x, outputs the calculation result D129 ($\Phi^{-1}(\Sigma\Phi(|v_i|))$) of the calculation of the inverse function $\Phi^{-1}(\Sigma\Phi(|v_i|))$ in response to supply of the subtraction value D128 ($\Sigma\Phi(|v_i|)$ of i=1 through $i=d_c-1$) from the calculator 126.

Note that as described above, the calculation result of the nonlinear function $\Phi(x)$ and the calculation result of the inverse function $\Phi^{-1}(x)$ are equal, and accordingly, the LUT 121 and LUT 128 have the same configuration.

In parallel with the above processing, the EXOR circuit 129 calculates exclusive OR between the value D131 stored in a register 130 and the sign bit (bit represents positive/negative) D121, whereby multiplication is made between the sign bits D121 of the messages D104, and the multiplication result D130 is restored in the register 130. Note that in the event that the sign bits D121 of the messages D104 from all of the branches across one line of the parity check matrix are multiplied, the register 130 is reset.

In the event that the multiplication result D130 ($\Pi sign(v_i)$ of i=1 through $i=d_c$) wherein the sign bits D121 of the messages D104 from all of the branches across one line of the parity check matrix are multiplied is stored in the register 130, a selector 131 selects the value stored in the register 130, i.e., the value D131 ($\Pi sign(v_i)$ of i=1 through i=$d_c$) wherein the sign bits D121 of the messages D104 from all of the branches across one line of the parity check matrix are multiplied, and outputs this to a register 132 as a value D132 to store this. The register 132 supplies the stored value D132 to the selector 131 and an EXOR circuit 134 as a value D133.

The selector 131 selects the value D133 supplied from the register 132, and outputs this to the register 132 to restore this until immediately before the multiplication result D130 ($\Pi sign(v_i)$ of i=1 through i=$d_c$) wherein the sign bits D121 of the messages D104 from all of the branches across one line of the parity check matrix are multiplied is restored in the register 130. That is to say, the register 132 supplies the value previously stored to the selector 131 and the EXOR circuit 134 until the sign bits D121 of the messages D104 (messages $v_i$) from all of the branches across one line of the parity check matrix are multiplied.

On the other hand, the FIFO memory 133 delays the sign bit D121 until a new value D133 ($\Pi sign(v_i)$ of i=1 to i=$d_c$) is supplied to the EXOR circuit 134, and supplies this to the EXOR circuit 134 as one bit value D134. The EXOR circuit 134 calculates exclusive OR between the value D133 supplied from the register 132 and the value D134 supplied from the FIFO memory 133, whereby the value D133 is divided by the value D134 to output the division result thereof as a division value D135. That is to say, the EXOR circuit 134 divides the multiplication value of the sign bits D121 (sign ($v_i$)) of the messages D104 from all of the branches across one line of the parity check matrix by the sign bit D121 (sign($v_i$)) of the message D104 from a desired branch, and outputs the division value ($\Pi sign(v_i)$ of i=1 to i=$d_c$-1) thereof as a division value D135.

Subsequently, with the check node calculator 103, a bit string wherein the calculation result D129 output from the LUT 128 is taken as lower bits, and the division value D135 output from the EXOR circuit 134 is taken as the most significant bit (sign bit) is output from the output port P112 as a message D105 (message $u_j$).

As described above, with the check node calculator 103, the calculation of Expression (7) is performed to obtain a message (check node message) $u_j$.

Note that though not shown in the drawing, with the decoding device in FIG. 8, the calculation of Expression (5) is performed instead of the variable node calculation of Expression (1) at the final stage of decoding, and the calculation result is output as the final decoding result.

According to the decoding device in FIG. 8, the LDPC code of various types of parity check matrix can be decoded as long as there is sufficient capacity for the message memory 104 (FIG. 8), the FIFO memory 155 of the variable node calculator 102 (FIG. 9), and the FIFO memory 127 and 133 of the check node calculator 103 (FIG. 10).

FIG. 11 is a timing chart illustrating the read/write timing of a message as to the message memory 104 of the decoding device in FIG. 8.

With the decoding device in FIG. 8, at the time of a variable node calculation, the message (check node message) $u_j$ from a check node is read out from the message memory 104, and while the variable node calculator 102 of the message calculator 101 performs a variable node calculation using the message $u_j$ read out from the message memory 104, the message (variable node message) $v_i$ obtained as a result of the variable node calculation thereof is written in the message memory 104.

Also, at the time of a check node calculation, the message (variable node message) $v_i$ from a variable node is read out from the message memory 104, and while the check node calculator 103 of the message calculator 101 performs a check node calculation using the message $v_i$ read out from the message memory 104, the message (check node message) $u_j$ obtained as a result of the check node calculation thereof is written in the message memory 104.

Accordingly, with the decoding device in FIG. 8, it is necessary to perform readout of a message from the message memory 104, and writing of the message obtained as a result of a variable node calculation or a check node calculation (hereafter, simply referred to as node calculation by integrating both) using the message thereof simultaneously event at the time of a variable node calculation or a check node calculation.

Therefore, the message memory 104 is made up of, for example, one RAM (Random Access Memory) #A serving as one memory bank, and another RAM#B serving as another memory bank. Access to each of the RAM#A and RAM#B enables two apparent accesses as to the message memory 104 simultaneously.

The timing chart in FIG. 11 represents the read/write timing as to the RAM#A and RAM#B making up the message memory 104.

In FIG. 11, first of all, the message necessary for obtaining the message corresponding to the branch of a certain check node or variable node (hereafter, simply referred to as node by integrating both as appropriate) node#1 is read out from the RAM#A (R(node#1)), and a node calculation is performed using the message thereof. Subsequently, the message corresponding to the branch of the node node#1 obtained as a result of the node calculation thereof is written in the RAM#A (W(node#1)), and at the same time, the message necessary for obtaining the message corresponding to the branch of the next node node#2 is read out from the RAM#B (R(node#2)), and a node calculation is performed.

Further, the message corresponding to the branch of the node node#2 obtained as a result of the node calculation thereof is written in the RAM#B (W(node#2)), and at the same time, the message necessary for obtaining the message corresponding to the branch of the next node node#3 is read out from the RAM#A (R(node#3)), and a node calculation is performed. Hereinafter, in the same way, read/write of the message corresponding to each of the RAM#A and RAM#B making up the message memory 104 is continuously performed.

Note that with the decoding device in FIG. 8, in the event of decoding an LDPC code using repeat decoding for alternately performing a check node calculation and a variable node calculation, one time decoding (one set of a check node calculation and a variable node calculation) requires the number of clocks twice as many as the number of messages, resulting in requiring high-speed operations.

Therefore, with regard to the LDPC code of a particular parity check matrix, a decoding device wherein messages are obtained simultaneously regarding p nodes by providing the multiple, p message calculation units 101, and one time decoding can be performed with the number of clocks of 1/p in the case of the decoding device in FIG. 8, i.e., a decoding device which can operate with not so high operating frequency has been proposed (see Japanese Unexamined Patent Application Publication No. 2004-364233, for example).

SUMMARY OF THE INVENTION

Incidentally, as described above, with the variable node calculator 102 (FIG. 9) making up the message calculation unit 101, the FIFO memory 155 is provided for delaying a message until integration of messages at the calculator 151 and the register 152 is completed. Similarly, with the check node calculator 103 (FIG. 10) also, the FIFO memory 127 for delaying $\Phi(|v_i|)$ until integration at the calculator 122 and the register 123 is completed, and the FIFO memory 133 for delaying a sign bit until the calculation of multiplier AND of sign bits at the EXOR circuit 129 and the register 130 is completed, are provided. Thus, with a decoding device for decoding LDPC codes, there is the need to provide memory for delaying data (messages).

Particularly, in order to operate a decoding device for decoding LDPC codes including many nodes with not so high operating frequency, there is the need to provide the multiple message calculation units 101 to obtain the messages of multiple nodes in parallel, and this case further requires memory for delaying data, resulting in a large scale of the decoding device.

The present invention has been made in light of such a situation, and it is desirable to reduce the scale of a decoding device for decoding LDPC codes.

According to an embodiment of the present invention, a decoding device for decoding LDPC (Low Density Parity Check) codes, includes message calculation means for performing a variable node calculation for decoding the LPDC codes using a message that is supplied, or performing a check node calculation, and outputting the message obtained as a result of the calculation, storing means for storing the message, and control means for performing writing control for writing the message that the message calculation means output in the storing means, and readout control for reading out the same message employed for the calculation of the message calculation means from the storing means twice, and supplying these to the message calculation means.

According to an embodiment of the present invention, with a control method for controlling a decoding device for decoding LDPC (Low Density Parity Check) codes, or a program for causing a computer for execute control of a decoding device for decoding LDPC (Low Density Parity Check) codes, the decoding device includes message calculation means for performing a variable node calculation for decoding the LPDC codes using a message that is supplied, or performing a check node calculation, and outputting the message obtained as a result of the calculation, and storing means for storing the message, and wherein the control method or program includes the steps of writing control for writing the message that the message calculation means output in the storing means, and readout control for reading out the same message employed for the calculation of the message calculation means from the storing means twice, and supplying these to the message calculation means.

The decoding device, control method, or program according to an embodiment of the present invention may perform writing control for writing the message that the message calculation means output in the storing means, and readout control for reading out the same message employed for the calculation of the message calculation means from the storing means twice, and supplying these to the message calculation means.

According to the above configurations, the scale of a decoding device for decoding LDPC codes can be reduced.

BRIEF DESCRIPTION OF THE DRAWINGS

FIG. 1 is a diagram describing a parity check matrix H of an LDPC code;

FIG. 4 is a diagram illustrating an example of a parity check matrix of an LDPC code;

FIG. 11 is a timing chart illustrating conventional timing of writing a message as to message memory 104;

FIG. 16 is a timing chart illustrating the read/write timing of a message as to the message memory 104;

FIG. 40 is a timing chart illustrating the read/write timing of a message as to the message memory 104; and FIG. 41 is a block diagram illustrating a configuration example of an embodiment of a computer to which the present invention is applied.

DESCRIPTION OF THE PREFERRED EMBODIMENTS

Embodiments of the present invention will be described below, the correspondence relation between the constituent features of the present invention and the embodiments described in the specification and drawings being exemplified as follows. This description is for confirming that the embodiments supported by the present invention are described in the specification and drawings. Accordingly, even if there is an embodiment, which is described in the specification and drawings, but is not described here as an embodiment corresponding to the constituent features of the present invention, this does not mean that the embodiment thereof does not correspond to the constituent features thereof. Inversely, even if an embodiment is described here as an embodiment corresponding to the constituent features, this does not mean that the embodiment thereof does not correspond to the other constituent features other than the constituent features thereof.

Figure 12:
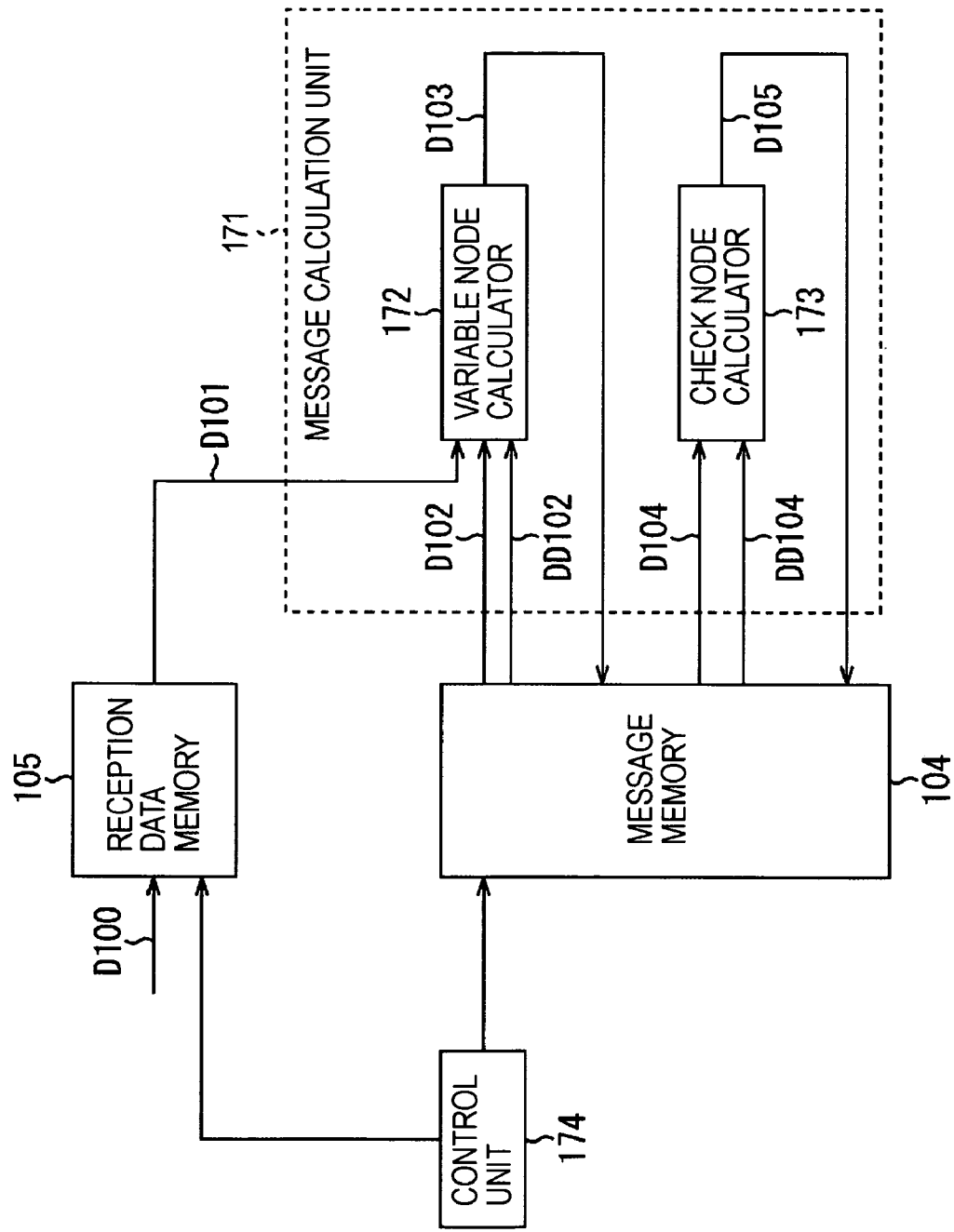
FIG. 12 is a block diagram illustrating a configuration example of a first embodiment of a decoding device to which the present invention is applied.

A decoding device according to an embodiment of the present invention is a decoding device for decoding LDPC (Low Density Parity Check) codes (e.g., decoding device in FIG. 12), and includes message calculation means for performing a variable node calculation for decoding the LPDC codes using a message that is supplied, or performing a check node calculation, and outputting the message obtained as a result of the calculation (e.g., message calculation unit 171 in FIG. 12), storing means for storing said message (e.g., message memory 104 in FIG. 12), and control means for performing writing control for writing the message that the message calculation means output in the storing means, and readout control for reading out the same message employed for the calculation of the message calculation means from the storing means twice, and supplying these to the message calculation means (e.g., control unit 174 in FIG. 12).

With the message calculation means, of the same message that is read out twice from the storing means, the two ports of a port to which a message that is read out at the first time is supplied (e.g., input port P102 in FIG. 13, or the input port P111 in FIG. 14), and a port to which a message that is read out at the second time is supplied (e.g., input port PD102 in FIG. 13, or input port PD111 in FIG. 14) can be provided.

Also, the message calculation means can be provided with variable node calculation means for performing a variable node calculation (e.g., variable node calculator 172 in FIG. 12), and check node calculation means for performing a check node calculation (e.g., check node calculator 173 in FIG. 12).

The message calculation means can be provided with one LUT (Look Up Table) for outputting the calculation result of a nonlinear function $\Phi(x)=-\ln(\tan h(x/2))$ as to input data x that is input to a check node (e.g., LUT 300 in FIG. 22), and another one LUT for outputting the calculation result of the inverse function of the nonlinear function $\Phi^{-1}(x)=2 \tan h^{-1}(e^{-x})$ as to output data x output from a check node (e.g., LUT 314 in FIG. 22), wherein data can be passed through the one LUT and another one LUT at the time of a check node calculation, and data can be bypassed the one LUT and another one LUT at the time of a variable node calculation.

Also, the message calculation means can be provided with an LUT (Look Up Table) (e.g., LUT 600 in FIG. 27) for outputting the calculation result of the nonlinear function $\Phi(x)=-\ln(\tan h(x/2))$ obtained as the same calculation result as the inverse function $\Phi^{-1}(x)=2 \tan h^{-1}(e^{-x})$ as to input data x that is input to a check node, and also outputting the calculation result of the inverse function $\Phi^{-1}(x)$ as to input data x that is input to a variable node.

The message calculation means can be provided with an LUT (Look Up Table) (e.g., LUT 713 in FIG. 32) for outputting the calculation result of the nonlinear function $\Phi(x)=-\ln(\tan h(x/2))$ obtained as the same calculation result as the inverse function $\Phi^{-1}(x)=2 \tan h^{-1}(e^{-x})$ as to output data x output from a variable node, and also outputting the calculation result of the inverse function $\Phi^{-1}(x)$ as to output data x output from a check node.

Figure 15:
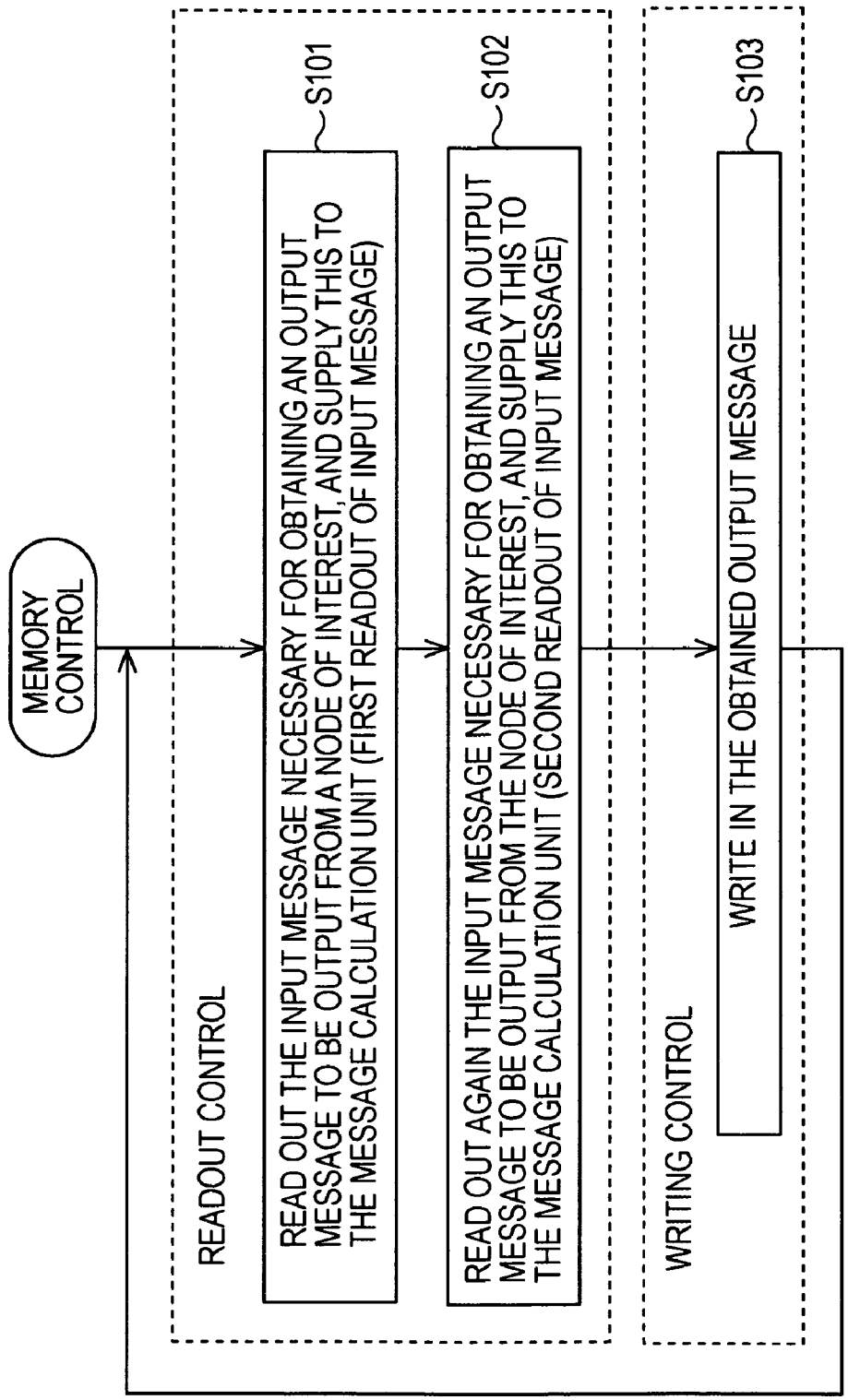
FIG. 15 is a flowchart describing read/write control processing as to the message memory 104.

A control method or program according to an embodiment of the present invention is a control method for controlling a decoding device for decoding LDPC (Low Density Parity Check) codes, or a program for causing a computer for execute control of a decoding device for decoding LDPC (Low Density Parity Check) codes, wherein the decoding device includes message calculation means for performing a variable node calculation for decoding the LPDC codes using a message that is supplied, or performing a check node calculation, and outputting the message obtained as a result of the calculation (e.g., message calculation unit 171 in FIG. 12), and storing means for storing the message (e.g., message memory 104 in FIG. 12), and wherein the control method or program including a step for performing writing control for writing the message that the message calculation means output in the storing means (e.g., step S103 in FIG. 15), and readout control for reading out the same message employed for the calculation of the message calculation means from the storing means twice, and supplying these to the message calculation means (e.g., steps S101 and S102 in FIG. 15).

Description will be made below in detail regarding specific embodiments to which the present invention is applied with reference to the drawings.

FIG. 12 is a block diagram illustrating a configuration example of a first embodiment of a decoding device to which the present invention is applied.

Note that the portions corresponding to those in the decoding device in FIG. 8 within the drawing are appended with the same reference numerals, and description thereof will be omitted below as appropriate. That is to say, the decoding device in FIG. 12 is configured in the same way as the decoding device in FIG. 8 except that a message calculation unit 171 is provided instead of the message calculation unit 101, and also a control unit 174 is provided instead of the control unit 106.

Figure 2:
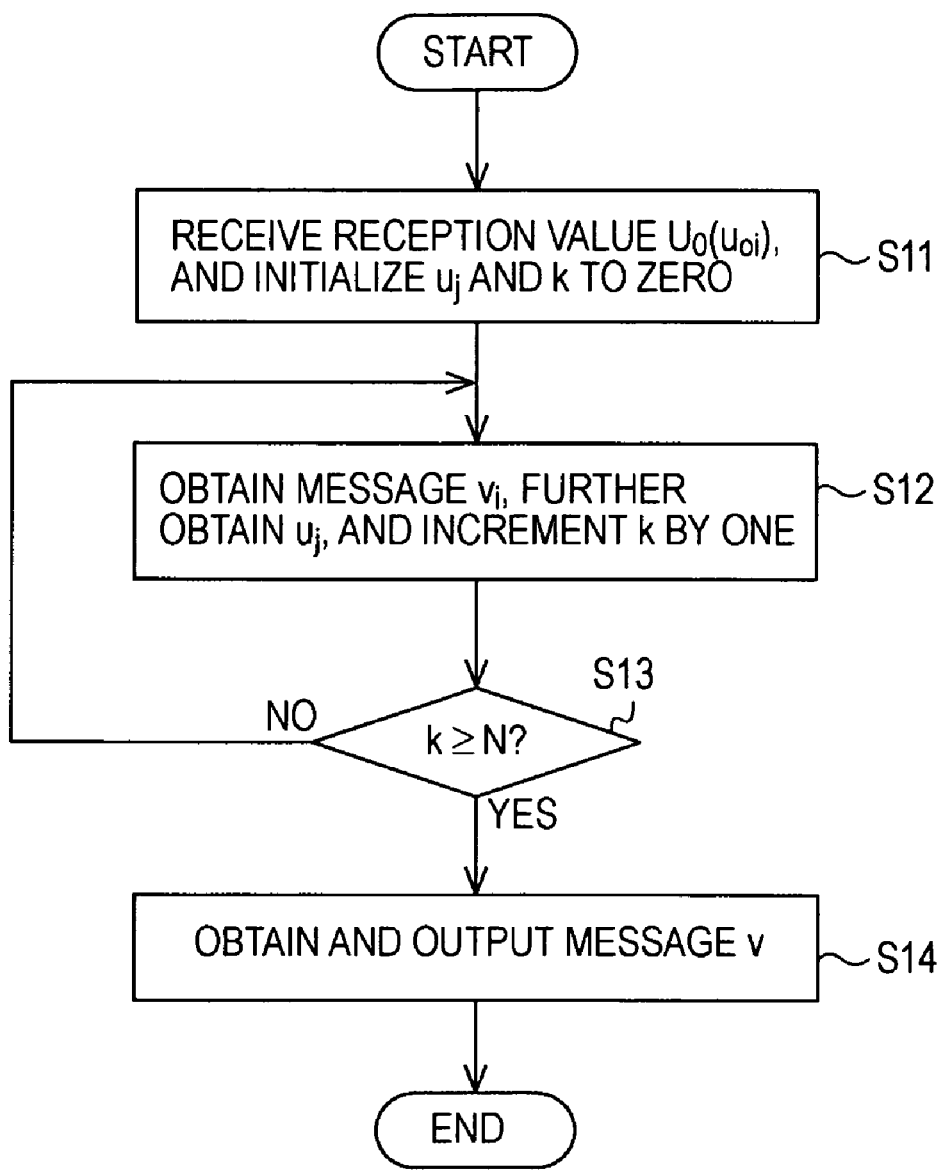
FIG. 2 is a flowchart describing the decoding procedure of an LDPC code.
Figure 3:
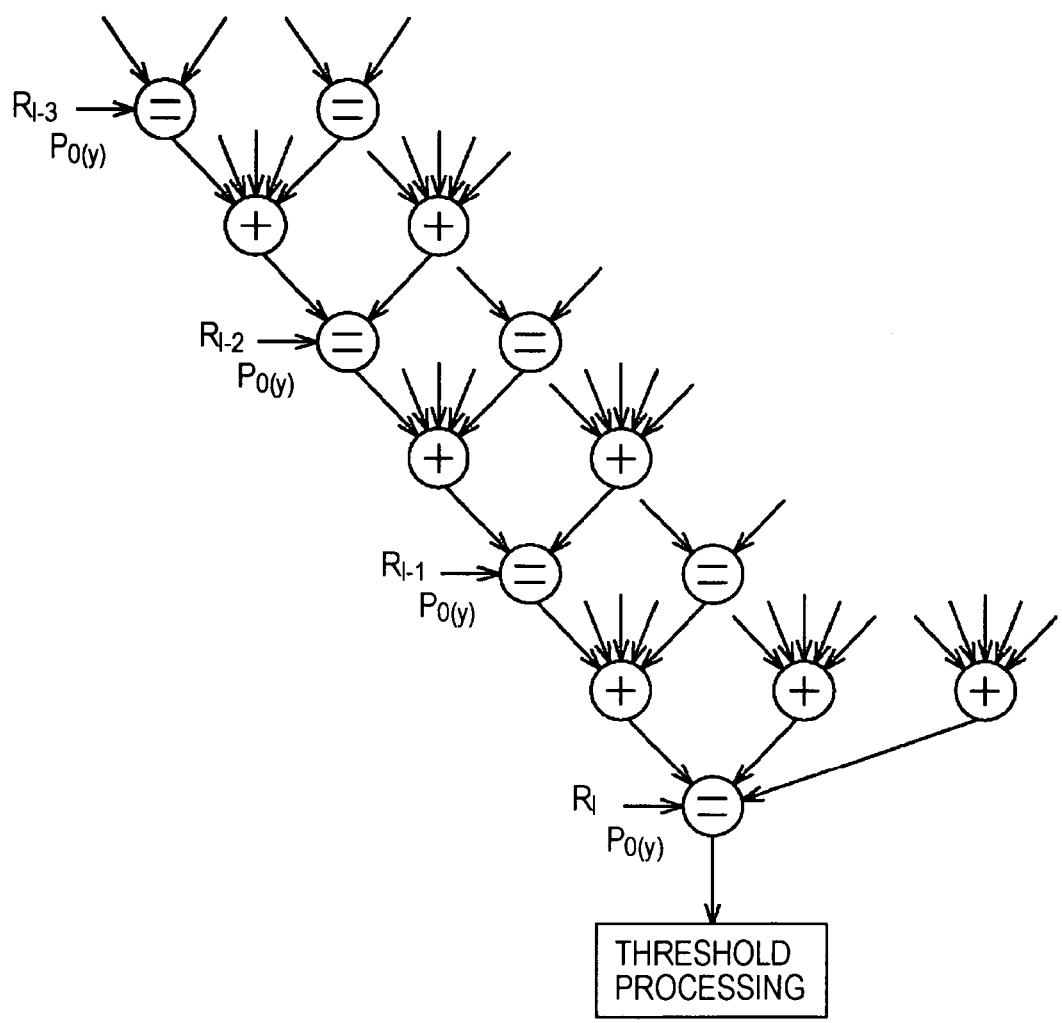
FIG. 3 is a diagram describing the flow of a message.
Figure 5:
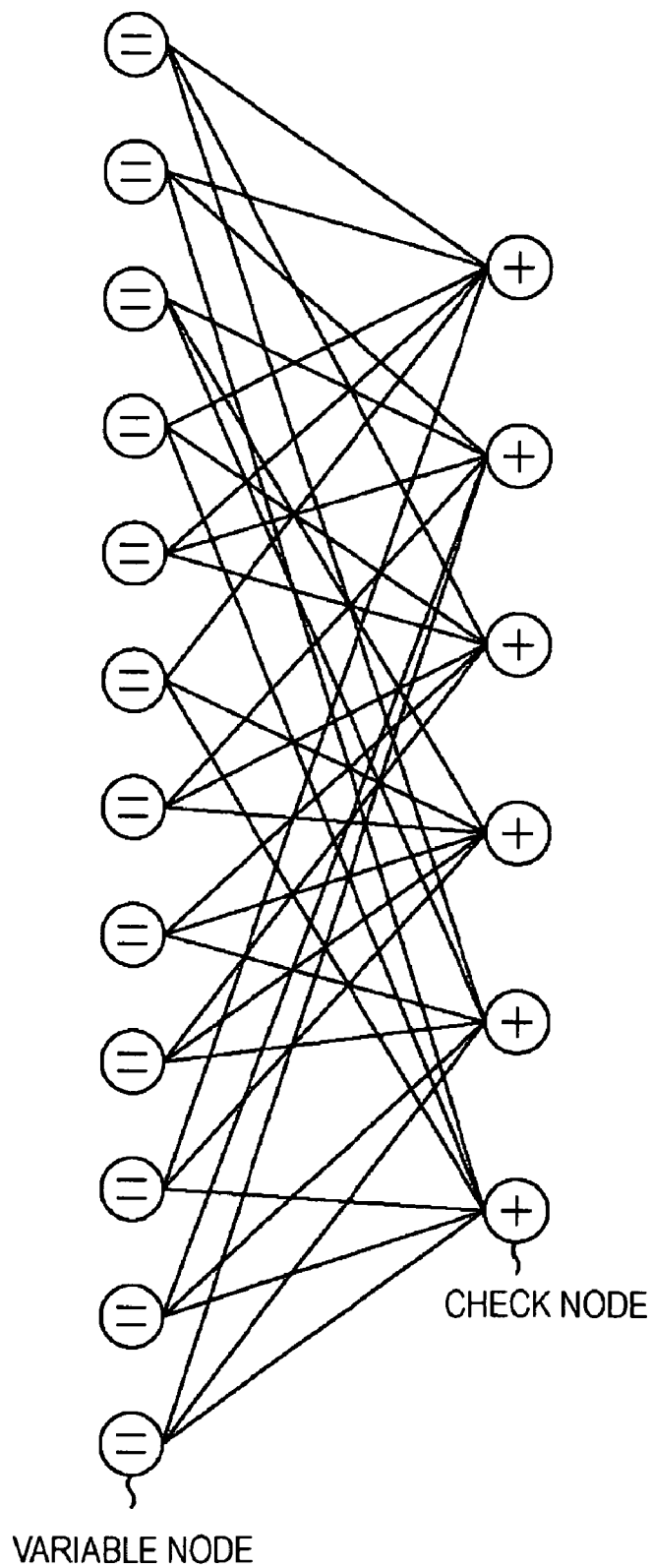
FIG. 5 is a diagram illustrating a tanner graph of a parity check matrix.
Figure 6:
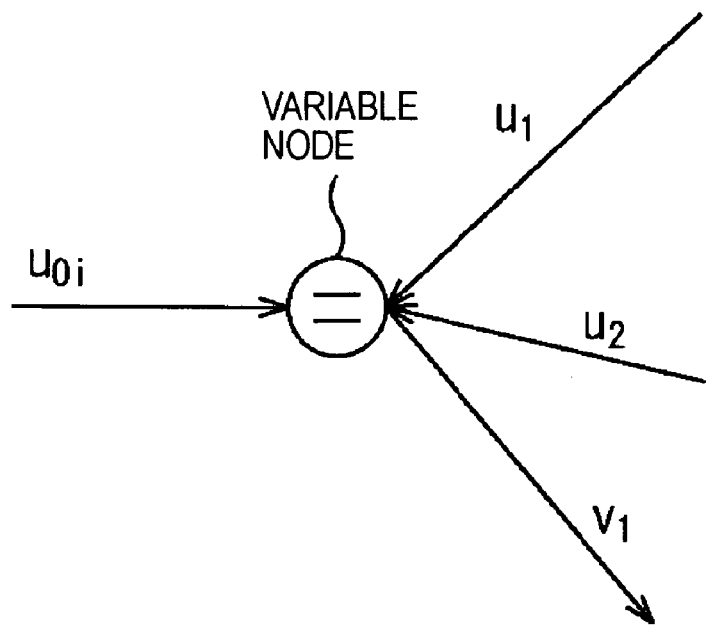
FIG. 6 is a diagram illustrating a variable node.
Figure 7:
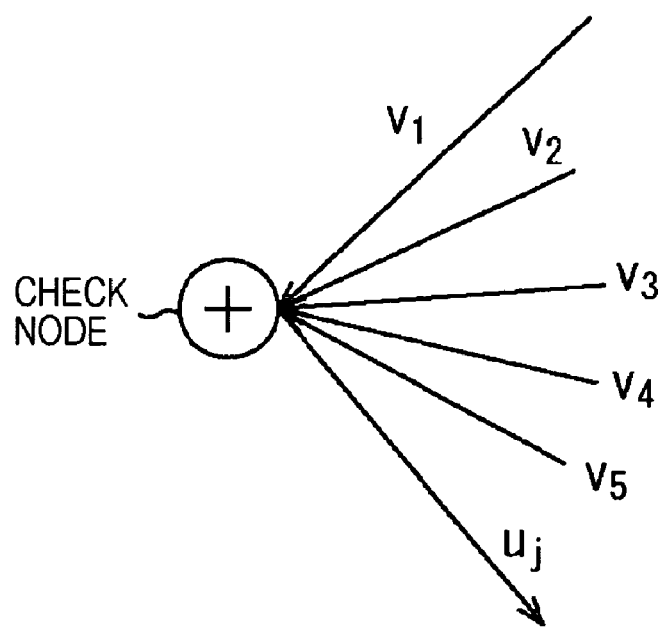
FIG. 7 is a diagram illustrating a check node.
Figure 8:
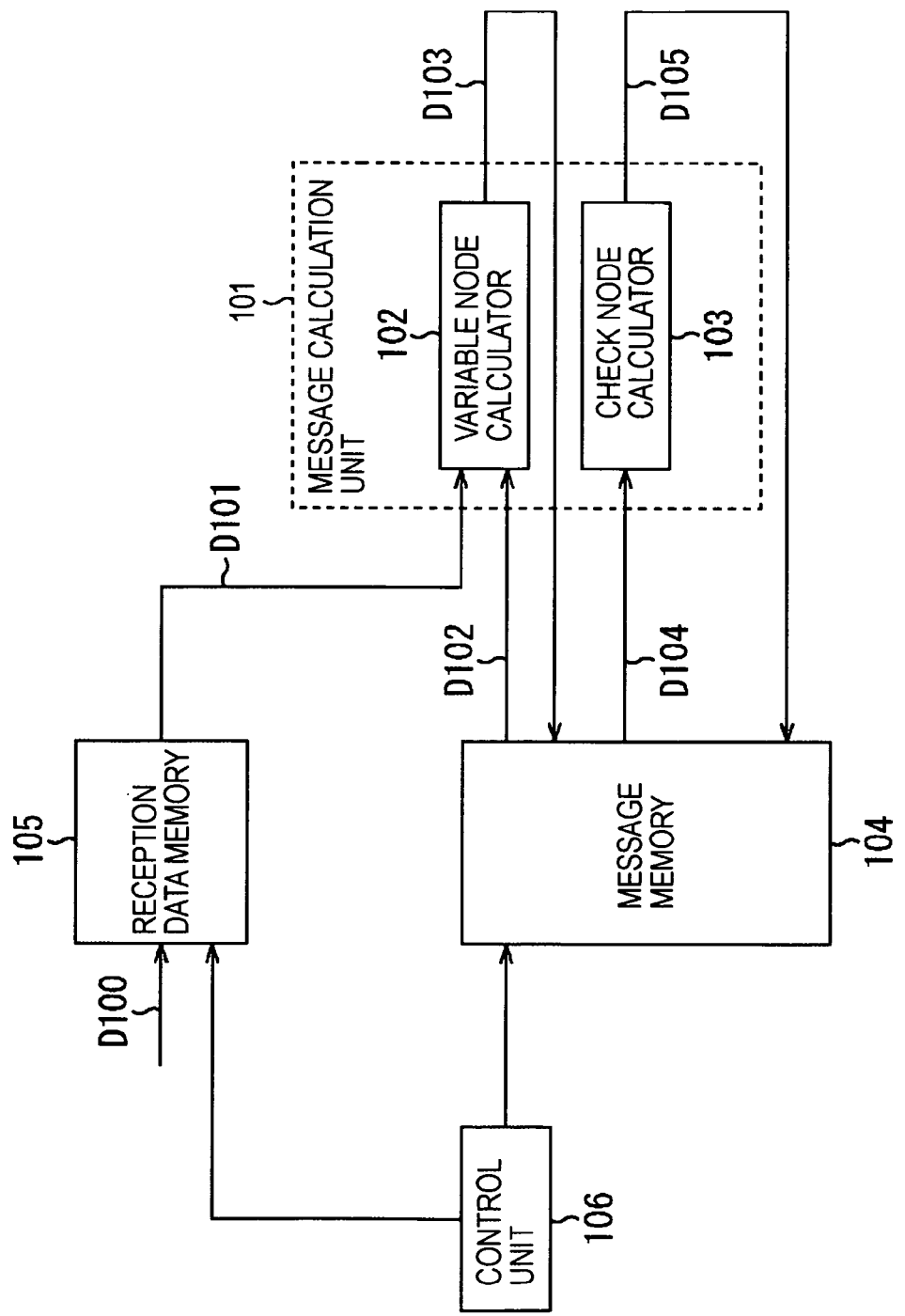
FIG. 8 is a block diagram illustrating one configuration example of a conventional decoding device.

The decoding device in FIG. 12 repeatedly performs full serial decoding as with the decoding device in FIG. 8.

Specifically, the decoding device in FIG. 12 is made up of message memory 104, reception data memory 105, a message calculation unit 171, and a control unit 174. Also, the message calculation unit 171 is made up of a variable node calculator 172 and a check node calculator 173.

With the decoding device in FIG. 12, the message calculation unit 171 sequentially reads out a message from the message memory 104 one by one, and calculates the message corresponding to a desired branch using the message thereof. Subsequently, the message obtained by the calculation thereof is stored in the message memory 104. The decoding device in FIG. 12 performs repeat decoding by repeatedly performing the above processing.

That is to say, reception data (LDPC code) D100 that is a log likelihood ratio representing the identity of code 0 (or 1) that can be obtained by receiving an LDPC code transmitted is supplied to the reception data memory 105, and the reception data memory 105 stores the reception data D100 thereof.

At the time of a variable node calculation, the reception data memory 105 reads out the stored reception data in accordance with the control signal that is supplied from the control unit 174, and supplies this to the variable node calculator 173 of the message calculation unit 171 as reception data D101.

Also, at the time of a variable node calculation, the message memory 104 reads out the stored same message twice in accordance with the control signal supplied from the control unit 174 (reads out a check node message (a check node message from a check node connected to a variable node of interest) $u_j$ necessary for obtaining a variable node message $v_i$ that is output from a variable node of interest repeatedly twice), supplies the message read out at the first time to the variable node calculator 172 as a message. D102, and supplies the message read out at the second time to the variable node calculator 172 as a message DD102. The variable node calculator 172 performs the variable node calculation of Expression (1) using the messages D102 and DD102 supplied from the message memory 104, and the reception data D101 supplied from the reception data memory 105, and supplies the message (variable node message) $v_1$ obtained as a result of the variable node calculation thereof to the message memory 104 as a message D103.

Subsequently, the message memory 104 stores (writes) the message D103 supplied from the variable node calculator 172 in accordance with the control signal supplied from the control unit 174.

On the other hand, at the time of a check node calculation, the message memory 104 reads out the stored same message (variable node message $v_i$) twice in accordance with the control signal supplied from the control unit 174 (reads out a variable node message (a variable node message from a variable node connected to a check node of interest) $v_i$ necessary for obtaining a check node message $u_j$ output from a check node of interest repeatedly twice), supplies the message read out at the first time to the check node calculator 173 as a message D104, and supplies the message read out at the second time to the check node calculator 173 as a message DD104.

The check node calculator 173 performs the check node calculation of Expression (7) using the messages D104 and DD104 supplied from the message memory 104, and supplies the message (check node message) $u_j$ obtained by the check node calculation thereof to the message memory 104 as a message D105.

Subsequently, the message memory 104 stores (writes) the message D105 supplied from the check node calculator 173 in accordance with the control signal supplied from the control unit 174.

The message D105 from the check node calculator 173 that the message memory 173 stored, i.e., the check node message $u_j$ is read out as the messages D102 and DD102 at the time of the next variable node calculation, and is supplied to the variable node calculator 172.

Figure 13:
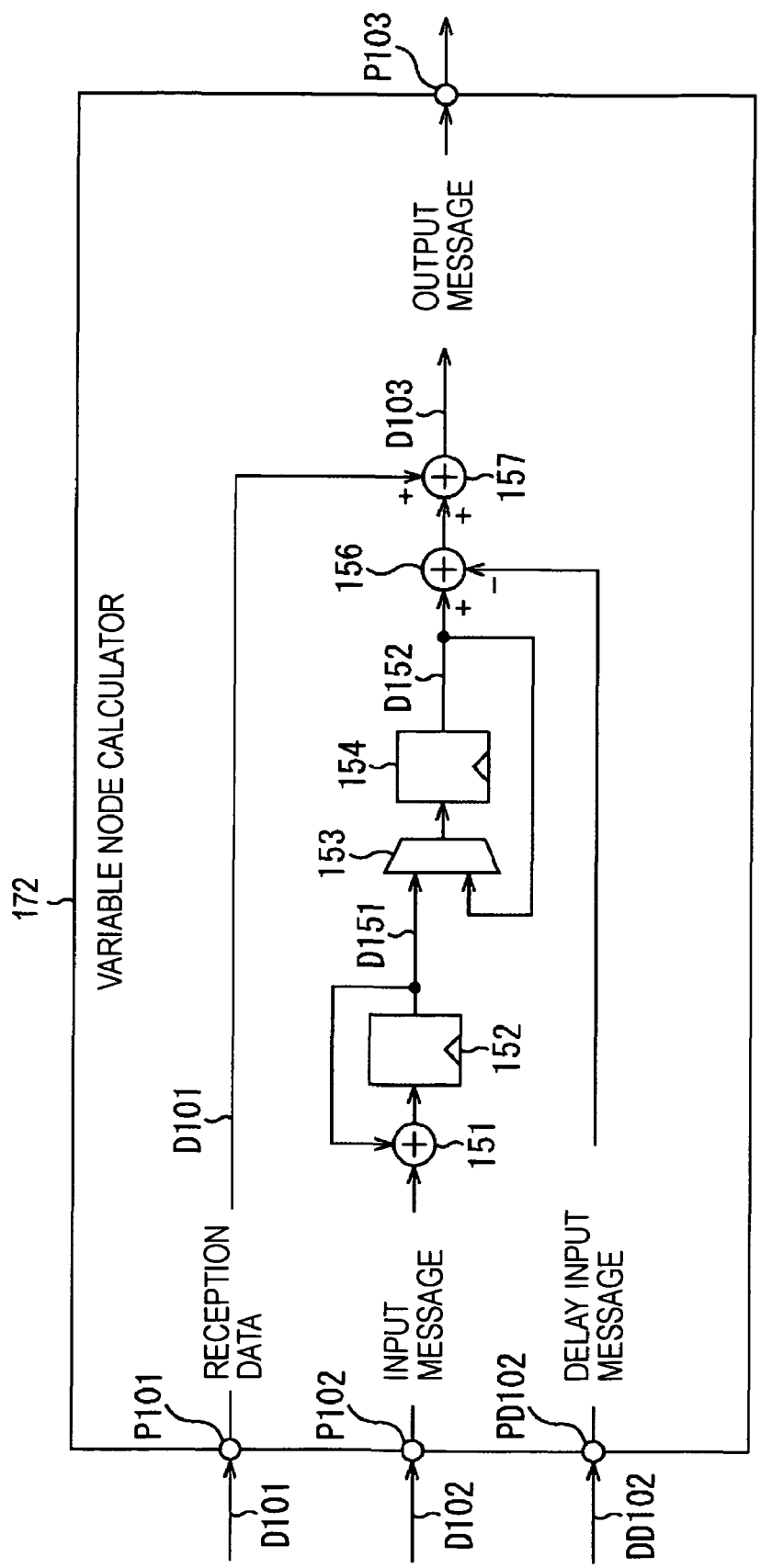
FIG. 13 is a block diagram illustrating a configuration example of a variable node calculator 172.

FIG. 13 illustrates a configuration example of the variable node calculator 172 in FIG. 12.

Note that the portions corresponding to those in the variable node calculator 102 in FIG. 9 within the drawing are appended with the same reference numerals, and description thereof will be omitted below as appropriate.

Figure 9:
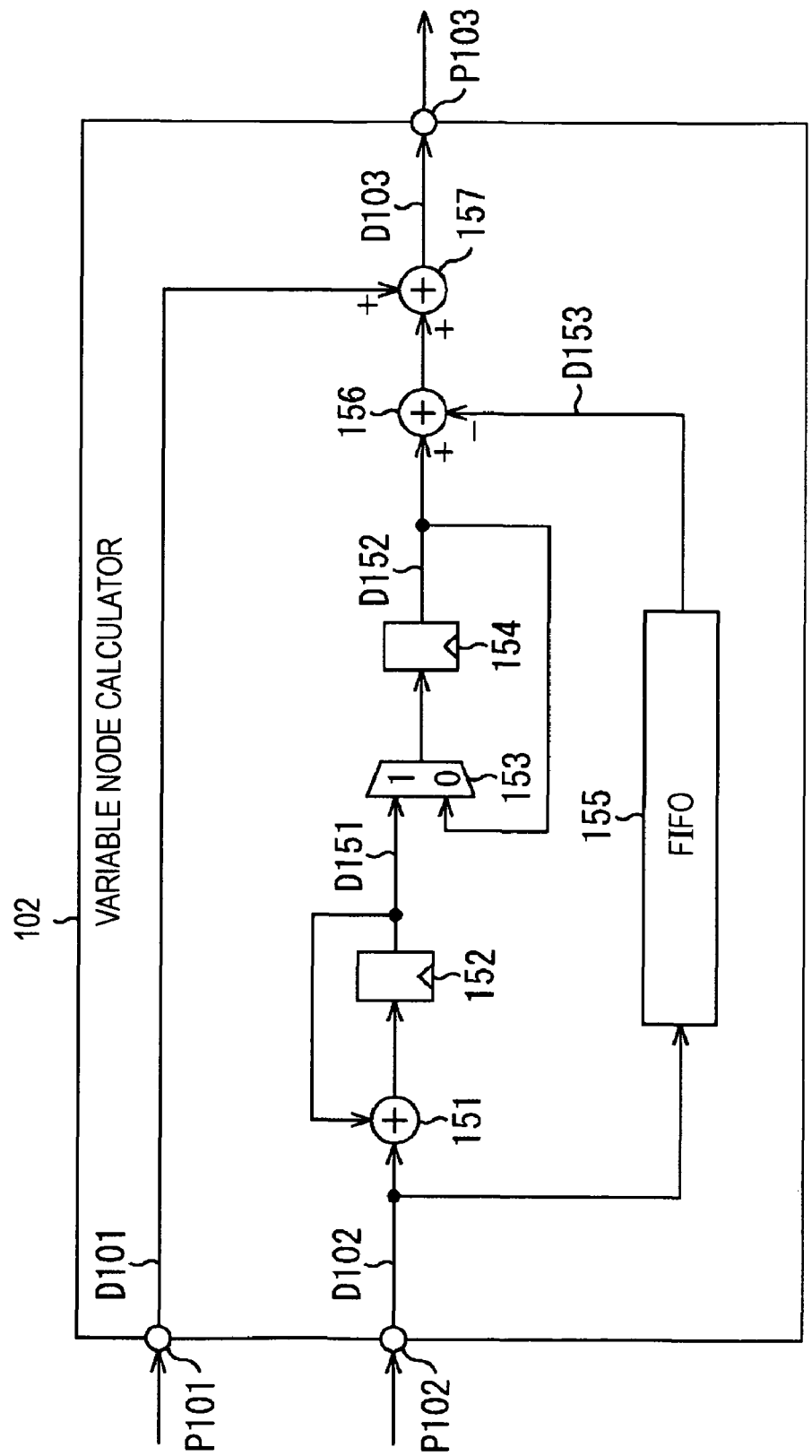
FIG. 9 is a block diagram illustrating a configuration example of a variable node calculator 102 for calculating messages one by one.

The variable node calculator 172 is configured without providing memory for delaying data (FIFO memory 155 provided in the variable node calculator 102 in FIG. 9).

However, the variable node calculator 172 includes three input ports P101, P102, and PD102 as input ports to which a message (data) is supplied (input) externally.

The input port P101 is supplied (input) with the reception data D101 read out from the reception data memory 105. Also, the input port P102 is supplied (input) with a message D102 that is read out at the first time of the same messages D102 and DD102 that are read out twice from the message memory 104, and the input port PD102 is supplied with the message DD102 that is read out at the second time.

The check node calculator 173 performs the variable node calculation of Expression (1) using the messages input from the input ports P101, P102, and PD102, and outputs the message obtained as a result thereof from the output port P103.

That is to say, the input port P101 is supplied with the reception data D101 read out from the reception data memory 105. Also, the input port P102 is supplied with the message D102 (check node message $u_j$) read out from the message memory 104.

Subsequently, with the variable node calculator 172, the message D102 from the check node corresponding to each line of the parity check matrix, i.e., the message $u_j$ read out at the first time from the message memory 104 is input from the input port P102 one by one, and the message D102 thereof is supplied to the calculator 151.

Also, the variable node calculator 172 reads in the reception data D101 from the reception data memory 105 from the input port P101 one by one, and supplies this to the calculator 157.

The calculator 151 integrates the message D102 by adding the message D102 (message $u_j$) and the value D151 stored in the register 152, and restores the integration value obtained as a result thereof in the register 152. Note that in the event of the messages D102 from all of the branches across one row of the parity check matrix being integrated, the register 152 is reset.

In the event that the messages D102 across one row of the parity check matrix are read in one by one, and the integration value of the messages D102 of the one row worth is stored in the register 152, i.e., in the event that the integration value ($\Sigma u_j$ of j=1 through $d_v$) wherein the messages D102 (message $u_j$) from all of the branches across one row of the parity check matrix are integrated is stored in the register 152, the selector 153 selects the value stored in the register 152, i.e., the integration value D151 ($\Sigma u_j$ of j=1 through $d_v$) wherein the messages D102 (messages $u_j$) of all of the branches across the one row of the parity check matrix are integrated, and outputs this to the register 154 to store this.

The register 154 supplies the stored value D151 to the selector 153 and the calculator 156 as a value D152. The selector 153 selects the value D152 supplied from the register 154, and outputs this to the register 154 to restore this until immediately before the value wherein the messages D102 of one row worth are integrated is stored in the register 152. That is to say, the register 154 supplies the value previously integrated to the selector 153 and the calculator 156 until the messages D102 (messages $u_j$) from all of the branches across one row of the parity check matrix are integrated.

On the other hand, upon output of a new value D152 ($\Sigma u_j$ of j=1 through $d_v$) being started from the register 154, i.e., immediately after the integration value ($\Sigma u_j$ of j=1 through $d_v$) wherein the messages D102 of one row worth are integrated is stored in the register 152, with the variable node calculator 172, the same messages DD102 as the messages D102 (messages $u_j$), i.e., the messages $u_j$ read out at the second time from the message memory 104 are input from the input port PD102 one by one, and the messages DD102 thereof are supplied to the calculator 156.

The calculator 156 subtracts the messages DD102 supplied from the input port PD102 from the integration value D152 supplied from the register 154. That is to say, the calculator 156 subtracts the message DD102 that is the message $u_j$ ($u_j$ of j=$d_v$) supplied from a desired branch from the integration value D152 ($\Sigma u_j$ of j=1 through $d_v$) of the messages D102 (messages $u_j$) of all of the branches across one row of the parity check matrix to obtain the subtraction value thereof ($\Sigma u_j$ of j=1 through $d_v-1$), and supplies this to the calculator 157.

The calculator 157 adds the reception data D101 from the input port P101 and the subtraction value ($\Sigma u_j$ of j=1 through $d_v-1$) from the calculator 156, and outputs the addition value obtained as a result thereof from the output port P103 as a message D103 (message $v_i$).

As described above, the variable node calculator 172 performs the variable node calculation of Expression (1), and outputs the message (variable node message) $v_i$ obtained as a result thereof from the output port P103.

Figure 14:
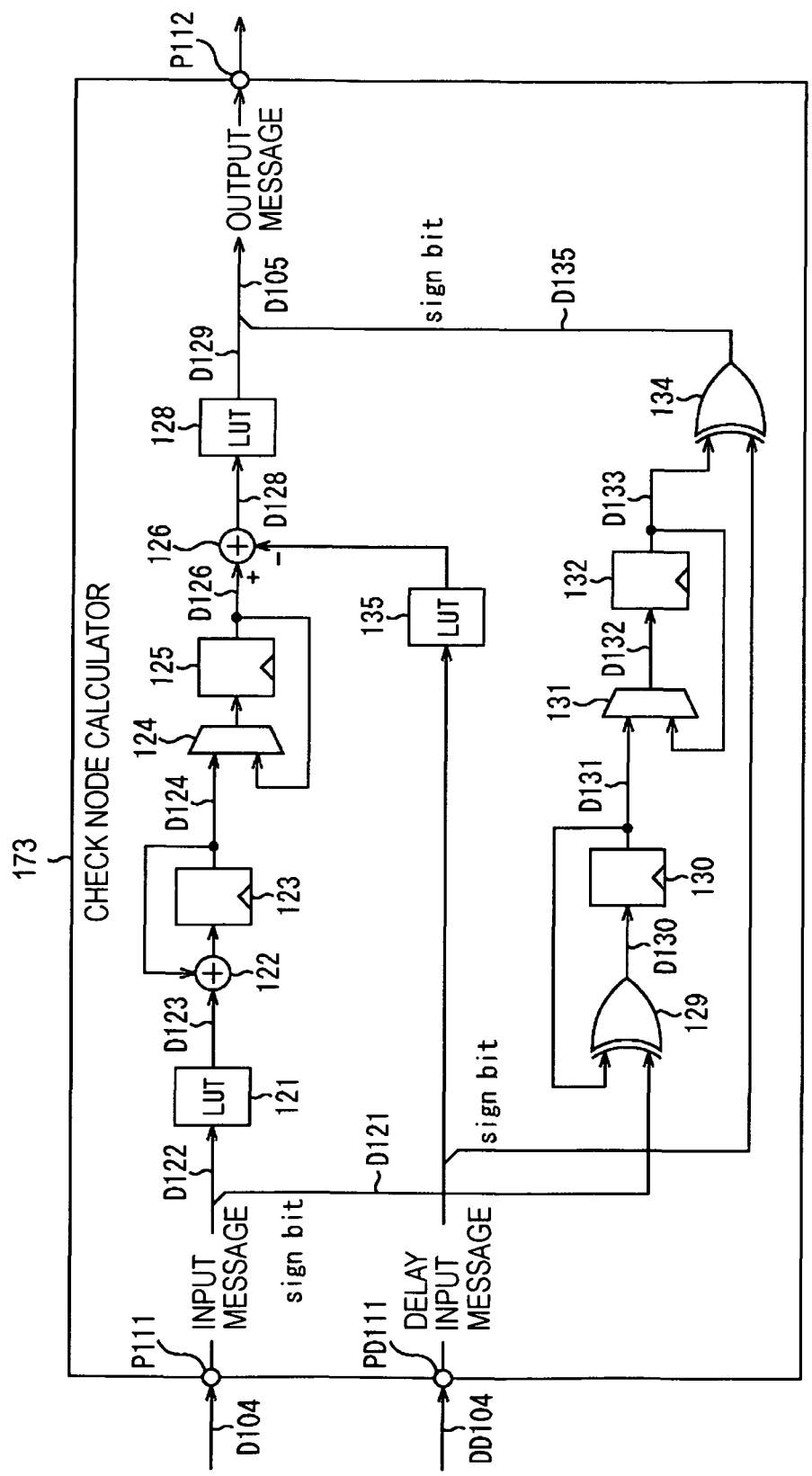
FIG. 14 is a block diagram illustrating a configuration example of a check node calculator 173.

FIG. 14 illustrates a configuration example of the check node calculator 173 in FIG. 12.

Figure 10:
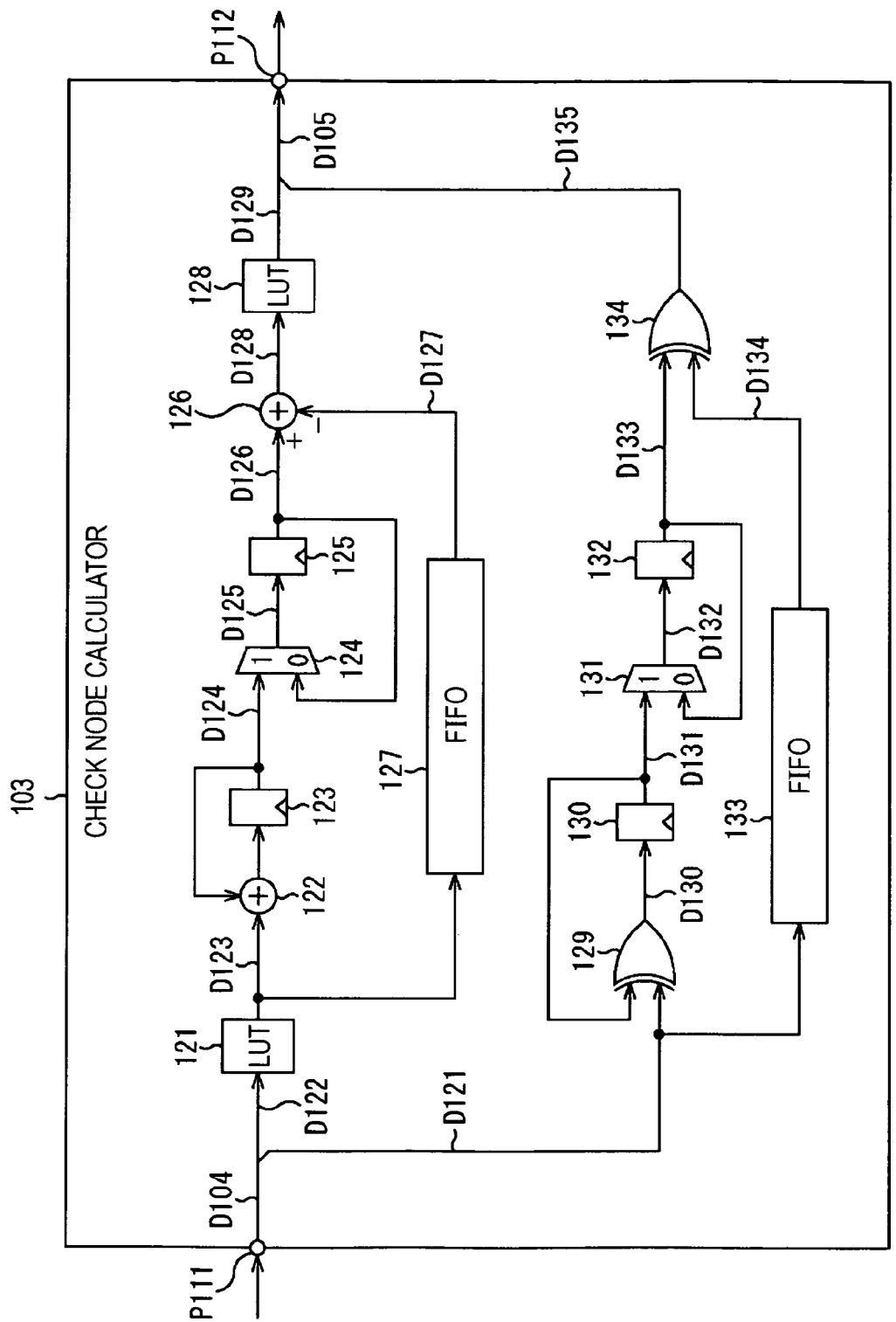
FIG. 10 is a block diagram illustrating a configuration example of a check node calculator 103 for calculating messages one by one.

Note that in the drawing, the portions corresponding to those in the check node calculator 103 in FIG. 10 are appended with the same reference numerals, and description thereof will be omitted below as appropriate.

The check node calculator 173 is configured without providing the memory for delaying data (FIFO memory 127 and 133 provided in the check node calculator 103 in FIG. 10).

However, the check node calculator 173 includes two input ports P111 and PD111 as input ports to which a message (data) is supplied (input) externally.

The input port P111 is supplied (input) with a message D104 to be read out at the first time of the same messages D104 and DD104 to be read out twice from the message memory 104, and the input port PD111 is supplied with the message DD104 to be read out at the second time.

The check node calculator 173 performs the check node calculation of Expression (7) using the messages input from the input ports P111 and PD111, and outputs the message obtained as a result thereof from the output port P112.

That is to say, the input port P111 is supplied with the message D104 (variable node message $u_j$) read out from the message memory 104.

With the check node calculator 173, the message D104 (message $v_i$) from the variable node corresponding to each row of the parity check matrix is input from the input port P111 one by one, and the lower bits except for the most significant bit thereof, i.e., the absolute value D122 ($|v_i|$) of the message D104 is supplied to the LUT 121, and also the most significant bit, i.e., the sign bit D121 of the message D104 is supplied to the EXOR circuit 129.

The LUT 121 reads out the calculation result D123 ($\Phi(|v_i|)$) obtained as a result of calculation of the nonlinear function $\Phi(|v_i|)$ with the absolute value D122 ($|v_i|$) as an argument, and supplies this to the calculator 122.

The calculator 122 integrates the calculation result D123 by adding the calculation result D123 ($\Phi(|v_i|)$) and the value D124 stored in the register 123, and restores the integration value obtained as a result thereof in the register 123. Note that in the event that the calculation results D123 ($\Phi(|v_i|)$) as to the absolute values D122 ($|v_i|$) of the messages D104 of all of the branches across one line of the parity check matrix are integrated, the register 123 is reset.

In the event that the messages D104 across one line of the parity check matrix are read in one by one, and the integration value wherein the calculation results D123 of one line worth are integrated is stored in the register 123, the selector 124 selects the value stored in the register 123, i.e., the integration value D124 ($\Sigma\Phi(|v_i|)$ of i=1 through i=$d_c$) wherein $\Phi(|v_i|)$ obtained from the messages D104 (messages $v_i$) from all of the branches across one line of the parity check matrix is integrated, and outputs this to the register 125 as an integration value D125 to store this. The register 125 supplies the stored integration value D125 to the selector 124 and the calculator 126 as a value D126.

The selector 124 selects the value D126 supplied from the register 125, and outputs this to the register 125 to restore this until immediately before the integration value wherein the calculation results D123 of one line worth is integrated is stored in the register 123. That is to say, the register 125 supplies the integration value of $\Phi(|v_i|)$ previously integrated to the selector 124 and the calculator 126 until $\Phi(|v_i|)$ obtained from the messages D104 (messages $v_i$) from all of the branches across one line of the parity check matrix is integrated.

On the other hand, upon output of a new value D126 ($\Sigma\Phi(|v_i|)$ of i=1 through $d_c$) being started from the register 125, i.e., immediately after the integration value ($\Sigma\Phi(|v_i|)$ of i=1 through $d_c$) wherein the calculation results D123 of one row worth are integrated is stored in the register 125, with the check node calculator 173, the same messages DD104 as the messages D104 (messages $v_i$), i.e., the messages $v_i$ read out at the second time from the message memory 104 are input from the input port PD104 one by one, and of the message DD104 thereof, the lower bits except for the most significant bit, i.e., the absolutes value ($|v_i|$) of the message DD104 is supplied to the LUT 135, and also the most significant bit, i.e., the sign bit of the message DD104 is supplied to the EXOR circuit 134.

The LUT 135 is the same LUT as the LUT 121, and reads out the calculation result ($\Phi(|v_i|)$) obtained as a result of calculation of the nonlinear function $\Phi(|v_i|)$ with the absolute values ($|v_i|$) of the messages DD104 as arguments, and supplies this to the calculator 126.

The calculator 126 subtracts the calculation result ($\Phi(|v_i|)$) obtained from the LUT 135 from the value D126 supplied from the register 125, and supplies the subtraction result to the LUT 128 as a subtraction value D128. That is to say, the calculator 126 subtracts $\Phi(|v_i|)$ obtained from the message DD104 that is the message $v_i$ ($v_i$ of $i=d_c$) obtained through a desired branch from the integration value $(\Sigma\Phi(|v_i|))$ of $i=1$ through $i=d_c$) of $\Phi(|v_i|)$ obtained from the messages D104 (messages $v_i$) from all of the branches across one line of the parity check matrix, and supplies the subtraction value thereof $(\Sigma\Phi(|v_i|)$ of $i=1$ through $i=d_c-1$) to the LUT 128 as a subtraction value D128.

The LUT 128 outputs the calculation result D129 ($\Phi^{-1}(\Sigma\Phi(|v_i|))$) as a result of calculation of the inverse function $\Phi^{-1}(\Sigma\Phi(|v_i|))$ with the subtraction value D128 ($\Sigma\Phi(|v_i|)$ of $i=1$ through $i=d_c-1$) from the calculator 126 as an argument.

In parallel with the above processing, the EXOR circuit 129 calculates exclusive OR between the value D131 stored in the register 130 and the sign bit (bit represents positive/negative) D121, whereby multiplication is made between the sign bits D121 of the messages D104, and the multiplication result D130 is restored in the register 130. Note that in the event that the sign bits of the messages D104 from all of the branches across one line of the parity check matrix are multiplied, the register 130 is reset.

In the event that the multiplication result D130 ($\Pi sign(v_i)$ of $i=1$ through $i=d_c$) wherein the sign bits D121 of the messages D104 from all of the branches across one line of the parity check matrix are multiplied is stored in the register 130, the selector 131 selects the value stored in the register 130, i.e., the value D131 ($\Pi sign(v_i)$ of $i=1$ through $i=d_c$) wherein the sign bits D121 of the messages D104 from all of the branches across one line of the parity check matrix are multiplied, and outputs this to the register 132 as a value D132 to store this. The register 132 supplies the stored value D132 to the selector 131 and the EXOR circuit 134 as a value D133.

The selector 131 selects the value D133, supplied from the register 132, and outputs this to the register 132 to restore this until immediately before the multiplication result D130 ($\Pi sign(v_i)$ of $i=1$ through $i=d_c$) wherein the sign bits D121 of the messages D104 from all of the branches across one line of the parity check matrix are multiplied is restored in the register 130. That is to say, the register 132 supplies the value previously stored to the selector 131 and the EXOR circuit 134 until the sign bits D121 of the messages D104 (messages $v_i$) from all of the branches across one line of the parity check matrix are multiplied.

On the other hand, when a new value D133 ($\Pi sign(v_i)$ of $i=1$ through $i=d_c$) is supplied to the EXOR circuit 134 from the register 132, i.e., when the value D131 ($\Pi sign(v_i)$ of $i=1$ through $i=d_c$) wherein the sign bits D121 of the messages D104 from all of the branches across one line are multiplied is stored in the register 130, as described above, the integration value ($\Sigma(|v_i|)$ of $i=1$ through $i=d_c$) wherein the calculations result D123 of the one line worth are integrated is stored in the register 125.

When the integration value ($\Sigma\Phi(|v_i|)$ of $i=1$ through $d_c$) wherein the calculation results D123 of one row worth are integrated is stored in the register 125, as described above, with the check node calculator 173, the same messages DD104 as the messages D104 (messages $v_i$), i.e., the messages $v_i$ read out at the second time from the message memory 104 are input from the input port PD104 one by one, and of the message DD104 thereof, the lower bits except for the most significant bit, i.e., the absolutes value ($|v_i|$) of the message DD104 is supplied to the LUT 135, and also the most significant bit, i.e., the sign bit of the message DD104 is supplied to the EXOR circuit 134.

The EXOR circuit 134 calculates exclusive OR between the value D133 supplied from the register 132 and the sign bit of the message DD104 from the input port PD104, whereby the value D133 is divided by the sign bit of the message DD104, and the division result thereof is output as a division value D135. That is to say, the EXOR circuit 134 divides the multiplication value of the sign bits D121 ($\Pi sign(v_i)$ of $i=1$ through $i=d_c$) of the messages D104 from all of the branches across one line of the parity check matrix by the sign bit D121 ($sign(v_i)$ of $i=d_c$) of the message DD104 serving as the message $v_i$ from a desired branch, and outputs the division value ($\Pi sign(v_i)$ of $i=1$ to $i=d_c-1$) thereof as a division value D135.

Subsequently, with the check node calculator 173, a bit string wherein the calculation result D129 output from the LUT 128 is taken as lower bits, and the division value D135 output from the EXOR circuit 134 is taken as the most significant bit (sign bit) is output from the output port P112 as a message D105 (message $u_j$).

As described above, the check node calculator 173 performs the calculation of Expression (7) to obtain a message (check node message) $u_j$.

Note that though not shown in the drawing, with the decoding device in FIG. 12, the calculation of Expression (5) is performed instead of the variable node calculation of Expression (1) at the final stage of decoding, and the calculation result is output as the final decoding result.

Next, description will be made regarding the read/write control processing of a message (data) as to the message memory 104 by the control unit 174 of the decoding device in FIG. 12 with reference to the flowchart in FIG. 15.

Note that hereafter, with a node employed for obtaining a message, a message that is input to the node thereof is referred to as an input message, and also a message that a node obtains using an input message and outputs is referred to as an output message.

In step S101, the control unit 174 controls the message memory 104 to read out the input message necessary for obtaining an output message that is output from a certain node of interest (node of interest) (a message that is output from a branch connected to the node of interest), i.e., the message that is input from a branch connected to the node of interest, and supply this to the message calculation unit 171 (to perform the first-time readout of an input message), and proceeds to step S102.

In step S102, the control unit 174 controls the message memory 104 to read out the same input message as that read out from the message memory 104 in immediately preceding step S101, and supply this to the message calculation unit 171 (to perform the second-time readout of an input message), and proceeds to step S103.

In other words, in steps S101 and S102, readout control is performed wherein the same input message employed for calculation at the message calculation unit 171 (a check node calculation or variable node calculation) is read out from the message memory 104 twice to supply the messages thereof to the message calculation unit 171.

In step S103, the control unit 174 controls the message memory 104 to write in the output message obtained by the message calculation unit 171 performing calculation using the input messages read out from the message memory 104 in steps S101 and S102.

In other words, in step S103, write control is performed wherein the output message that is output by the message calculation unit 171 performing the calculation of Expression (1) or Expression (7) is written in the message memory 104.

Subsequently, the flow returns from step S103 to step S101, where the control unit 174 regards another node as a new node of interest, and controls the message memory 104 to read out the input message necessary for obtaining the output message to be output from the new node of interest thereof, and supply this to the message calculation unit 171, and hereafter repeats the same processing.

The message memory 104 has a two-bank configuration of the RAM#A and RAM#B as described above, and the control unit 174 subjects each of the RAM#A and RAM#B thereof to read/write control described with FIG. 15.

FIG. 16 is a timing chart illustrating the read/write timing of a message as to the message memory 104 of the decoding device in FIG. 12.

The timing chart in FIG. 16 represents the read/write timing as to the RAM#A and RAM#B making up the message memory 104, as with the above timing chart in FIG. 11.

In FIG. 16, first of all, the first-time readout from the RAM#A of the input message necessary for obtaining the output message from a certain node node#1 is performed (R1(node#1). Following completion of the readout thereof, the second-time readout from the RAM#A of the input message necessary for obtaining the output message from the node node#1 is performed (R2(node#1)), and at the same time, the first-time readout from the RAM#B of the input message necessary for obtaining the output message from the next node node#2 is performed (R1(node#2)).

Upon the second-time readout from the RAM#A of the input message necessary for obtaining the output message from the node node#1 being completed, and also the output message from the node node#1 being obtained at the message calculation unit 171, the output message from the node node#1 thereof is written in the RAM#A (W(node#1)), and at the same time, the second-time readout from the RAM#B of the input message necessary for obtaining the output message from the node node#2 is performed (R2(node#2)).

Upon the second-time readout from the RAM#B of the input message necessary for obtaining the output message from the node node#2 being completed, and also the output message from the node node#2 being obtained at the message calculation unit 171, the output message from the node node#2 thereof is written in the RAM#B (W(node#2)), and at the same time, the first-time readout from the RAM#A of the input message necessary for obtaining the output message from the next node node#3 is performed (R1(node#3)).

Upon writing of the output message from the node node#2 in the RAM#B, and also the first-time readout from the RAM#A of the input message necessary for obtaining the output message from the node node#3 being completed, the second-time readout from the RAM#A of the input message necessary for obtaining the output message from the node node#3 is performed (R2(node#3)), and at the same time, the first-time readout from the RAM#B of the input message necessary for obtaining the output message from the next node node#4 is performed (R1(node#4)).

Upon the second-time readout from the RAM#A of the input message necessary for obtaining the output message from the node node#3 being completed, and also the output message from the node node#13 being obtained at the message calculation unit 171, the output message from the node node#3 thereof is written in the RAM#A (W(node#3)), and at the same time, the second-time readout from the RAM#B of the input message necessary for obtaining the output message from the node node#4 is performed (R2(node#4)).

Hereinafter, in the same way, read/write of the message corresponding to each of the RAM#A and RAM#B making up the message memory 104 is continuously performed.

According to the decoding device in FIG. 12, the message calculation unit 171 reads out the same input message necessary for obtaining the output message from the message memory 104 twice, whereby it is not necessary to delay the input message within the message calculation unit 171, and accordingly, the message calculation unit 171 can be configured without providing the memory only for delaying data (the FIFO memory 155 provided in the variable node calculator 102 in FIG. 9, and FIFO memory 127 and 133 provided in the check node calculator 103 in FIG. 10). Consequently, the scale of the decoding device can be reduced.

Note that as can be understood from comparison between the read/write timing (FIG. 16) as to the message memory 104 in the decoding device in FIG. 12 which reads out the same input message from the message memory 104 twice without providing memory only for delaying data (hereafter, referred to as delaying memory), and the read/write timing (FIG. 11) of the message as to the message memory 104 in the decoding device in FIG. 8 which provides the delaying memory, and reads out the input message from the message memory 104 only once, the decoding device in FIG. 12 requires 50% longer time than the decoding device in FIG. 8 to obtain the output message from a certain node, so requires high-speed operations just for that much (requires a high-speed operating clock).

However, particularly in the event that a decoding device for performing full parallel decoding for performing a calculation for obtaining an output message regarding all of the nodes simultaneously (in parallel), or a decoding device for performing decoding partially in parallel for performing a calculation for obtaining an output message regarding p nodes, which is not one nor all, simultaneously (e.g., decoding device disclosed in Japanese Unexamined Patent Application Publication No. 2004-364233, for example) is configured so as to provide delaying memory, there is the need to provide a great number of delaying memory, which greatly affects the scale of the entire device.

With such a decoding device, such as the decoding device in FIG. 12, employing a configuration wherein the same input message is read out twice from the message memory 104 to obtain an output message, which eliminates the necessity of delaying memory, requires somewhat high-speed operations in the decoding device, but in return thereto, an advantage of extremely great device scale reduction can be obtained.

Note that with the present specification, a full serial decoding device will be described for the sake of facilitating description, but the configuration of the decoding device and a processing method described below can be applied to a decoding device for performing full parallel decoding, a decoding device for performing decoding partially in parallel, including the decoding device in FIG. 12, and in the event of applying those to such a decoding device, an advantage of particularly great device scale reduction can be obtained.

Incidentally, with the decoding device in FIG. 12, though description has been made that the message calculation unit 171 which is a means for obtaining an output message is made up of the variable node calculator 172 for performing a variable node calculation, and the check node calculator 173 for performing a check node calculation, the means for obtaining an output message can be configured so as to share a part of a circuit for performing a variable node calculation and a circuit for performing a check node calculation, and selectively perform a variable node calculation or check node calculation.

Next, description will be made regarding a decoding device having a configuration wherein a part of a circuit for performing a variable node calculation and a circuit for performing a check node calculation is shared, and also delaying memory is not provided, but as for a preparation stage, description will be made first regarding a decoding device having a configuration wherein a part of a circuit for performing a variable node calculation and a circuit for performing a check node calculation is shared, and also delaying memory is provided.

Figure 17:
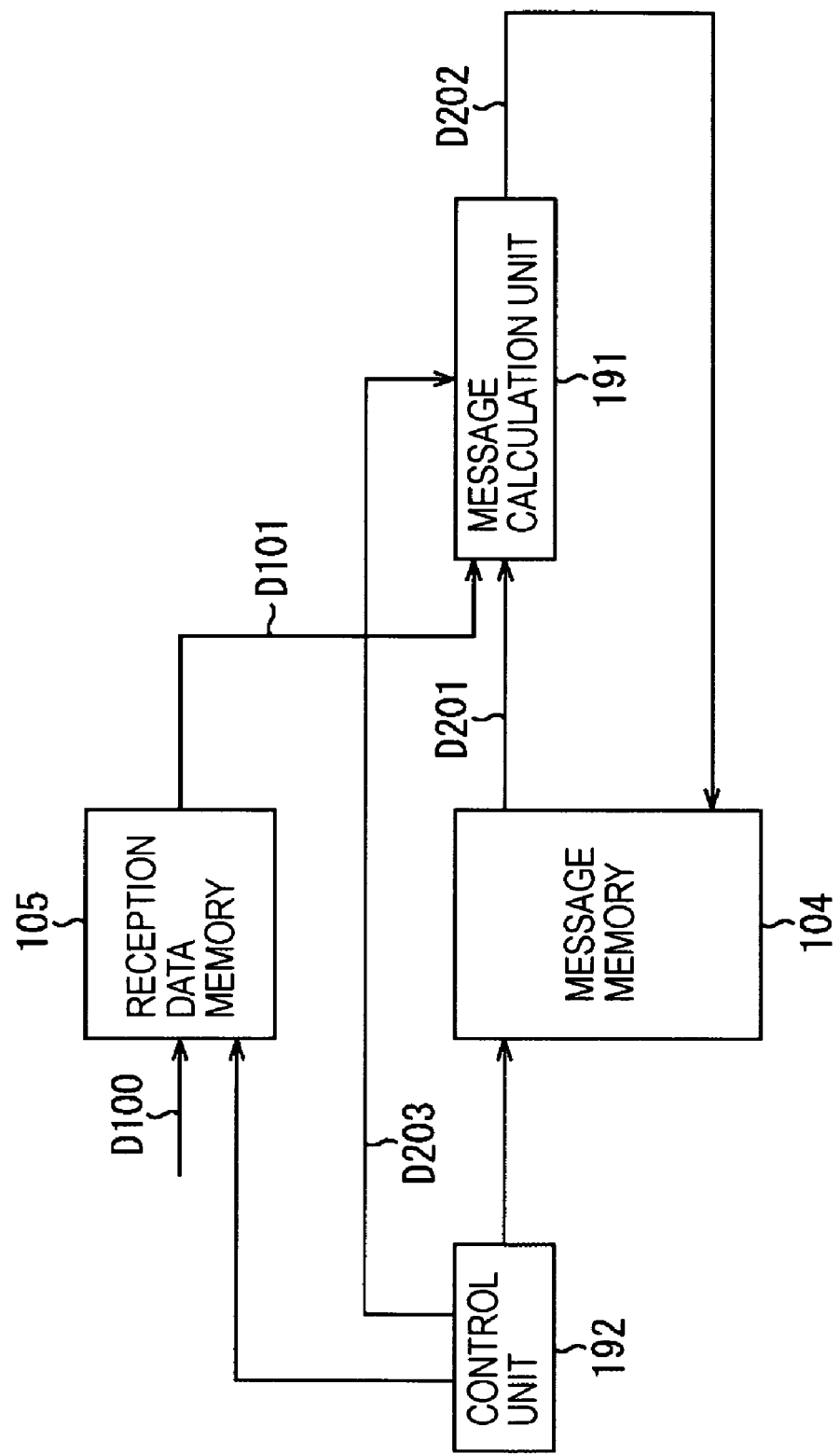
FIG. 17 is a block diagram illustrating a configuration example of a decoding device of which a part of a circuit for performing a variable node calculation and a circuit for performing a check node calculation is shared.

FIG. 17 is a block diagram illustrating a configuration example of such a decoding device.

Note that in the drawing, the portions corresponding to those in the decoding device in FIG. 8 are appended with the same reference numerals, and description thereof will be omitted below as appropriate. That is to say, the decoding device in FIG. 17 is configured in the same way as the decoding device in FIG. 8 except that a message calculation unit 191 is provided instead of the message calculation unit 101, and also a control unit 192 is provided instead of the control unit 106.

The decoding device in FIG. 17 repeatedly performs full serial decoding, as with the decoding device in FIG. 8.

With the decoding device in FIG. 17, the message calculation unit 191 sequentially reads out an input message from the message memory 104 one by one, and calculates the output message corresponding to a desired branch using the input message thereof. Subsequently, the output message obtained by the calculation thereof is stored in the message memory 104. The decoding device in FIG. 17 performs so-called repeat decoding by repeatedly performing the above processing.

That is to say, reception data (LDPC code) D100 that is a log likelihood ratio representing the identity of code 0 (or 1) that can be obtained by receiving an LDPC code transmitted is supplied to the reception data memory 105, and the reception data memory 105 stores the reception data D100 thereof.

At the time of a variable node calculation, the reception data memory 105 reads out the stored reception data in accordance with the control signal supplied from the control unit 192, and supplies this to the message calculation unit 191 as reception data D101.

Also, at the time of a variable node calculation, the message memory 104 reads out the stored message D201 in accordance with the control signal supplied from the control unit 192, and supplies this to the message calculation unit 191. Further, at the time of a variable node calculation, the control unit 192 supplies a control signal for instructing a variable node calculation to the message calculation unit 191 as a control signal D203.

The message calculation unit 191 performs the variable node calculation of Expression (1) using the message D201 supplied from the message memory 104, and the reception data D101 supplied from the reception data memory 105 in accordance with the control signal D203 from the control unit 192, and supplies the output message (variable node message) $v_i$ obtained as a result of the variable node calculation thereof to the message memory 104 as a message D202.

Subsequently, the message memory 104 stores the message D202 that is supplied from the message calculation unit 191 thus described above.

On the other hand, at the time of a check node calculation, the message memory 104 reads out the stored variable message $v_i$ in accordance with the control signal supplied from the control unit 192 as an input message D201, and supplies this to the message calculation unit 191.

Further, at the time of a check node calculation, the control unit 192 supplies a control signal for instructing a check node calculation to the message calculation unit 191 as a control signal D203.

The message calculation unit 191 performs the check node calculation of Expression (7) using the input message D201 that is supplied from the message memory 104 in accordance with the control signal D203 from the control unit 192, and supplies the output message (check node message) $u_j$ obtained by the check node calculation thereof to the message memory 104 as a message D202.

Subsequently, the message memory 104 stores the message D202 that is supplied from the message calculation unit 191 thus described above.

The message D202 that is the check node message $u_j$ from the message calculation unit 191 that the message memory 104 stored is read out as a message D201 at the time of the next variable node calculation, and is supplied to the message calculation unit 191.

Figure 18:
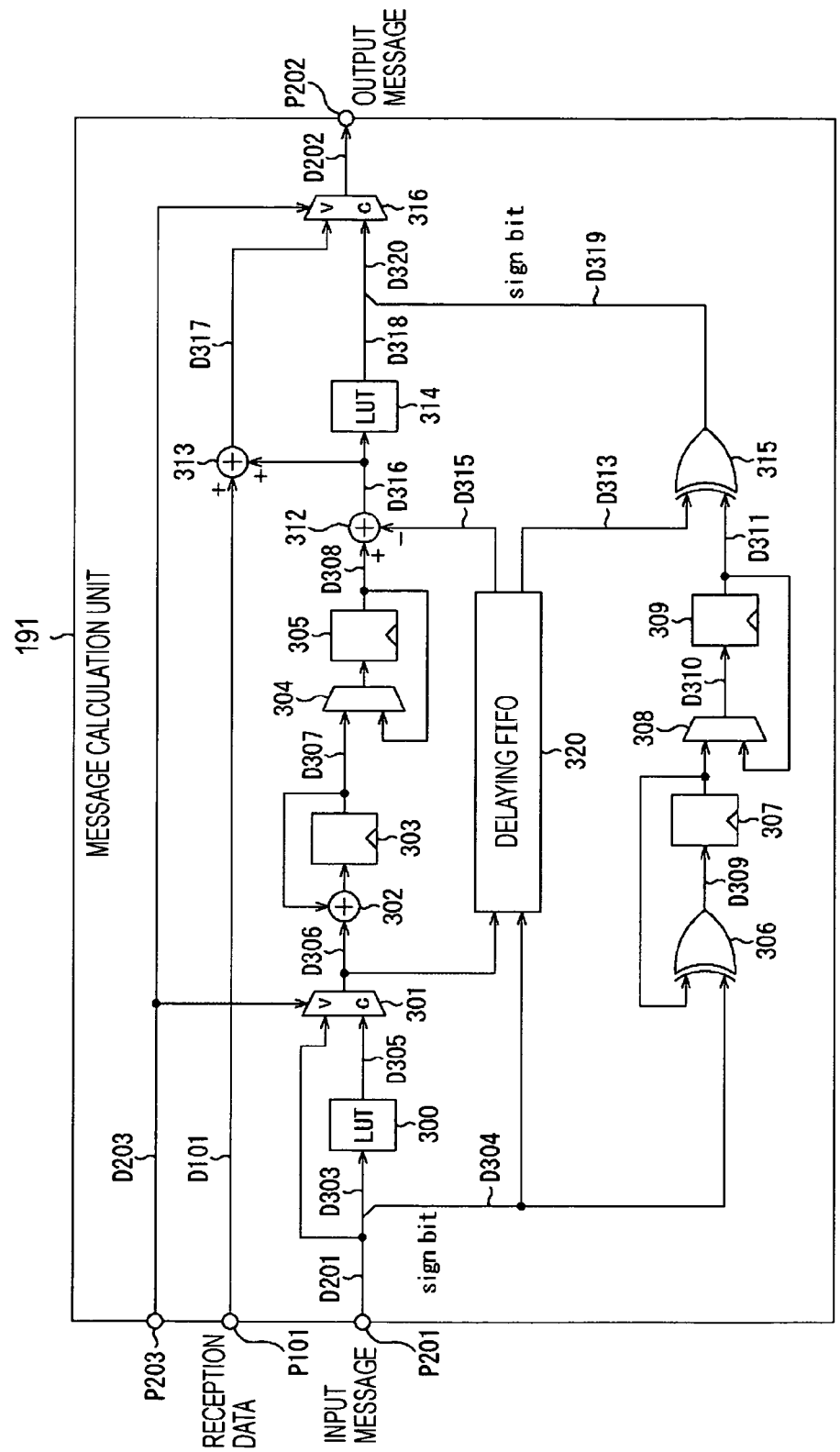
FIG. 18 is a block diagram illustrating a configuration example of a message calculator 191.

FIG. 18 illustrates a configuration example of the message calculation unit 191 in FIG. 17.

The message calculation unit 191 includes two input ports P101 and P201 as input ports to which a message (data) is externally supplied (input), and one output port P202 as a port for supplying (outputting) a message externally. Further, the message calculation unit 191 includes one input port P203 as an input port to which a control signal is supplied (input) externally.

The message calculation unit 191 selectively performs the variable node calculation of Expression (1) or the check node calculation of Expression (7) using a message that is input from the input port P201, and further if necessary, a message (reception data) that is input from the input port P101 in accordance with the control signal D203 that is input from the input port P203, and outputs the message obtained as a result thereof from the output port P202.

That is to say, the input port P101 is supplied with the reception data D101 read out from the reception data memory 105. Also, the input port P201 is supplied with the message D201 (check node message $u_j$ or variable node message $v_i$) read out from the message memory 104. Further, the input port P203 is supplied with the control signal D203 from the control unit 192.

Subsequently, the reception data D101 supplied to the input port P101 is supplied to a calculator 313, and the message D201 supplied to the input port P201 is supplied to the terminal v of a selector 301. Further, of the message D201 supplied to the input port P201, the lower bits except for the most significant bit, i.e., the absolute value of the message D201 is supplied to the LUT 300 as a value D303, and the most significant bit of the message D201, i.e., the sign bit of the message D201 is supplied to an EXOR circuit 306 and FIFO memory 320 as a value D304.

Also, the control signal D203 supplied to the input port P203 is supplied to the selectors 301 and 316.

The selectors 301 and 316 include a terminal v and a terminal c, and select a value supplied to one of the terminal v and terminal c in accordance with the control signal D203, and output this to the subsequent stage. That is to say, in the event that the control signal D203 is a control signal for instructing a variable node calculation, the selectors 301 and 316 select the value supplied to the terminal v to output this to the subsequent stage, and in the event that the control signal D203 is a control signal for instructing a check node calculation, the selectors 301 and 316 select the value supplied to the terminal c to output this to the subsequent stage.

Figure 19:
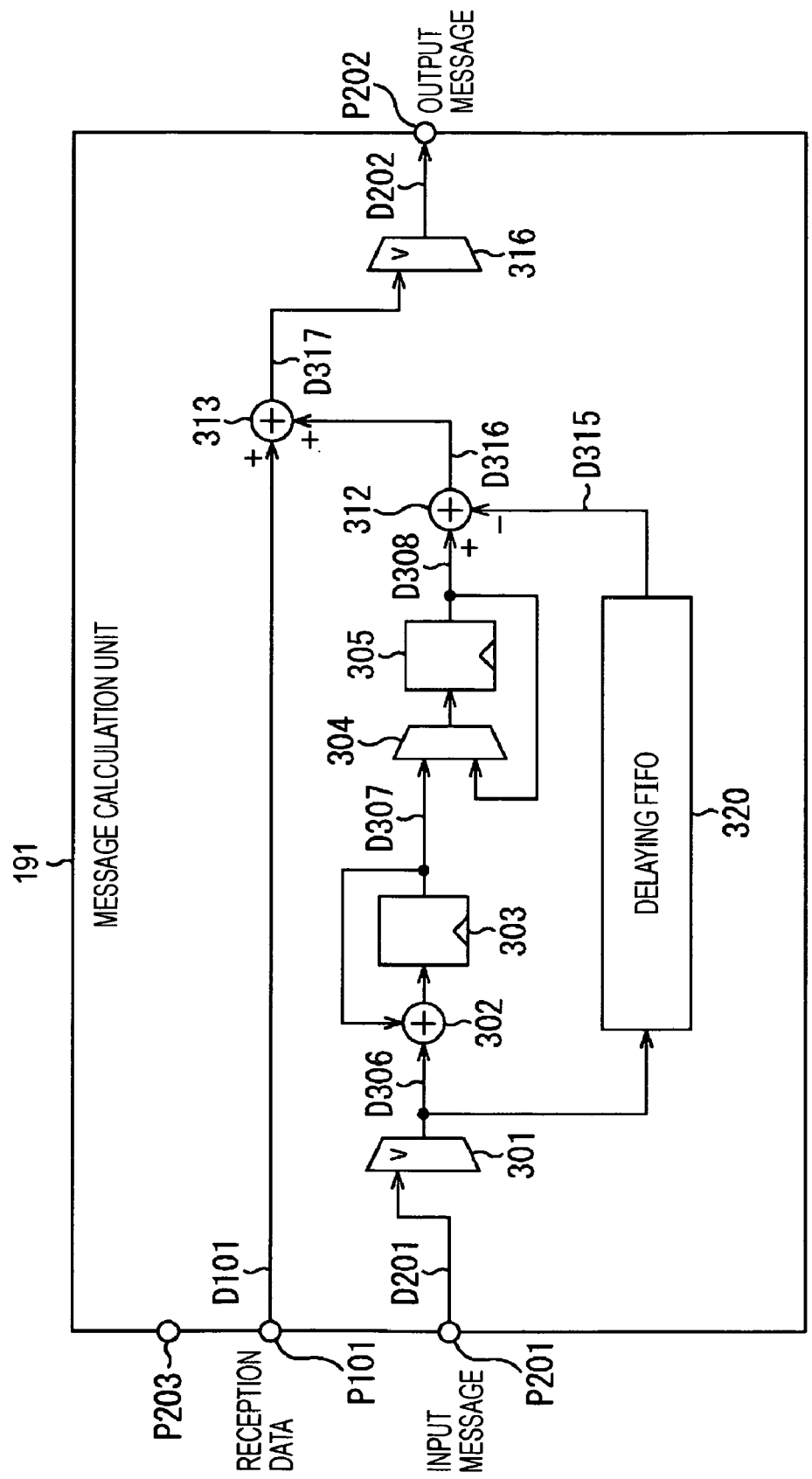
FIG. 19 is a block diagram illustrating an actual configuration of the message calculator 191 at the time of a variable node calculation.
Figure 20:
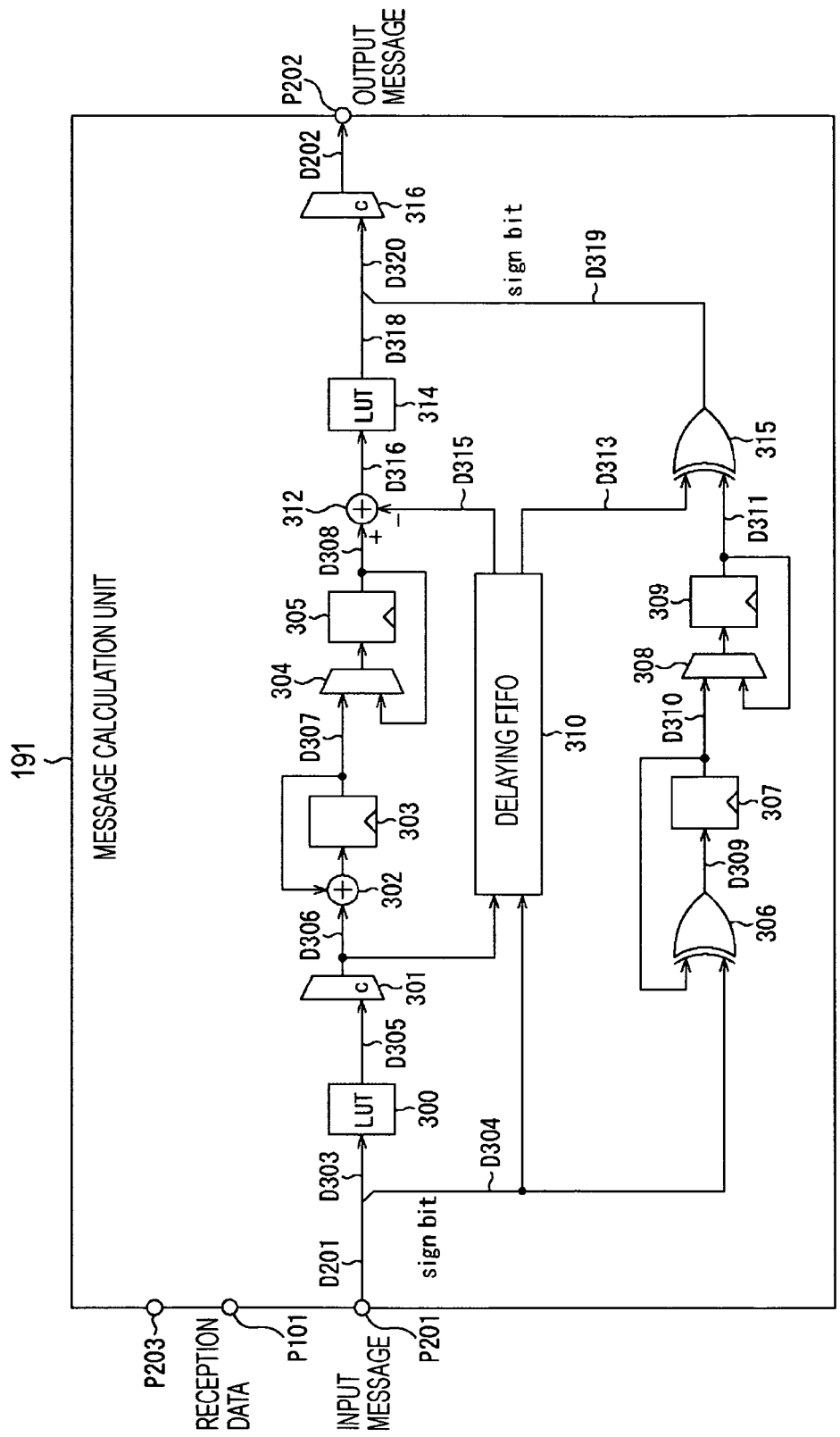
FIG. 20 is a block diagram illustrating an actual configuration of the message calculator 191 at the time of a check node calculation.

As a result thereof, the message calculation unit 191 substantially makes the transition to the configuration illustrated in FIG. 19 to perform a variable node calculation at the time of a variable node calculation, and makes the transition to the configuration illustrated in FIG. 20 to perform a check node calculation at the time of a check node calculation.

FIG. 19 illustrates a substantial configuration example of the message calculation unit 191 at the time of a variable node calculation.

Note that as described above, at the time of a variable node calculation, the selectors 301 and 316 select the terminal v, but in FIG. 19, of the configuration illustrated in FIG. 18, the portions which do not function (substantially) at the time of a variable node calculation by the selectors 301 and 316 selecting the terminal v (portions not relating to a variable node calculation) are omitted in the drawing.

At the time of a variable node calculation, the input port P101 is supplied with the reception data D101 read out one by one from the reception data memory 105. Also, the input port P201 is sequentially supplied with the check node message $u_j$ from the check node corresponding to each line of the parity check matrix (the check node corresponding to each line of the row corresponding to a variable node of which output message $v_i$ is to be obtained) as a message D201.

The reception data D101 supplied to the input port P101 is supplied to the calculator 313.

Also, the message D210 (message $u_j$) supplied to the input port P201 is supplied to the terminal v of the selector 301, and is supplied to the calculator 302 and the FIFO memory 320 from the selector 301 which selects the terminal v at the time of a variable node calculation as a message D306.

The calculator 302 integrates the message D306 by adding the message D306 (message $u_j$) from the selector 301 and the value D307 stored in the register 303, and restores the integration value obtained as a result thereof in the register 303. Note that in the event of the messages D306 from all of the branches across one row of the parity check matrix being integrated, the register 303 is reset.

In the event that the messages D306 across one row of the parity check matrix are read in one by one, and also the integration value wherein the messages D306 of the one row worth are integrated is stored in the register 303, i.e., in the event that the integration value ($\Sigma u_j$ of j=1 through $d_v$) wherein the messages D306 (messages $u_j$) from all of the branches across one row of the parity check matrix are integrated is stored in the register 303, the selector 304 selects the value stored in the register 303, i.e., the integration value D307 ($\Sigma u_j$ of j=1 through $d_v$) wherein the messages D306 (messages $u_j$) of all of the branches across the one row of the parity check matrix are integrated, and outputs this to the register 305 to store this.

The register 305 supplies the stored value D307 to the selector 304 and the calculator 312 as a value D308. The selector 304 selects the value D308 supplied from the register 305, and outputs this to the register 305 to restore this until immediately before the value wherein the messages D306 of one row worth are integrated is stored in the register 303. That is to say, the register 305 supplies the value previously integrated to the selector 304 and the calculator 312 until the messages D306 (messages $u_j$) from all of the branches across one row of the parity check matrix are integrated.

On the other hand, the FIFO memory 320 delays the message D306 from a check node that the selector 301 output to supply this to the calculator 312 as a value D315 until a new value D308 ($\Sigma u_j$ of j=1 through $d_v$) is output from the register 305. The calculator 312 subtracts the value D315 supplied from the FIFO memory 320 from the value D308 supplied from the register 305. That is to say, the calculator 312 subtracts the message D315 ($u_j$) supplied from a desired branch from the integration value D308 ($\Sigma u_j$ of j=1 through $d_v$) of the messages D306 (messages $u_j$) of all of the branches across one row of the parity check matrix to obtain the subtraction value D316 ($\Sigma u_j$ of j=1 through $d_v$−1), and supplies this to the calculator 313.

The calculator 313 adds the reception data D101 from the input port P101 and the subtraction value D316 ($\Sigma u_j$ of j=1 through $d_v$−1) from the calculator 312, and supplies the addition value D317 (variable node message $v_i$) obtained as a result thereof to the terminal v of the selector 316.

The selector 316 selects the terminal v at the time of a variable node calculation, and the addition value D317 from the calculator 313 supplied to the terminal v thereof is output from the output port P202 as a message D202 (message $v_i$).

As described above, the message calculation unit 191 wherein the selectors 301 and 304 select the terminal v performs the variable node calculation of Expression (1), and outputs the message (variable node message) $v_i$ obtained as a result thereof from the output port P202.

FIG. 20 illustrates a substantial configuration example of the message calculation unit 191 in FIG. 18 at the time of a check node calculation.

Note that as described above, at the time of a check node calculation, the selectors 301 and 316 select the terminal c, but in FIG. 20, of the configuration illustrated in FIG. 18, the portions which do not function (substantially) at the time of a check node calculation by the selectors 301 and 316 selecting the terminal c (portions not relating to a check node calculation) are omitted in the drawing.

At the time of a check node calculation, the input port P201 is sequentially supplied with the variable node message $v_i$ from the variable node corresponding to each row of the parity check matrix (the variable node corresponding to each row of the line corresponding to a check node of which output message $u_j$ is desired to be obtained) as a message D201.

Of the message D201 (message $u_j$) supplied to the input port P201, the lower bits except for the most significant bit, i.e., the absolute value D303 ($|v_i|$) of the message D201 is supplied to the LUT 300, and the most significant bit, i.e., the sign bit D304 of the message D201 is supplied to the EXOR circuit 306 and the FIFO memory 320, respectively.

The LUT 300 is an LUT for outputting the calculation result of the nonlinear function $\Phi(x)$ in the check node calculation of Expression (7) with the value that is input thereto as an argument x, reads out the calculation result D305 ($\Phi(|v_i|)$) of the calculation of the nonlinear function $\Phi(|v_i|)$ with the absolute value D303 ($|v_i|$) as an argument, and supplies this to the terminal c of the selector 301.

The selector 301 selects the terminal c at the time of a check node calculation, and the calculation result D305 ($\Phi(|v_i|)$) from the LUT 300 supplied to the terminal c thereof is supplied to the calculator 302 and the FIFO memory 320 as a calculation result D306 ($\Phi(|v_i|)$).

The calculator 302 integrates the calculation result D306 by adding the calculation result D306 ($\Phi(|v_i|)$) and the value D307 stored in the register 303, and restores the integration value obtained as a result thereof in the register 303. Note that in the event that the calculation results D306 ($\Phi(|v_i|)$) as to the absolute values D303 ($|v_i|$) of the messages D201 of all of the branches across one line of the parity check matrix are integrated, the register 303 is reset.

In the event that the messages D201 across one line of the parity check matrix are read in one by one, and the integration value wherein the calculation results D306 of one line worth are integrated is stored in the register 303, the selector 304 selects the value stored in the register 303, i.e., the integration value D307 ($\Sigma\Phi(|v_i|)$ of i=1 through i=$d_c$) wherein $\Phi(|v_i|)$ obtained from the messages D201 (messages $v_i$) from all of the branches across one line of the parity check matrix is integrated, and outputs this to the register 305 to store this. The register 305 supplies the stored integration value D307 to the selector 304 and the calculator 312 as a value D308.

The selector 304 selects the value D308 supplied from the register 305, and outputs this to the register 305 to restore this until immediately before the integration value wherein the calculation results D306 of one line worth are integrated is stored in the register 303. That is to say, the register 305 supplies the integration value of $\Phi(|v_i|)$ previously integrated to the selector 304 and the calculator 312 until $\Phi(|v_i|)$ obtained from the messages D201 (messages $v_i$) from all of the branches across one line of the parity check matrix is integrated.

On the other hand, the FIFO memory 320 delays the calculation result D306 ($\Phi(|v_i|)$) that the LUT 300 output to supply this to the calculator 312 as a value D315 until a new value D308 ($\Sigma\Phi(|v_i|)$ of i=1 through i=$d_c$) is output from the register 305. The calculator 312 subtracts the value D315 supplied from the FIFO memory 320 from the value D308 supplied from the register 305, and supplies the subtraction result thereof to the LUT 314 as a subtraction value D316. That is to say, the calculator 312 subtracts $\Phi(|v_i|)$ obtained from the message D201 (message $v_i$) supplied from a desired branch from the integration value ($\Sigma\Phi(|v_i|)$ of i=1 through i=$d_c$) of $\Phi(|v_i|)$ obtained from the messages D201 (messages $v_i$) from all of the branches across one line of the parity check matrix, and supplies the subtraction value thereof ($\Sigma\Phi(|v_i|)$ of i=1 through i=$d_c$-1) to the LUT 314 as a subtraction value D316.

The LUT 314 is an LUT for outputting the calculation result of the inverse function $\Phi^{-1}(x)$ of the nonlinear function $\Phi(x)$ in the check node calculation of Expression (7) with the value that is input thereto as an argument x, outputs the calculation result D318 ($\Phi^{-1}(\Sigma\Phi(|v_i|))$) of the calculation of the inverse function $\Phi^{-1}(\Sigma\Phi(|v_i|))$ with the subtraction value D316 ($\Sigma\Phi(|v_i|)$ of i=1 through i=$d_c$-1) from the calculator 312 as an argument.

Note that as described above, the calculation result of the nonlinear function $\Phi(x)$ and the calculation result of the inverse function $\Phi^{-1}(x)$ are equal, and accordingly, the LUT 300 and LUT 314 have the same configuration.

In parallel with the above processing, the EXOR circuit 306 calculates exclusive OR between the value D310 stored in the register 307 and the sign bit (bit represents positive/negative) D304, whereby multiplication is made between the sign bits, and the multiplication result D309 is restored in the register 307. Note that in the event that the sign bits D304 of the messages D201 from all of the branches across one line of the parity check matrix are multiplied, the register 307 is reset.

In the event that the multiplication result D309 ($\Pi sign(v_i)$ of i=1 through i=$d_c$) wherein the sign bits D304 of the messages D201 from all of the branches across one line of the parity check matrix are multiplied is stored in the register 307, the selector 308 selects the value stored in the register 307, i.e., the value D310 ($\Pi sign(v_i)$ of i=1 through i=$d_c$) wherein the sign bits D304 of the messages D201 from all of the branches across one line of the parity check matrix are multiplied, and outputs this to the register 309 to store this. The register 309 supplies the stored value D311 to the selector 308 and the EXOR circuit 315.

The selector 308 selects the value D311 supplied from the register 309, and outputs this to the register 309 to restore this until immediately before the multiplication result D309 ($\Pi sign(v_i)$ of i=1 through i=$d_c$) wherein the sign bits D304 of the messages D201 from all of the branches across one line of the parity check matrix are multiplied.

On the other hand, the FIFO memory 320 delays the sign bit D304 until a new value D311 ($\Pi sign(v_i)$ of i=1 to i=$d_c$) is supplied to the EXOR circuit 315 from the register 309, and supplies this to the EXOR circuit 315 as one bit value D313. The EXOR circuit 315 calculates exclusive OR between the value D311 supplied from the register 309 and the value D313 supplied from the FIFO memory 320, whereby the value D311 is divided by the value D313 to output the division result thereof as a division value D319. That is to say, the EXOR circuit 315 divides the multiplication value ($\Pi sign(v_i)$ of i=1 to i=$d_c$) of the sign bits D304 (sign($v_i$)) of the messages D201 from all of the branches across one line of the parity check matrix by the sign bit D304 (sign($v_i$)) of the message D201 from a desired branch, and outputs the division value ($\Pi sign(v_i)$ of i=1 to i=$d_c$-1) thereof as a division value D319.

Subsequently, with the message calculation unit 191, a bit string D320 (check node message $u_j$) wherein the calculation result D318 output from the LUT 314 is taken as lower bits, and also the division value D319 output from the EXOR circuit 315 is taken as the most significant bit (sign bit) is supplied to the terminal c of the selector 316.

The selector 316 selects the terminal c at the time of a check node calculation, and the bit string D320 (message $u_j$) to be supplied to the terminal c thereof is output from the output port P202 as a message D202 (message $v_i$).

As described above, the message calculation unit 191 wherein the selectors 301 and 304 select the terminal c performs the check node calculation of Expression (7), and outputs the message (check node message) $u_j$ obtained as a result thereof from the output port P202.

Note that though not shown in the drawing, with the decoding device in FIG. 17, the calculation of Expression (5) is performed instead of the variable node calculation of Expression (1) at the final stage of decoding, and the calculation result thereof is output as the final decoding result.

According to the decoding device in FIG. 17, the LDPC code of various types of parity check matrix can be decoded as long as there is sufficient capacity for the message memory 104, and the FIFO memory 320 of the message calculation unit 191.

Also, with the message calculation unit 191 (FIG. 18) of the decoding device in FIG. 17, as can be understood from comparison between FIG. 19 and FIG. 20, the calculator 302 and register 303 for performing a value integration and outputting the integration value thereof, the selector 304, register 305, and calculator 312 for subtracting a certain value from an integration value and outputting the subtraction value thereof, and the FIFO memory 320 which is delaying memory for delaying a value are shared in a variable node calculation and in a check node calculation, whereby a circuit scale can be reduced as compared with the message calculation unit 101 including the variable node calculator 102 and the check node calculator 103 independently, such as the decoding device in FIG. 8, for example.

Figure 21:
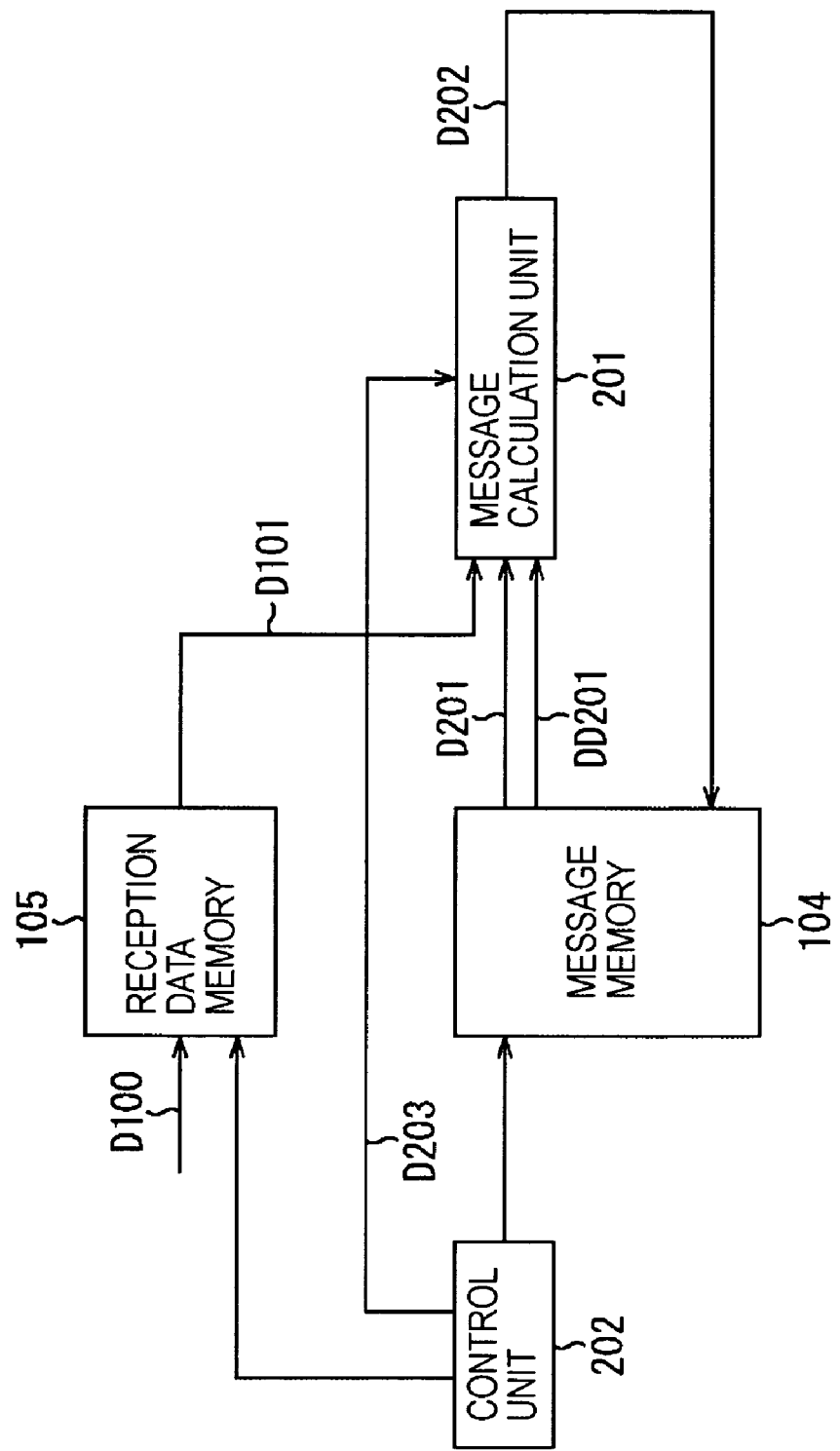
FIG. 21 is a block diagram illustrating a configuration example of a second embodiment of a decoding device to which the present invention is applied.

FIG. 21 is a block diagram illustrating a configuration example of a second embodiment of a decoding device to which the present invention is applied. Note that in the drawing, the portions corresponding to those in the decoding device in FIG. 17 are appended with the same reference numerals, and description thereof will be omitted below as appropriate. That is to say, the decoding device in FIG. 21 is configured in the same way as the decoding device in FIG. 17 except that a message calculation unit 201 is provided instead of the message calculation unit 191, and also a control unit 202 is provided instead of the control unit 192.

The decoding device in FIG. 21 is configured wherein the message calculation unit 201 shares a part of a circuit for performing a variable node calculation and a circuit for performing a check node calculation, as with the message calculation unit 191 of the decoding device in FIG. 17. Further, with the decoding device in FIG. 21, the message calculation unit 201 for performing a variable node calculation and a check node calculation is configured without providing delaying memory (memory equivalent to the FIFO memory 320 of the message calculation unit 191 in FIG. 18).

With the decoding device in FIG. 21, the message calculation unit 201 sequentially reads out an input message from the message memory 104 one by one, and calculates the output message corresponding to a desired branch using the input message thereof. Subsequently, the output message obtained by the calculation thereof is stored in the message memory 104. The decoding device in FIG. 21 performs full-serial repeat decoding by repeatedly performing the above processing.

That is to say, reception data (LDPC code) D100 that is a log likelihood ratio representing the identity of code 0 (or 1) that can be obtained by receiving an LDPC code transmitted is supplied to the reception data memory 105, and the reception data memory 105 stores the reception data D100 thereof.

At the time of a variable node calculation, the reception data memory 105 reads out the stored reception data in accordance with the control signal supplied from the control unit 202, and supplies this to the message calculation unit 201 as reception data D101.

Also, at the time of a variable node calculation, the message memory 104 reads out the stored same message twice in accordance with the control signal supplied from the control unit 202, supplies the message read out at the first time to the message calculation unit 201 as a message D201, and supplies the message read out at the second time to the message calculation unit 201 as a message DD201. The message calculation unit 201 performs the variable node calculation of Expression (1) using the messages D201 and DD201 supplied from the message memory 104, and the reception data D101 supplied from the reception data memory 105 in accordance with the variable node calculation instruction represented by the control signal D203 supplied from the control unit 202, and supplies the message (variable node message) $v_i$ obtained as a result of the variable node calculation thereof to the message memory 104 as a message D202.

Subsequently, the message memory 104 stores the message D202 (variable node message $v_i$) supplied from the message calculation unit 201 in accordance with the control signal supplied from the control unit 202.

On the other hand, at the time of a check node calculation, the message memory 104 reads out the stored same message (variable node message $v_i$) twice in accordance with the control signal to be supplied from the control unit 202, supplies the message read out at the first time to the message calculation unit 201 as a message D201, and supplies the message read out at the second time to the message calculation unit 201 as a message DD201.

The message calculation unit 201 performs the check node calculation of Expression (7) using the messages D201 and DD201 supplied from the message memory 104 in accordance with the check node calculation instruction represented by the control signal D203 from the control unit 202, and supplies the message (check node message) $u_j$ obtained by the check node calculation thereof to the message memory 104 as a message D202.

Subsequently, the message memory 104 stores the message D202 (check node message $u_j$) supplied from the message calculation unit 201 in accordance with the control signal supplied from the control unit 202.

The message D202 from the message calculation unit 201 that the message memory 104 stored, i.e., the check node message $u_j$ is read out as messages D102 and DD201 at the time of the next variable node calculation, and is supplied to the message calculation unit 201.

Figure 22:
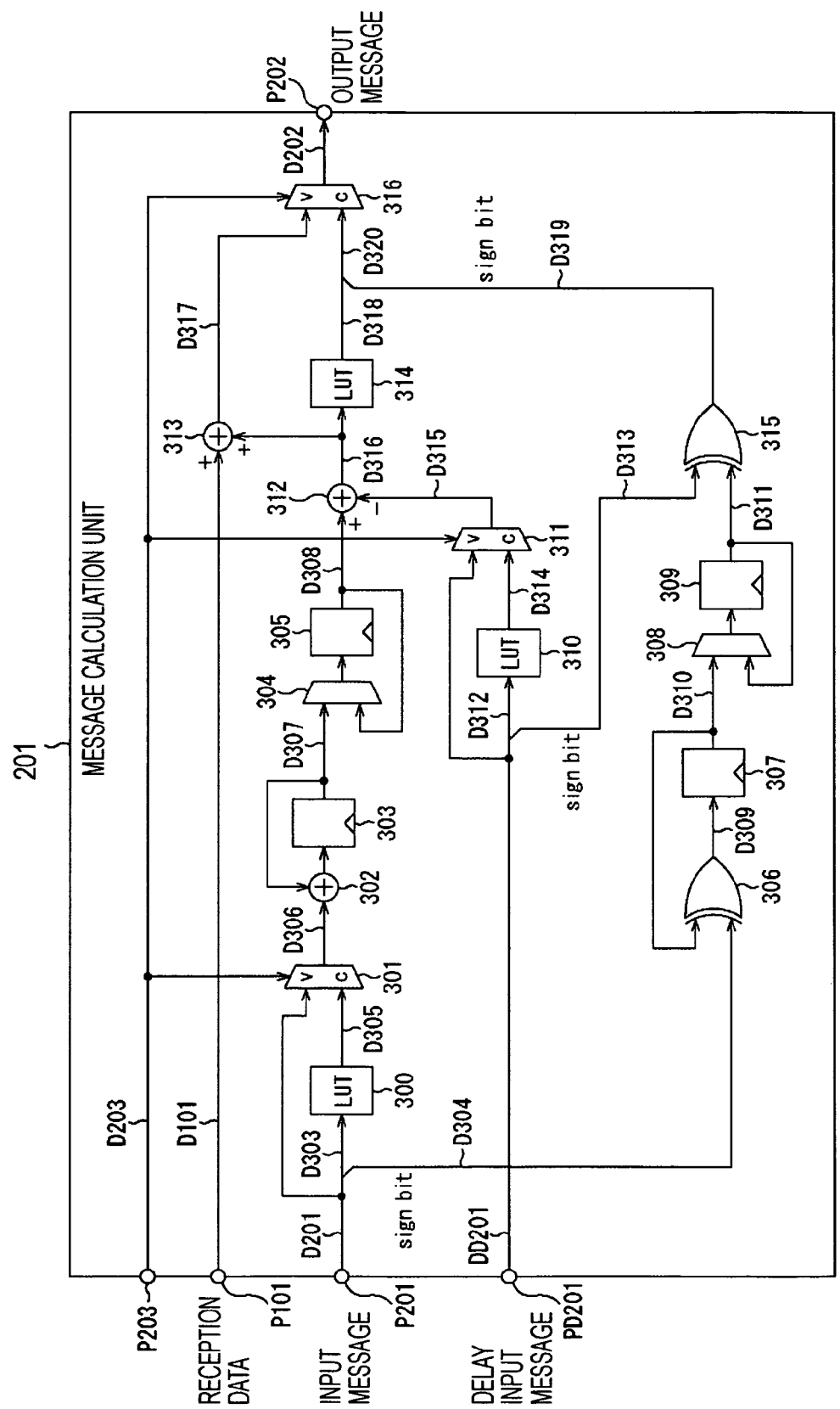
FIG. 22 is a block diagram illustrating a configuration example of a message calculator 201.

FIG. 22 illustrates a configuration example of the message calculation unit 201 in FIG. 21.

Note that in the drawing, the portions corresponding to those in the message calculation unit 191 in FIG. 18 are appended with the same reference numerals, and description thereof will be omitted below as appropriate.

The message calculation unit 201 is configured without providing delaying memory for delaying data (FIFO memory 320 provided in the message calculation unit 191 in FIG. 18).

Instead thereof, the message calculation unit 201 includes an input port PD201 as an input port to which a message (data) is supplied (input) externally as well as the input ports P101 and P201, and also includes an LUT 310 and a selector 311.

The input port P101 is supplied (input) with the reception data D101 read out from the reception data memory 105. Also, the input port P201 is supplied (input) with a message D201 (hereafter, also referred to as first-time message as appropriate) that is read out at the first time of the same messages D201 and DD201 read out twice from the message memory 104, and the input port PD201 is supplied with the message DD201 (hereafter, also referred to as second-time message as appropriate) that is read out at the second time.

The message calculation unit 201 performs the variable node calculation of Expression (1) or the check node calculation of Expression (7) using the first-time message D201 that is input from the input port P201, the second-time message DD201 that is input from the input port PD201, and further if necessary, a message (reception data) that is input from the input port P101 in accordance with the control signal D203 that is input from the input port P203, and outputs the message obtained as a result thereof from the output port P202.

That is to say, the reception data D101 supplied to the input port P101 is supplied to the calculator 313, and the first-time message D201 supplied to the input port P201 is supplied to the terminal v of the selector 301.

Further, of the first-time message D201 supplied to the input port P201, the lower bits except for the most significant bit, i.e., the absolute value of the message D201 is supplied to the LUT 300 as a value D303, and the most significant bit of the first-time message D201, i.e., the sign bit of the message D201 is supplied to the EXOR circuit 306 as a value D304.

Also, the second-time message DD201 supplied to the input port PD201 is supplied to the terminal v of the selector 311. Further, of the second-time message DD201 supplied to the input port PD201, the lower bits except for the most significant bit, i.e., the absolute value of the message DD201 is supplied to the LUT 310 as a value D312, and the most significant bit of the second-time message DD201, i.e., the sign bit of the message DD201 is supplied to the EXOR circuit 306 as a value D313.

Also, the control signal D203 supplied to the input port P203 is supplied to the selectors 301, 311, and 316.

The selectors 301, 311, and 316 include a terminal v and a terminal c, and select a value that is supplied to one of the terminal v and terminal c in accordance with the control signal D203, and output this to the subsequent stage. That is to say, in the event that the control signal D203 is a control signal for instructing a variable node calculation, the selectors 301, 311, and 316 select the value that is supplied to the terminal v to output this to the subsequent stage, and in the event that the control signal D203 is a control signal for instructing a check node calculation, the selectors 301, 311, and 316 select the value that is supplied to the terminal c to output this to the subsequent stage.

As a result thereof, with the message calculation unit 201 in FIG. 22, when the control signal D203 instructs a variable node calculation, a variable node calculation is performed, and when the controls signal D203 instructs a check node calculation, a check node calculation is performed.

Now, description will be made regarding a variable node calculation and a check node calculation performed by the message calculation unit 201 in FIG. 22 with reference to FIG. 23.

Figure 23:
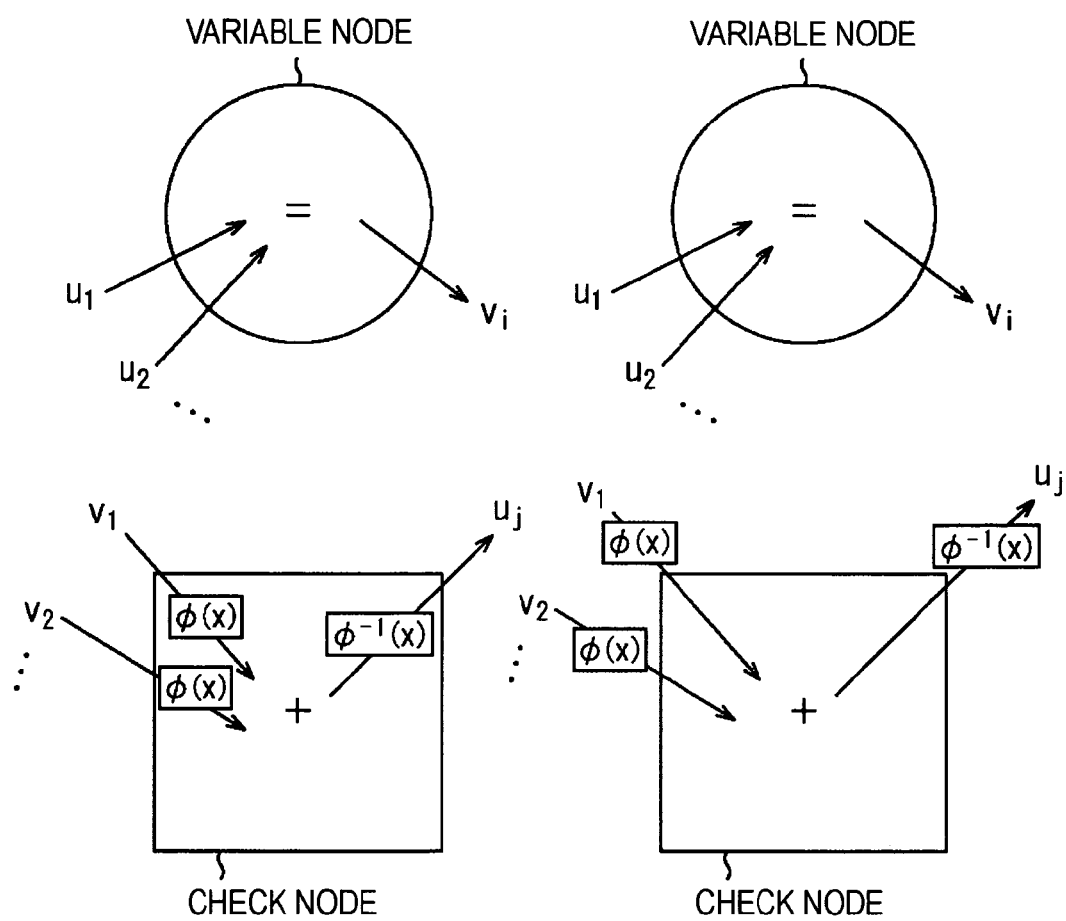
FIG. 23 is a diagram describing a variable node calculation and a check node calculation performed by the message calculator 201.

The left side of FIG. 23 schematically illustrates a variable node for performing the variable node calculation of Expression (1), and a check node for performing the check node calculation of Expression (7).

At the variable node, the message $v_i$ corresponding to a branch to be calculated (the i'th branch of the branches connected to the variable node) is obtained by adding the messages $u_1$, $u_2$, and so on from the residual branches connected to the variable node such as shown in Expression (1).

Also, at the check node, the message $u_j$ corresponding to a branch to be calculated (the j'th branch of the branches connected to the check node) is obtained by integrating the calculation results of the nonlinear function $\Phi(x)$ with the messages $v_1$, $v_2$, and so on from the residual branches connected to the check node as an argument x, and calculating the inverse function $\Phi^{-1}(x)$ with the integration value obtained as a result thereof as an argument x, such as shown in Expression (7).

Now, if we say that data that is input to a node (data prior to input) is referred to as input data, and data that is output from a node (data prior to output) is referred to as output data, the calculations at the variable node and the check node at the left side of FIG. 23 are equivalent to the calculations illustrated at the right side of FIG. 23.

That is to say, at the right side of FIG. 23, the message $v_i$ in the variable node is obtained by the same calculation as the calculation in the variable node at the left side of FIG. 23. Also, at the right side of FIG. 23, the calculation of the nonlinear function $\Phi(x)$ is not performed in the check node, but input data that is input to the check node (the messages $v_1$, $v_2$, and so on prior to input) is subjected to the calculation of the nonlinear function $\Phi(x)$, following which the calculation results thereof are input to the check node, and the calculation results of the nonlinear function $\Phi(x)$ are integrated in the check node. Further, at the right side of FIG. 23, the calculation of the inverse function $\Phi^{-1}(x)$ is not performed in the check node, but the output data output from the check node (the integration value of the calculation results of the nonlinear function $\Phi(x)$ before being subjected to the calculation of the inverse function $\Phi^{-1}(x)$) is subjected to the calculation of the inverse function $\Phi^{-1}(x)$, and thus the message $u_j$ is obtained.

With the message calculation unit 201 in FIG. 22, the variable node calculation and check node calculation for obtaining the messages $v_i$ and $u_j$ are performed, such as illustrated at the right side of FIG. 23.

Here, with regard to the variable node at the right side of FIG. 23, neither the input data that is input to the variable node nor the output data that is output from the variable node are subjected to the calculations of the nonlinear function $\Phi(x)$ and the inverse function $\Phi^{-1}(x)$. On the other hand, with regard to the check node, the input data is subjected to the calculation of the nonlinear function $\Phi(x)$, and the output data is subjected to the calculation of the inverse function $\Phi^{-1}(x)$.

Accordingly, with the message calculation unit 201 in FIG. 22 for performing both of a variable node calculation and a check node calculation, the LUTs 300 and 310 for performing the calculation of the nonlinear function $\Phi(x)$ (for outputting the calculation results), and the LUT 314 for performing the calculation of the inverse function $\Phi^{-1}(x)$ (for outputting the calculation results) are provided.

Subsequently, at the time of a variable node calculation, the message calculation unit 201 essentially changes into a configuration that causes input data and output data as to a variable node to bypass the LUTs 300, 310, and 314 (later-described configuration in FIG. 24), and performs the calculation described regarding the variable node at the right side of FIG. 23.

Also, at the time of a check node calculation, the message calculation unit 201 changes into a configuration that causes the input data that is input to a check node to pass through the LUT 300 or 310, and also causes the output data output from a check node to pass through the LUT 314 (later-described configuration in FIG. 25), and performs the calculation described regarding the check node at the right side of FIG. 23.

Figure 24:
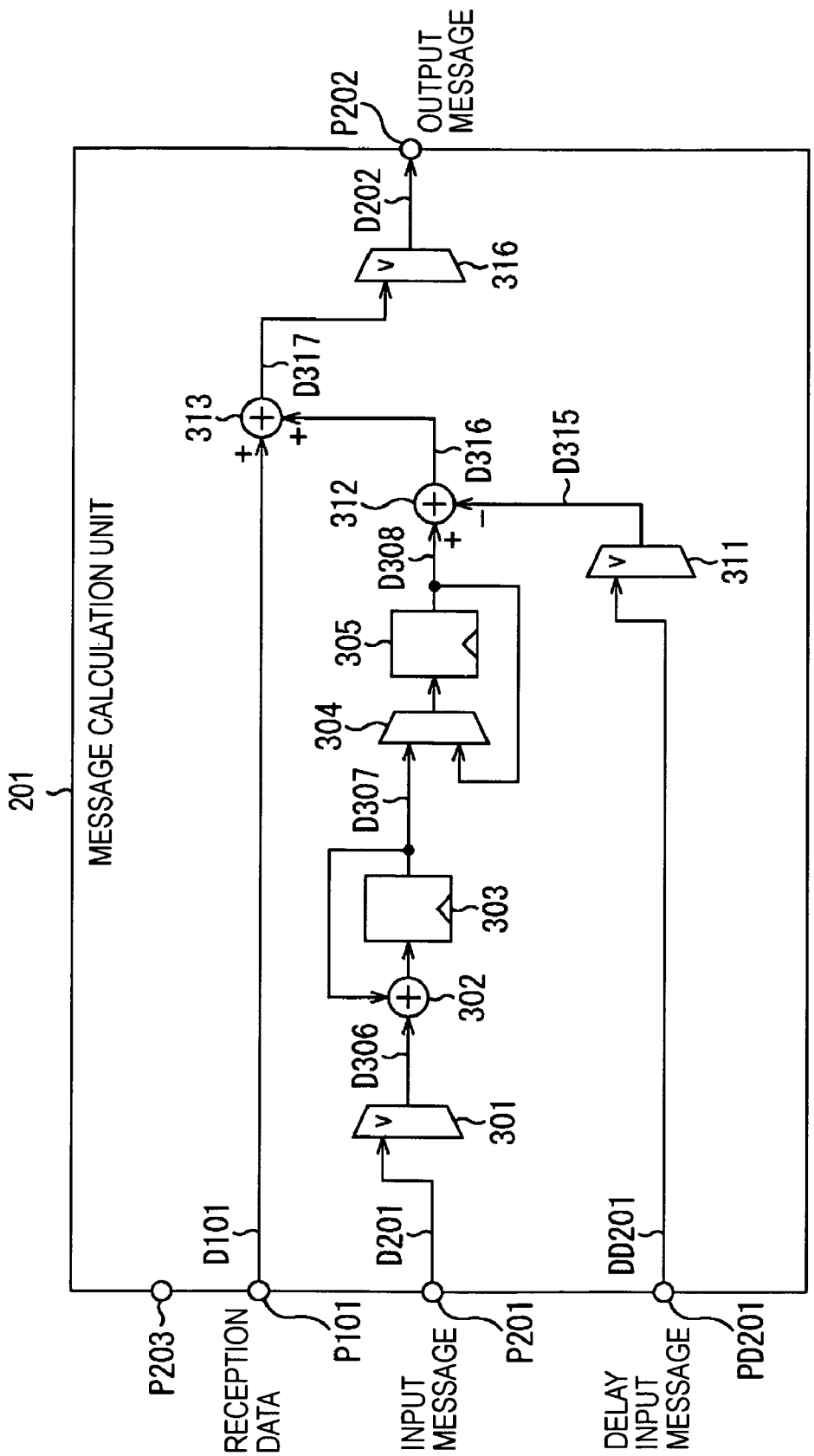
FIG. 24 is a block diagram illustrating an actual configuration of the message calculator 201 at the time of a variable node calculation.

FIG. 24 illustrates an essential configuration example of the message-control unit 201 in FIG. 22 at the time of the variable node calculation illustrated at the right side of FIG. 23.

Note that as described above, at the time of a variable node calculation, the selectors 301, 311, and 316 select the terminal v, but in FIG. 24, of the configuration illustrated in FIG. 22, the portions which do not function at the time of a variable node calculation by the selectors 301, 311, and 316 selecting the terminal v (portions not relating to a variable node calculation) are omitted in the drawing.

The message calculation unit 201 performs the variable node calculation of Expression (1) using the message input from each of the input ports P101, P201, and PD201, and outputs the message D202 obtained as a result thereof from the output port P202.

That is to say, the input port P101 is supplied with the reception data D101 read out from the reception data memory 105. Also, the input port P201 is supplied with the first-time message D201 (check node message $u_j$) read out from the message memory 104 one by one, obtained from the check node corresponding to each line of the parity check matrix.

The reception data D101 supplied to the input port P101 is supplied to the calculator 313.

Also, the message D201 (message $u_j$) supplied to the input port P201 is supplied to the terminal v of the selector 301, and is supplied to the calculator 302 from the selector 301 which selects the terminal v at the time of a variable node calculation as a message D306.

Subsequently, with the calculator 302, register 303, selector 304, and register 305, the same processing as that in the message calculation unit 191 described with FIG. 19 is performed.

Specifically, the calculator 302 integrates the message D306 by adding the message D306 (message $u_j$) from the selector 301 and the value D307 stored in the register 303, and restores the integration value obtained as a result thereof in the register 303. Note that in the event of the messages D306 from all of the branches across one row of the parity check matrix being integrated, the register 303 is reset.

In the event that the messages D306 across one row of the parity check matrix are read in one by one, and the integration value wherein the messages D306 of one row worth are integrated is stored in the register 303, i.e., in the event that the integration value ($\Sigma u_j$ of j=1 through $d_v$) wherein the messages D306 (messages $u_j$) from all of the branches across one row of the parity check matrix are integrated is stored in the register 303, the selector 304 selects the value stored in the register 303, i.e., the integration value D307 ($\Sigma u_j$ of j=1 through $d_v$) wherein the messages D306 (messages $u_j$) of all of the branches across the one row of the parity check matrix are integrated, and outputs this to the register 305 to store this.

The register 305 supplies the stored value D307 to the selector 304 and the calculator 312 as a value D308. The selector 304 selects the value D308 supplied from the register 305, and outputs this to the register 305 to restore this until immediately before the value wherein the messages D306 of one row worth are integrated is stored in the register 303. That is to say, the register 305 supplies the value previously integrated to the selector 304 and the calculator 312 until the messages D306 (messages $u_j$) from all of the branches across one row of the parity check matrix are integrated.

On the other hand, upon output of a new value D308 ($\Sigma u_j$ of j=1 through $d_v$) being started from the register 305, i.e., immediately after the integration value ($\Sigma u_j$ of j=1 through $d_v$) wherein the messages D201 of one row worth are integrated is stored in the register 303, with the message calculation unit 201, the same messages DD201 as the messages D201 (messages $u_j$), i.e., the second-time messages $u_j$ from the message memory 104 are input from the input port PD201 one by one, and the message DD201 thereof is supplied to the terminal v of the calculator 311.

At the time of a variable node calculation, the selector 311 selects the terminal v, and supplies the message (second-time message $u_j$) DD201 supplied to the terminal v thereof to the calculator 312.

The calculator 312 subtracts the message DD201 supplied from the input port PD201 via the selector 311 from the integration value D308 supplied from the register 305. That is to say, the calculator 312 subtracts the message DD201 serving as the message $u_j$ ($u_j$ of j=$d_v$) supplied from a desired branch from the integration value D308 ($\Sigma u_j$ of j=1 through $d_v$) of the messages D201 (messages $u_j$) of all of the branches across one row of the parity check matrix to obtain the subtraction value ($\Sigma u_j$ of j=1 through $d_v$−1), and supplies this to the calculator 313.

The calculator 313 adds the reception data D101 from the input port P101 and the subtraction value ($\Sigma u_j$ of j=1 through $d_v$−1) from the calculator 312, and supplies the addition value D317 (variable node message $v_i$) obtained as a result thereof to the terminal v of the selector 316.

The selector 316 selects the terminal v at the time of a variable node calculation, and the addition value D317 from the calculator 313 supplied to the terminal v thereof is output from the output port P202 as a message D202 (message $v_i$).

As described above, the message calculation unit 201 wherein the selectors 301 and 304 select the terminal v performs the variable node calculation of Expression (1), and outputs the message (variable node message) $v_i$ obtained as a result thereof from the output port P202.

Figure 25:
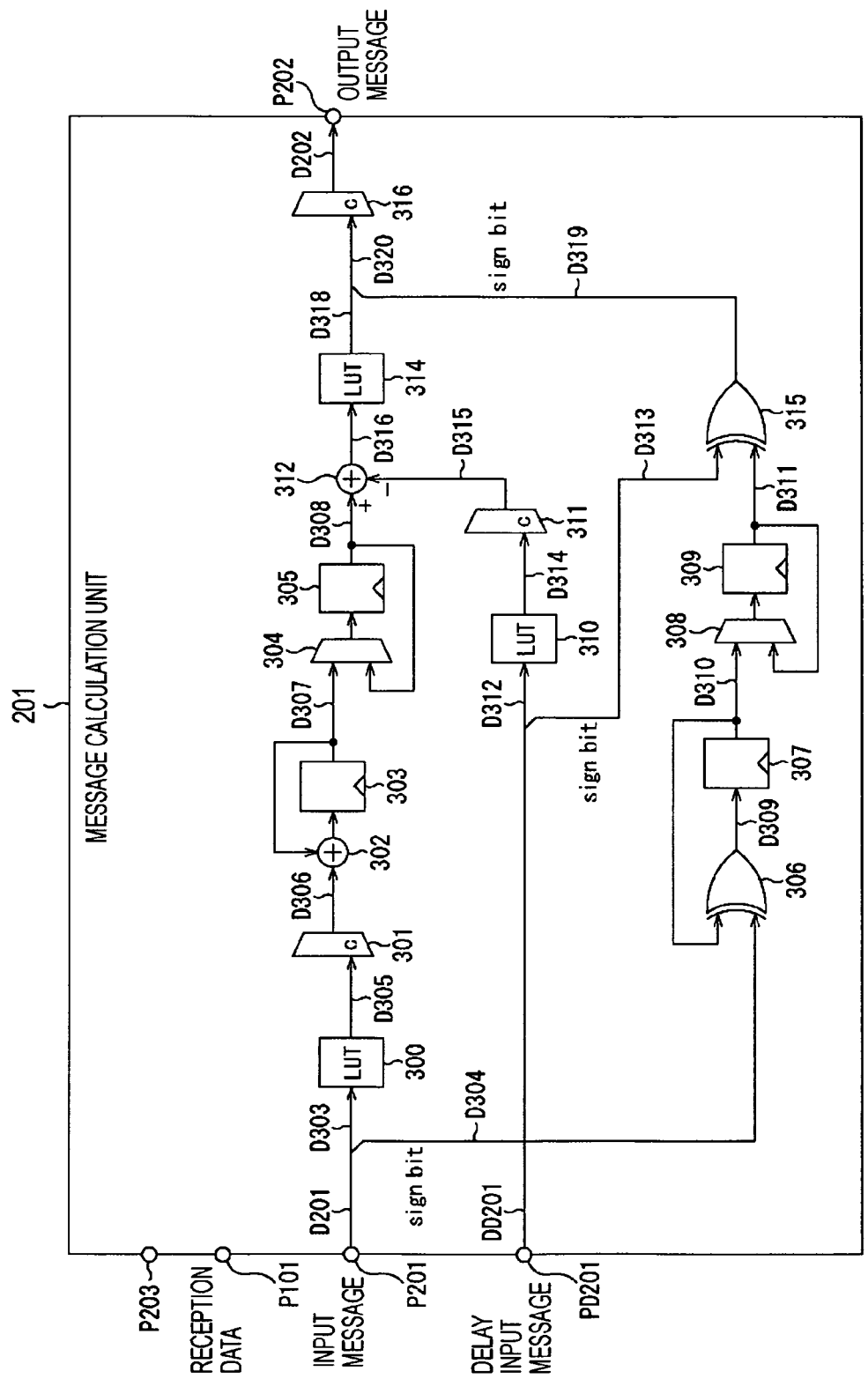
FIG. 25 is a block diagram illustrating an actual configuration of the message calculator 201 at the time of a check node calculation.

FIG. 25 illustrates an essential configuration example of the message calculation unit 201 in FIG. 22 at the time of the check node calculation illustrated at the right side of FIG. 23.

Note that as described above, at the time of a check node calculation, the selectors 301, 311, and 316 select the terminal c, but in FIG. 25, of the configuration illustrated in FIG. 22, the portions which do not function at the time of a check node calculation by the selectors 301, 311, and 316 selecting the terminal c (portions not relating to a check node calculation) are omitted in the drawing.

At the time of a check node calculation, the input port P201 is sequentially supplied with the variable node message $v_i$ read out from the message memory 104 one by one, obtained from the variable node corresponding to each row of the parity check matrix, as a message D201.

Subsequently, with the LUT 300, selector 301, calculator 302, register 303, selector 304, register 305, EXOR circuit 306, register 307, selector 308, register 309, calculator 312, LUT 314, and EXOR circuit 315, the same processing as that in the message calculation unit 191 described with FIG. 20 is performed.

Specifically, of the message D201 (message $u_j$) supplied to the input port P201, the lower bits except for the most significant bit, i.e., the absolute value D303 ($|v_i|$) of the message D201 is supplied to the LUT 300, and the most significant bit, i.e., the sign bit D304 of the message D201 is supplied to the EXOR circuit 306.

The LUT 300 reads out the calculation result D305 ($\Phi(|v_i|)$) obtained as a result of calculation of the nonlinear function $\Phi(|v_i|)$ with the absolute value D303 ($|v_i|$) as an argument, and supplies this to the terminal c of the selector 301.

The selector 301 selects the terminal c at the time of a check node calculation, and the calculation result D305 ($\Phi(|v_i|)$) from the LUT 300 supplied to the terminal c thereof is supplied to the calculator 302 as a calculation result D306 ($\Phi(|v_i|)$).

The calculator 302 integrates the calculation result D306 by adding the calculation result D306 ($\Phi(|v_i|)$) and the value D307 stored in the register 303, and restores the integration value obtained as a result thereof in the register 303. Note that in the event that the calculation results D306 ($\Phi(|v_i|)$) as to the absolute values D303 ($|v_i|$) of the messages D201 of all of the branches across one line of the parity check matrix are integrated, the register 303 is reset.

In the event that the messages D201 across one line of the parity check matrix are read in one by one, and the integration value wherein the calculation results D306 of the one line worth are integrated is stored in the register 303, the selector 304 selects the value stored in the register 303, i.e., the integration value D307 ($\Sigma\Phi(|v_i|)$ of i=1 through i=$d_c$) wherein $\Phi(|v_i|)$ obtained from the messages D201 (messages $v_i$) from all of the branches across one line of the parity check matrix is integrated, and outputs this to the register 305 to store this. The register 305 supplies the stored integration value D307 to the selector 304 and the calculator 312 as a value D308.

The selector 304 selects the value D308 supplied from the register 305, and outputs this to the register 305 to restore this until immediately before the integration value wherein the calculation results D306 of one line worth are integrated is stored in the register 303. That is to say, the register 305 supplies the integration value of $\Phi(|v_i|)$ previously integrated to the selector 304 and the calculator 312 until $\Phi(|v_i|)$ obtained from the messages D201 (messages $v_i$) from all of the branches across one line of the parity check matrix is integrated.

On the other hand, upon output of a new value D308 ($\Sigma\Phi(|v_i|)$ of i=1 through $d_c$) being started from the register 305, i.e., immediately after the integration value ($\Sigma\Phi(|v_i|)$ of i=1 through $d_c$) wherein the calculation results D306 of one row worth are integrated is stored in the register 305, with the message calculation unit 201, the same messages DD201 as the messages D201 (messages $v_i$), i.e., the second-time messages $v_i$ from the message memory 104 are input from the input port PD201 one by one, and of the message DD201 thereof, the lower bits except for the most significant bit, i.e., the absolutes value D312 ($|v_i|$) of the message DD201 is supplied to the LUT 310, and also the most significant bit, i.e., the sign bit D313 of the message DD201 is supplied to the EXOR circuit 315.

The LUT 310 is the same LUT as the LUT 300, and reads out the calculation result D314 ($\Phi(|v_i|)$) obtained as a result of calculation of the nonlinear function $\Phi(|v_i|)$ with the absolute value D312 ($|v_i|$) of the message DD201 as an argument, and supplies this to the terminal c of the selector 311.

The selector 311 selects the terminal c at the time of a check node calculation, and the calculation result D314 ($\Phi(|v_i|)$) from the LUT 310 supplied to the terminal c thereof is supplied to the calculator 312 as a calculation result D315 ($\Phi(|v_i|)$).

The calculator 312 subtracts the value D315 supplied from the selector 311 from the value D308 supplied from the register 305, and supplies the subtraction result thereof to the LUT 314 as a subtraction value D316. That is to say, the calculator 312 subtracts the value D315 of $\Phi(|v_i|)$ obtained from the message DD201 (message $v_i$) supplied from a desired branch from the integration value D308 ($\Sigma\Phi(|v_i|)$) of i=1 through i=$d_c$) of $\Phi(|v_i|)$ obtained from the messages D201 (messages $v_i$) from all of the branches across one line of the parity check matrix, and supplies the subtraction value thereof ($\Sigma\Phi(|v_i|)$ of i=1 through i=$d_c$−1) to the LUT 314 as a subtraction value D316.

The LUT 314 outputs the calculation result D318 ($\Phi^{-1}(\Sigma\Phi(|v_i|))$) as a result of calculation of the inverse function $\Phi^{-1}(\Sigma\Phi(|v_i|))$ with the subtraction value D316 ($\Sigma\Phi(|v_i|)$ of i=1 through i=$d_c$−1) from the calculator 312 as an argument.

In parallel with the above processing, the EXOR circuit 306 calculates exclusive OR between the value D310 stored in the register 307 and the sign bit (bit represents positive/negative) D304, whereby multiplication is made between the sign bits, and the multiplication result D309 is stored in the register 307. Note that in the event that the sign bits D304 of the messages D201 from all of the branches across one line of the parity check matrix are multiplied, the register 307 is reset.

In the event that the multiplication result D309 ($\Pi sign(v_i)$ of i=1 through i=$d_c$) wherein the sign bits D304 of the messages D201 from all of the branches across one line of the parity check matrix are multiplied is stored in the register 307, the selector 308 selects the value stored in the register 307, i.e., the value D310 ($\Pi sign(v_i)$ of i=1 through i=$d_c$) wherein the sign bits D304 of the messages D201 from all of the branches across one line of the parity check matrix are multiplied, and outputs this to the register 309 to store this. The register 309 supplies the stored value D311 to the selector 308 and the EXOR circuit 315.

The selector 308 selects the value D311 supplied from the register 309, and outputs this to the register 309 to restore this until immediately before the multiplication result D309 ($\Pi sign(v_i)$ of i=1 through i=$d_c$) wherein the sign bits D304 of the messages D201 from all of the branches across one line of the parity check matrix are multiplied is restored in the register 307. That is to say, the register 309 supplies the value previously stored to the selector 308 and the EXOR circuit 315 until the sign bits D304 of the messages D201 (messages $v_i$) from all of the branches across one line of the parity check matrix are multiplied.

On the other hand, when a new value D311 ($\Pi sign(v_i)$ of i=1 through i=$d_c$) is supplied to the EXOR circuit 315 from the register 309, i.e., when the value D310 ($\Pi sign(v_i)$ of i=1 through i=$d_c$) wherein the sign bits D304 of the messages D201 from all of the branches across one line are multiplied is stored in the register 307, as described above, the integration value ($\Sigma\Phi(|v_i|)$ of i=1 through i=$d_c$) wherein the calculation results D306 of one line worth are integrated is stored in the register 305.

Upon the integration value ($\Sigma\Phi(|v_i|)$ of i=1 through $d_c$) wherein the calculation results D306 of one line worth are integrated is stored in the register 305, as described above, with the message calculation unit 201, the same messages DD201 as the messages D201 (messages $v_i$), i.e., the second-time messages $v_i$ from the message memory 104 are input from the input port PD201 one by one, and of the message DD201 thereof, the lower bits except for the most significant bit, i.e., the absolutes value ($|v_i|$) of the message DD201 is supplied to the LUT 310, and also the most significant bit, i.e., the sign bit D313 of the message DD201 is supplied to the EXOR circuit 315.

The EXOR circuit 315 calculates exclusive OR between the value D311 supplied from the register 309 and the sign bit of the message DD201 from the input port PD201, whereby the value D311 is divided by the sign bit of the message DD201, and the division result thereof is output as a division value D319. That is to say, the EXOR circuit 315 divides the multiplication value ($\Pi sign(v_i)$ of i=1 through i=$d_c$) of the sign bits D304 of the messages D201 from all of the branches across one line of the parity check matrix by the sign bit D304 ($sign(v_i)$ of i=$d_c$) of the message DD201 serving as the message $v_i$ from a desired branch, and outputs the division value ($\Pi sign(v_i)$ of i=1 to i=$d_c$−1) thereof as a division value D319.

Subsequently, with the message calculation unit 201, a bit string D320 (message $u_j$) wherein the calculation result D318 output from the LUT 314 is taken as lower bits, and also the division value D319 output from the EXOR circuit 315 is taken as the most significant bit (sign bit) is supplied to the terminal c of the selector 316.

The selector 316 selects the terminal c at the time of a check node calculation, and the bit string D320 (message $u_j$) supplied to the terminal c thereof is output from the output port P202 as a message D202.

As described above, the message calculation unit 201 wherein the selectors 301, 311, and 304 select the terminal c performs the check node calculation of Expression (7), and outputs the message (check node message) $u_j$ obtained as a result thereof from the output port P202.

Note that though not shown in the drawing, with the decoding device in FIG. 21, the calculation of Expression (5) is performed instead of the variable node calculation of Expression (1) at the final stage of decoding, and the calculation result thereof is output as the final decoding result.

Also, with the decoding device in FIG. 21, the control unit 202 performs the same read/write control as that in the control unit 174 of the decoding device in FIG. 12 as read/write control of a message (data) as to the message memory 104, such as described with the flowchart in FIG. 15.

Also, the read/write timing of a message as to the message memory 104 of the decoding device in FIG. 21 is also the same as that in the case of FIG. 16 described regarding the decoding device in FIG. 12, and it is also necessary for the decoding device in FIG. 21 to perform somewhat high-speed operations, but there is no need to provide delaying memory, and the device scale can be reduced accordingly. Further, with the message calculation unit 201 of the decoding device in FIG. 21, a part of a circuit for performing a variable node calculation and a circuit for performing a check node calculation (calculator 302, register 303, selector 304, register 305, and calculator 312) are shared, and accordingly, the scale can be reduced as much as the extent of sharing, as compared with the decoding device in FIG. 12.

Figure 26:
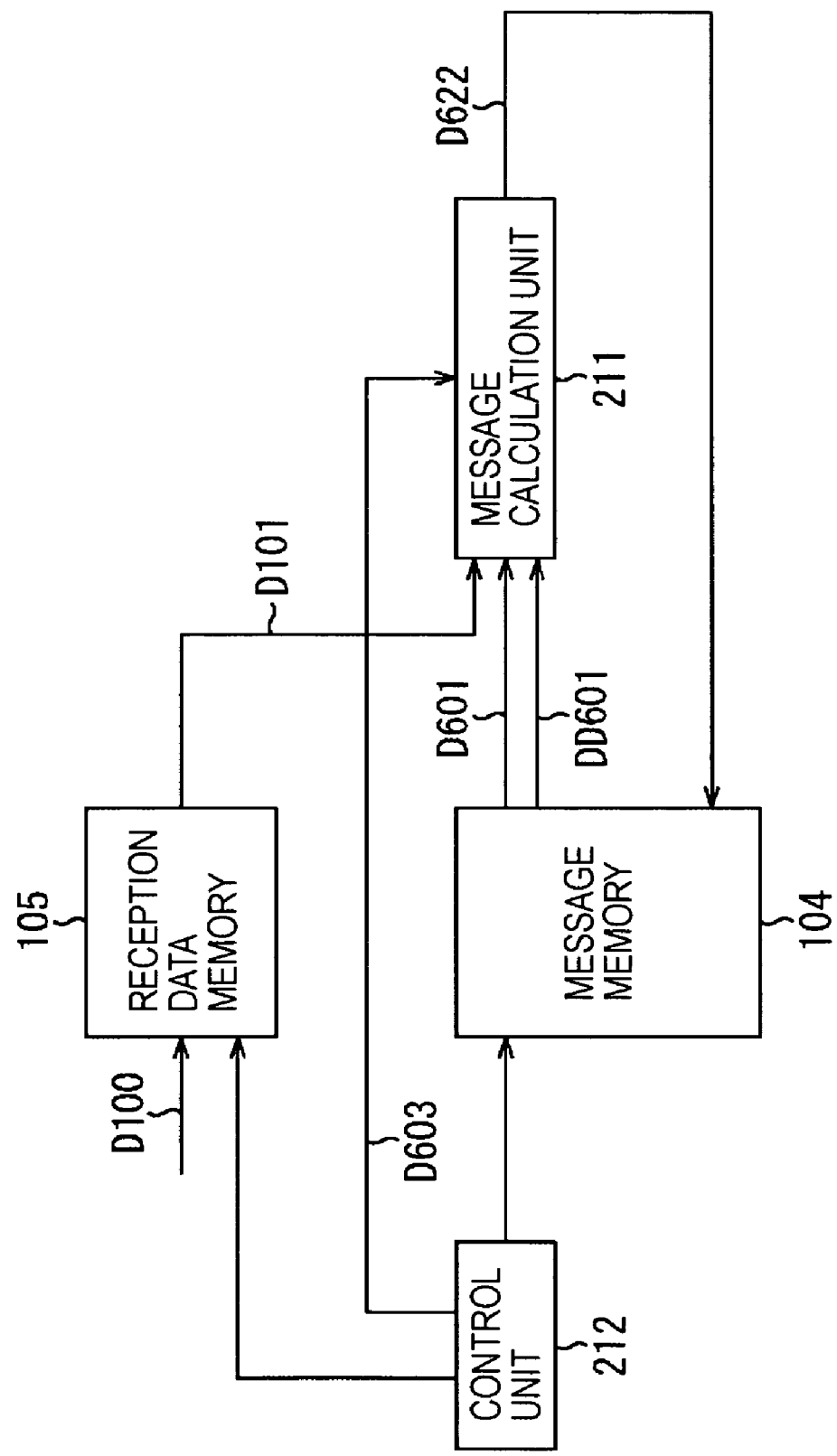
FIG. 26 is a block diagram illustrating a configuration example of a third embodiment of a decoding device to which the present invention is applied.

FIG. 26 is a block diagram illustrating a configuration example of a third embodiment of a decoding device to which the present invention is applied. Note that in the drawing, the portions corresponding to those in the decoding device in FIG. 21 are appended with the same reference numerals, and description thereof will be omitted below as appropriate. That is to say, the decoding device in FIG. 26 is configured in the same way as the decoding device in FIG. 21 except that a message calculation unit 211 is provided instead of the message calculation unit 201, and also a control unit 212 is provided instead of the control unit 202.

With the decoding device in FIG. 26, the message calculation unit 211 is configured so as to share a part of a circuit for performing a variable node calculation, and a circuit for performing a check node calculation, further without proving delaying memory.

With the decoding device in FIG. 26, the messages stored in the message memory 104 are read out one by one, and are supplied to the message calculation unit 211. The message calculation unit 211 performs a calculation using a message obtained from the message memory 104, and the message obtained by the calculation thereof is stored in the message memory 104. The decoding device in FIG. 26 performs full-serial repeat decoding by repeatedly performing the above processing.

That is to say, reception data (LDPC code) D100 that is a log likelihood ratio representing the identity of code 0 (or 1) that can be obtained by receiving an LDPC code transmitted is supplied to the reception data memory 105, and the reception data memory 105 stores the reception data D100 thereof.

At the time of a variable node calculation, the reception data memory 105 reads out the stored reception data in accordance with the control signal supplied from the control unit 212, and supplies this to the message calculation unit 211 as reception data D101.

Also, at the time of a variable node calculation, the message memory 104 reads out the stored same message twice in accordance with the control signal supplied from the control unit 212, supplies the message read out at the first time to the message calculation unit 211 as a message D601, and supplies the message read out at the second time to the message calculation unit 211 as a message DD601. Further, the control unit 212 supplies a control signal D603 for instructing a variable node calculation to the message calculation unit 211. The message calculation unit 211 performs a variable node calculation using the messages D601 and DD601 supplied from the message memory 104, and the reception data D101 supplied from the reception data memory 105 in accordance with the control signal D603 supplied from the control unit 212, and supplies the message obtained as a result of the variable node calculation thereof to the message memory 104 as a message D622.

Subsequently, the message memory 104 stores the message D622 supplied from the message calculation unit 211 in accordance with the control signal supplied from the control unit 212.

On the other hand, at the time of a check node calculation, the message memory 104 reads out the stored same message twice in accordance with the control signal supplied from the control unit 212, supplies the message read out at the first time to the message calculation unit 211 as a message D601, and supplies the message read out at the second time to the message calculation unit 211 as a message DD601. Further, the control unit 212 supplies a control signal D603 for instructing a check node calculation to the message calculation unit 211.

The message calculation unit 211 performs a check node calculation using the messages D601 and DD601 supplied from the message memory 104 in accordance with the control signal D603 from the control unit 212, and supplies the message obtained by the check node calculation thereof to the message memory 104 as a message D622.

Subsequently, the message memory 104 stores the message D622 supplied from the message calculation unit 211 in accordance with the control signal supplied from the control unit 212.

Now, description will be made regarding a calculation performed by the message calculation unit 211 in FIG. 26.

Now, if we say that a message $u'_j$ represented with Expression $u'_j = \Phi(|u_j|) \times \text{sign}(u_j)$ is introduced as a message (data) that is output from the j'th branch of the branches connected to a check node, Expression (1) and Expression (7) can be rewritten with Expression (9) and Expression (10) respectively.

$$v_i = u_{0i} + \sum_{j=1}^{d_v-1} (\phi^{-1}(|u'_j|) \times \text{sign}(u'_j)) \quad (9)$$

$$u'_j = \sum_{i=1}^{d_c-1} \phi(|v_i|) \times \prod_{i=1}^{d_c-1} \text{sign}(v_i) \quad (10)$$

Now, when rewriting Expression $u'_j = \Phi(|u_j|) \times \text{sign}(u_j)$ regarding the message uj, this expression becomes Expression $u_j = \Phi^{-1}(|u'_j|) \times \text{sign}(u'_j)$. This Expression $u_j = \Phi^{-1}(|u'_j|) \times \text{sign}(u'_j)$ is substituted for the variable calculation Expression (1), whereby Expression (9) that is a new variable node calculation expression can be obtained.

Also, the check node calculation Expression (7) is substituted with Expression $u'_j = \Phi(|u_j|) \times \text{sign}(u_j)$, whereby Expression (10) that is a new check node calculation expression can be obtained.

With the variable node calculation of Expression (9), the calculation of the inverse function $\Phi^{-1}(|u'_j|)$ is performed with the absolute value $|u'_j|$ of input data (message) $u'_j$ as an argument, and with the check node calculation of Expression (10), the calculation of the nonlinear function $\Phi(|v_i|)$ is performed with the absolute value $|v_i|$ of input data $v_i$ as an argument. Here, the nonlinear function $\Phi(x)$ and the inverse function $\Phi^{-1}(x)$ thereof are equal in x>0. Therefore, with both of Expression (9) and Expression (10), the calculation of the function $\Phi(x)$ is performed with the absolute value $|x|$ of input data x as an argument.

Subsequently, in Expression (9), a value $(\Phi^{-1}(|u'_j|) \times \text{sign}(u'_j))$, which takes the sign $(\text{sign}(u'_j))$ of input data u'j regarding the calculation result of the function $\Phi(x)$ (calculation result of $\Phi^{-1}(|u'_j|)$) into consideration, is integrated, and further reception data $u_{0i}$ is added thereto, whereby the message vi can be obtained.

Also, in Expression (10), the calculation result of the function $\Phi(x)$ (calculation result of $\Phi(|u_j|)$) is integrated, and separately from this, the multiplier AND ($\Pi \text{sign}(v_i)$) of the sign bit of the input data $v_i$ is obtained, the integration value of the calculation result of the function $\Phi(x)$ and the multiplier AND of the sign bit are multiplied, whereby the message $u'_j$ can be obtained.

With the message calculation unit 211 in FIG. 26, the variable node calculation of Expression (9), and the check node calculation of Expression (10) are performed.

Figure 27:
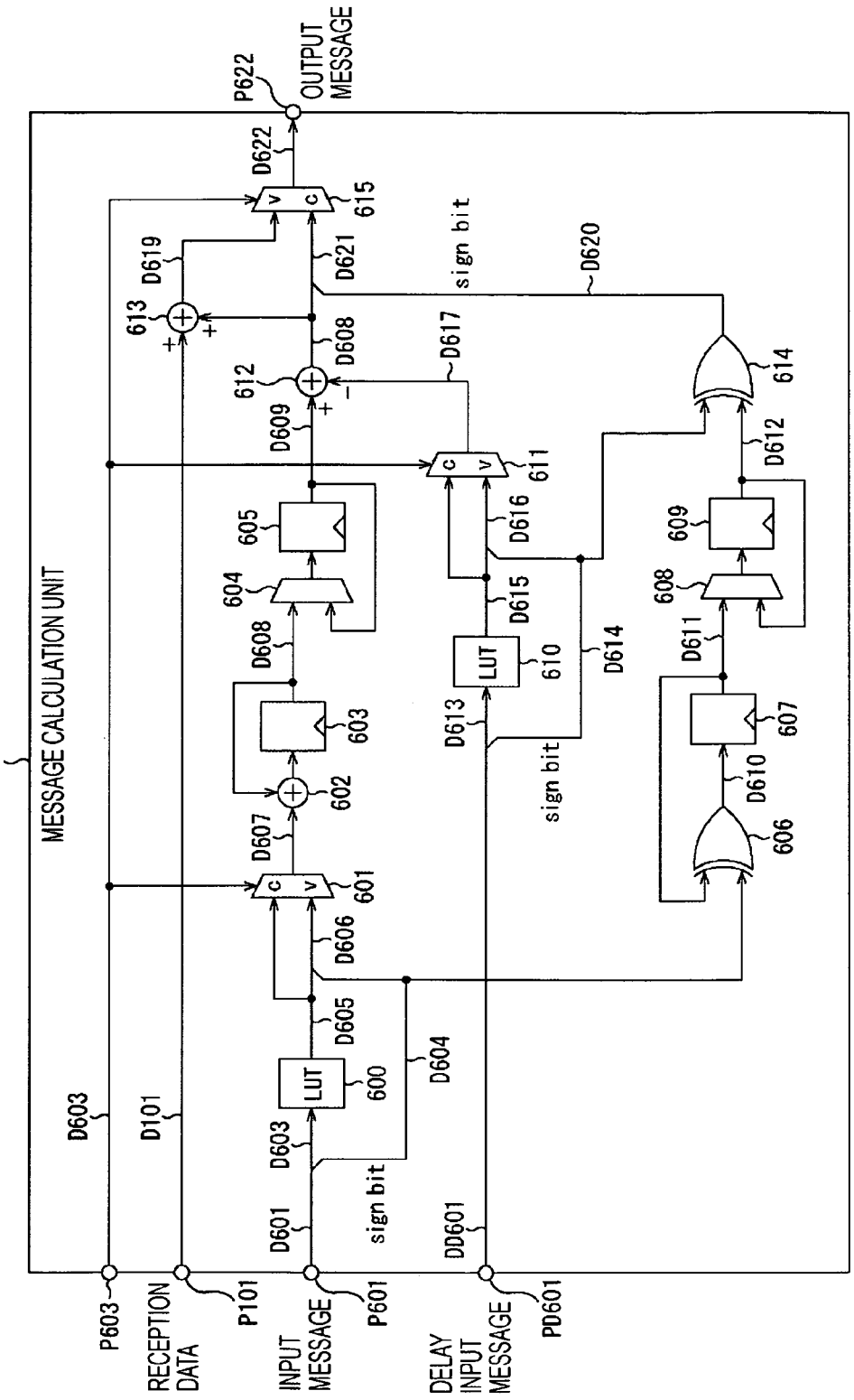
FIG. 27 is a block diagram illustrating a configuration example of a message calculator 211.

FIG. 27 illustrates a configuration example of the message calculation unit 211 in FIG. 26.

The message calculation unit 211 is configured without providing delaying memory in the same way as the message calculation unit 201 in FIG. 22. Also, the message calculation unit 211 is provided with input ports P101, P601, PD601, and P603, and an output port P622.

The input port P101 is supplied (input) with the reception data D101 read out from the reception data memory 105. The input port P601 is supplied (input) with a message (first-time message) D601 that is read out at the first time of the same messages D601 and DD601 read out twice from the message memory 104, and the input port PD601 is supplied with a message (second-time message) DD601 that is read out at the second time. Also, the input port P603 is supplied with a control signal D603 from the control unit 212 (FIG. 26).

The message calculation unit 211 performs the variable node calculation of Expression (9) or the check node calculation of Expression (10) using the first-time message D601 that is input from the input port P601, the second-time message DD601 that is input from the input port PD601, and further if necessary, a message (reception data) that is input from the input port P101, in accordance with the control signal D603 that is input from the input port P603, and outputs a message D622 obtained as a result thereof from the output port P622.

Now, description will be made regarding a variable node calculation and a check node calculation performed by the message calculation unit 211 in FIG. 27 with reference to FIG. 28.

Figure 28:
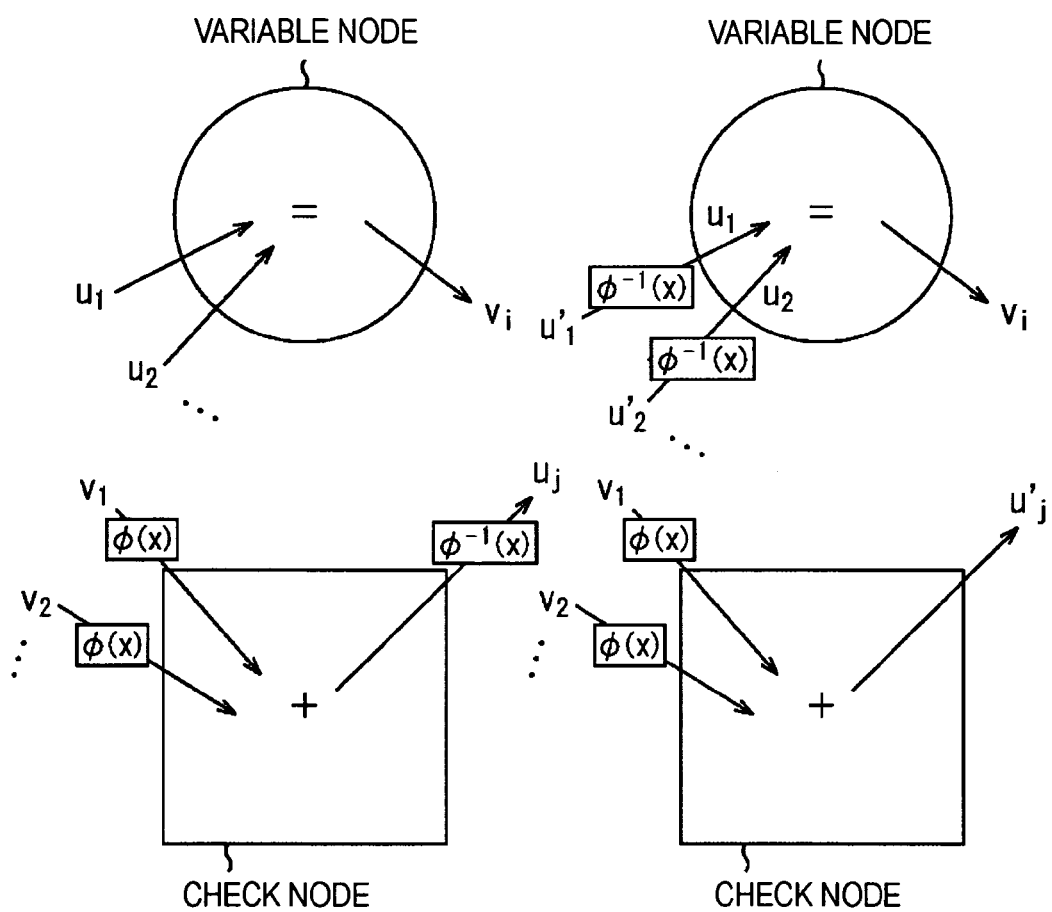
FIG. 28 is a diagram describing a variable node calculation and a check node calculation performed by the message calculator 211.

The left side of FIG. 28 schematically illustrates a variable node for performing the variable node calculation of Expression (1), and a check node for performing the check node calculation of Expression (7), which is the same diagram as that at the right side of FIG. 23.

At the left side of FIG. 28, as described with the right side of FIG. 23, input data that is input to the check node is subjected to the calculation of the nonlinear function $\Phi(x)$, following which the calculation result thereof is input to the check node, and the calculation result of the nonlinear function $\Phi(x)$ is integrated at the check node. Further, the output data output from the check node (the integration value of the calculation result of the nonlinear function $\Phi(x)$ before being subjected to the calculation of the inverse function $\Phi^{-1}(x)$) is subjected to the calculation of the inverse $\Phi^{-1}(x)$, whereby the message $u_j$ is obtained.

This message $u_j$ is input to the variable node as input data, and is employed for a variable node calculation.

Therefore, instead of the output data x output from the check node being subjected to the calculation of the inverse function $\Phi^{-1}(x)$ as illustrated at the left side of FIG. 28, even if the input data x that is input to the variable node is subjected to the calculation of the inverse function $\Phi^{-1}(x)$ as illustrated at the right side of FIG. 28, a variable node calculation and a check node calculation can be performed.

Specifically, at the right side of FIG. 28, as described with Expression (9), the input data that is input to the variable node is subjected to the calculation of the inverse function $\Phi^{-1}(x)$, and the calculation result of the inverse function $\Phi^{-1}(x)$ thereof is integrated at the variable node, whereby the message $v_i$ is obtained. Also, at the right side of FIG. 28, as described with Expression (10), input data that is input to the check node is subjected to the calculation of the nonlinear function $\Phi(x)$, and the calculation result of the nonlinear function $\Phi(x)$ thereof is integrated at the check node. Further, at the right side of FIG. 28, the integration value obtained by integrating the calculation result of the nonlinear function $\Phi(x)$ at the check node is output as output data $u'_j$ as it is (without being subjected to the calculation of the inverse function $\Phi^{-1}(x)$).

With the message calculation unit 211 in FIG. 27, the variable node calculation of Expression (9) and check node calculation of Expression (10) for obtaining the messages $v_i$ and $u_j$ are performed, such as illustrated at the right side of FIG. 28.

Thus, the message calculation unit 211 performs both of the variable node calculation of Expression (9) and the check node calculation of Expression (10) for obtaining the messages $v_i$ and $u'_j$, so the message calculation unit 211 (FIG. 27) is provided with an LUT 600 (and an LUT 610) for outputting the calculation result of the nonlinear function $\Phi(x)$, which can obtain the same calculation result as the inverse function $\Phi^{-1}(x)$, as to the input data x that is input to the check node, and also outputting the calculation result of the inverse function $\Phi^{-1}(x)$ as to the input data x that is input to the variable node.

Subsequently, the message calculation unit 211 changes its essential configuration in accordance with the control signal D603 supplied to the input port P603, and selectively performs the variable node calculation of Expression (9) and the check node calculation of Expression (10).

That is to say, the message calculation unit 211 (FIG. 27) includes selectors 601, 611, and 615, and the control signal D603 supplied to the input port P603 is supplied to the selectors 601, 611, and 615.

The selectors 601, 611, and 615 include a terminal v and a terminal c, and select a value that is supplied to one of the terminal v and terminal c in accordance with the control signal D603, and output this to the subsequent stage. That is to say, in the event that the control signal D603 is a control signal for instructing a variable node calculation, the selectors 601, 611, and 615 select the value that is supplied to the terminal v to output this to the subsequent stage, and in the event that the control signal D603 is a control signal for instructing a check node calculation, the selectors 601, 611, and 615 select the value that is supplied to the terminal c to output this to the subsequent stage.

As a result thereof, with the message calculation unit 211 in FIG. 27, when the control signal D603 instructs a variable node calculation, a variable node calculation is performed, and when the controls signal D603 instructs a check node calculation, a check node calculation is performed.

Figure 29:
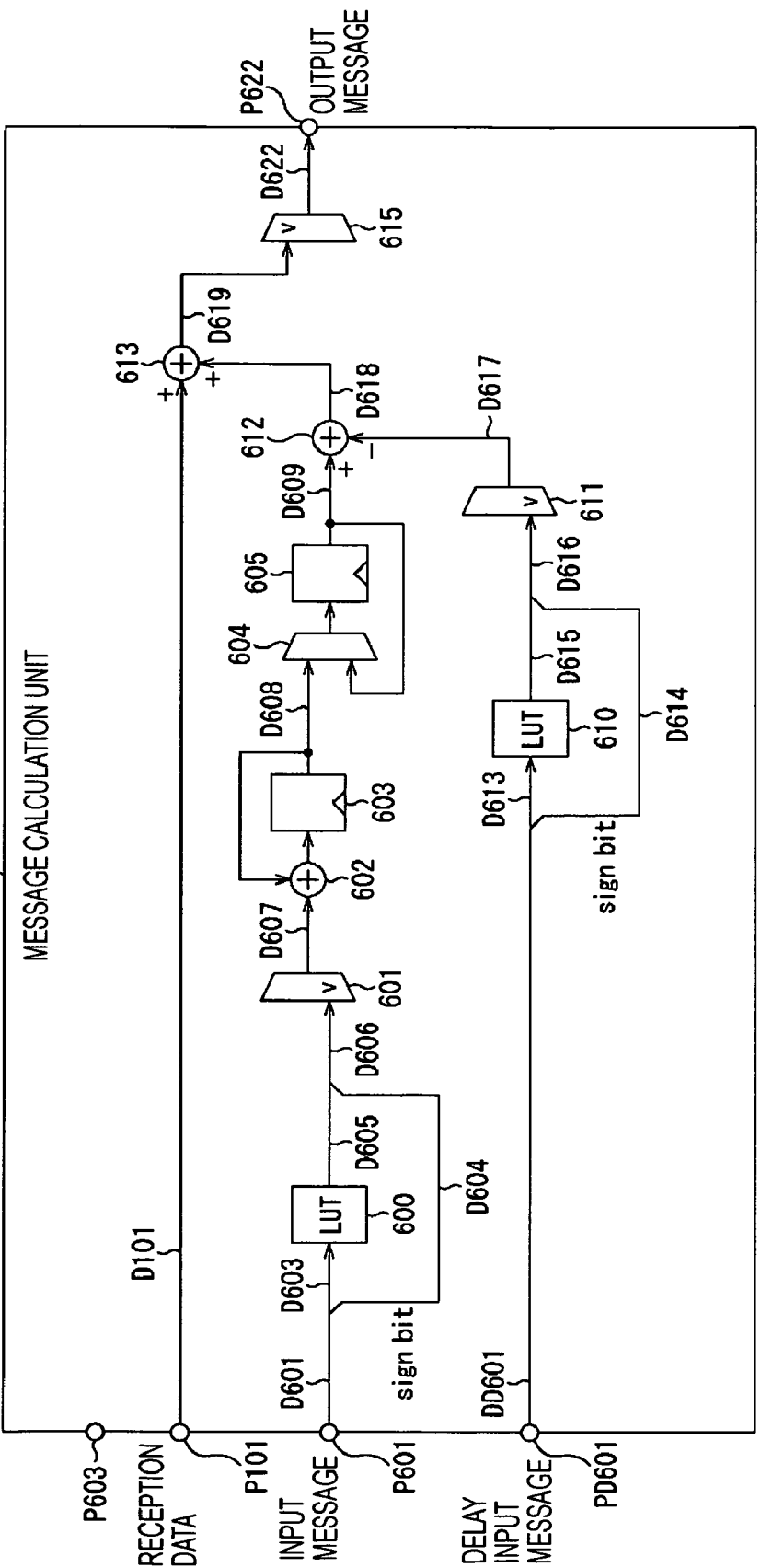
FIG. 29 is a block diagram illustrating an actual configuration of the message calculator 211 at the time of a variable node calculation.

FIG. 29 illustrates an essential configuration example of the message control unit 211 in FIG. 27 at the time of the variable node calculation illustrated at the right side of FIG. 28.

Note that as described above, at the time of a variable node calculation, the selectors 601, 611, and 615 select the terminal v, but in FIG. 29, of the configuration illustrated in FIG. 27, the portions which do not function at the time of a variable node calculation by the selectors 601, 611, and 615 selecting the terminal v (portions not relating to a variable node calculation) are omitted in the drawing.

The message calculation unit 211 performs the variable node calculation of Expression (9) using the message that is input from each of the input ports P101, P601, and PD601, and outputs the message D622 obtained as a result thereof from the output port P622.

That is to say, the input port P101 is supplied with the reception data D101 read out from the reception data memory 105. Also, the input port P601 is supplied with the first-time message D601 (message $u'_j$) read out from the message memory 104 one by one, obtained from the check node corresponding to each line of the parity check matrix.

The reception data D101 supplied to the input port P101 is supplied to the calculator 613.

Also, of the message D601 (message u'$_j$) supplied to the input port P601, the lower bits except for the most significant bit, i.e., the absolute value D603 (|u'$_j$|) of the message D601 is supplied to the LUT 600.

The LUT 600 reads out and outputs the calculation result D605 ($\Phi^{-1}$(|u'$_j$|)) as a result of the calculation of the inverse function $\Phi$(|u'$_j$|) with the absolute value D603 (|u'$_j$|) as an argument. The calculation result D605 ($\Phi^{-1}$(|u'$_j$|)) which the LUT 600 outputs is converted into a message D606 (check node message u$_j$) by the most significant bit thereof being added with the most significant bit of the message D601 (message u'$_j$) supplied to the input port P601, i.e., the sign bit D604 (sign(u'$_j$)) of the message D601, and is supplied to the terminal v of the selector 601.

The selector 601 selects the terminal v at the time of a variable node calculation as described above, and the message D606 (check node message u$_j$) supplied to the terminal v thereof is supplied to the calculator 602 as a message D607.

The calculator 602 integrates the message D607 by adding the message D607 (message u$_j$) from the selector 601 and the value D608 stored in the register 603, and restores the integration value obtained as a result thereof in the register 603. Note that in the event of the messages D607 (obtained from the message u'$_j$) from all of the branches across one row of the parity check matrix being integrated, the register 603 is reset.

In the event that the messages D607 across one row of the parity check matrix are read in one by one, and the integration value wherein the messages D607 of the one row worth are integrated is stored in the register 603, i.e., in the event that the integration value ($\Sigma u_j$ of j=1 through d$_v$) wherein the messages D607 (message u$_j$) from all of the branches across one row of the parity check matrix are integrated is stored in the register 603, the selector 604 selects the value stored in the register 603, i.e., the integration value D608 ($\Sigma u_j$ of j=1 through d$_v$) wherein the messages D607 (messages u$_j$) of all of the branches across the one row of the parity check matrix are integrated, and outputs this to the register 605 to store this.

The register 605 supplies the stored value D608 to the selector 604 and the calculator 612 as a value D609. The selector 604 selects the value D609 supplied from the register 605, and outputs this to the register 605 to restore this until immediately before the value wherein the messages D607 of one row worth are integrated is stored in the register 603. That is to say, the register 605 supplies the value previously integrated to the selector 604 and the calculator 612 until the messages D607 (message u$_j$) from all of the branches across one row of the parity check matrix are integrated.

On the other hand, upon output of a new value D609 ($\Sigma u_j$ of j=1 through d$_v$) being started from the register 605, i.e., immediately after the integration value ($\Sigma u_j$ of j=1 through d$_v$) wherein the messages D607 of one row worth are integrated is stored in the register 603, with the message calculation unit 211, the same messages DD601 as the messages D601 (messages u'$_j$), i.e., the second-time messages u'$_j$ from the message memory 104 are input from the input port PD601 one by one, and of the message DD601 (message u'$_j$) thereof, the lower bits except for the most significant bit, i.e., the absolute value D613 (|u'$_j$|) of the message DD601 is supplied to the LUT 610.

The LUT 610 reads out and outputs the calculation result D615 ($\Phi^{-1}$|u'$_j$|) as a result of the calculation of the inverse function $\Phi$(|u'$_j$|) with the absolute value D613 (|u'$_j$|) as an argument. The calculation result D605 ($\Phi^{-1}$(|u'$_j$|)) which the LUT 600 outputs is converted into a message D616 (check node message u'$_j$) by the most significant bit thereof being added with the most significant bit of the message DD601 (message u'$_j$) supplied to the input port PD601, i.e., the sign bit D304 (sign(u'$_j$)) of the message DD601, and is supplied to the terminal v of the selector 611.

The selector 611 selects the terminal v at the time of a variable node calculation as described above, and the message D616 (check node message u$_j$) supplied to the terminal v thereof is supplied to the calculator 612 as a message D617.

The calculator 612 subtracts the message D617 (message of j=d$_v$) obtained from the selector 611 from the integration value D609 ($\Sigma u_j$ of j=1 through d$_v$) supplied from the register 605. That is to say, the calculator 612 subtracts the message D617 that is the message u$_j$ (u$_j$ of j=d$_v$) supplied from a desired branch from the integration value D609 ($\Sigma u_j$ of j=1 through d$_v$) of the messages D607 (messages u$_j$) of all of the branches across one row of the parity check matrix to obtain the subtraction value D618 ($\Sigma u_j$ of j=1 through d$_v$−1), and supplies this to the calculator 613.

The calculator 613 adds the reception data D101 from the input port P101 and the subtraction value D618 ($\Sigma u_j$ of j=1 through d$_v$−1) from the calculator 612 to obtain the message D619 (variable node message v$_i$), and supplies this to the terminal v of the selector 615.

The selector 615 selects the terminal v at the time of a variable node calculation, and outputs the message D619 (variable node message v$_i$) from the calculator 613 that is supplied to the terminal v thereof from the output port P622 as a message D622.

As described above, the message calculation unit 211 wherein the selectors 601, 611, and 615 select the terminal v performs the variable node calculation of Expression (9), and outputs the message (variable node message) v$_i$ obtained as a result thereof from the output port P622.

Figure 30:
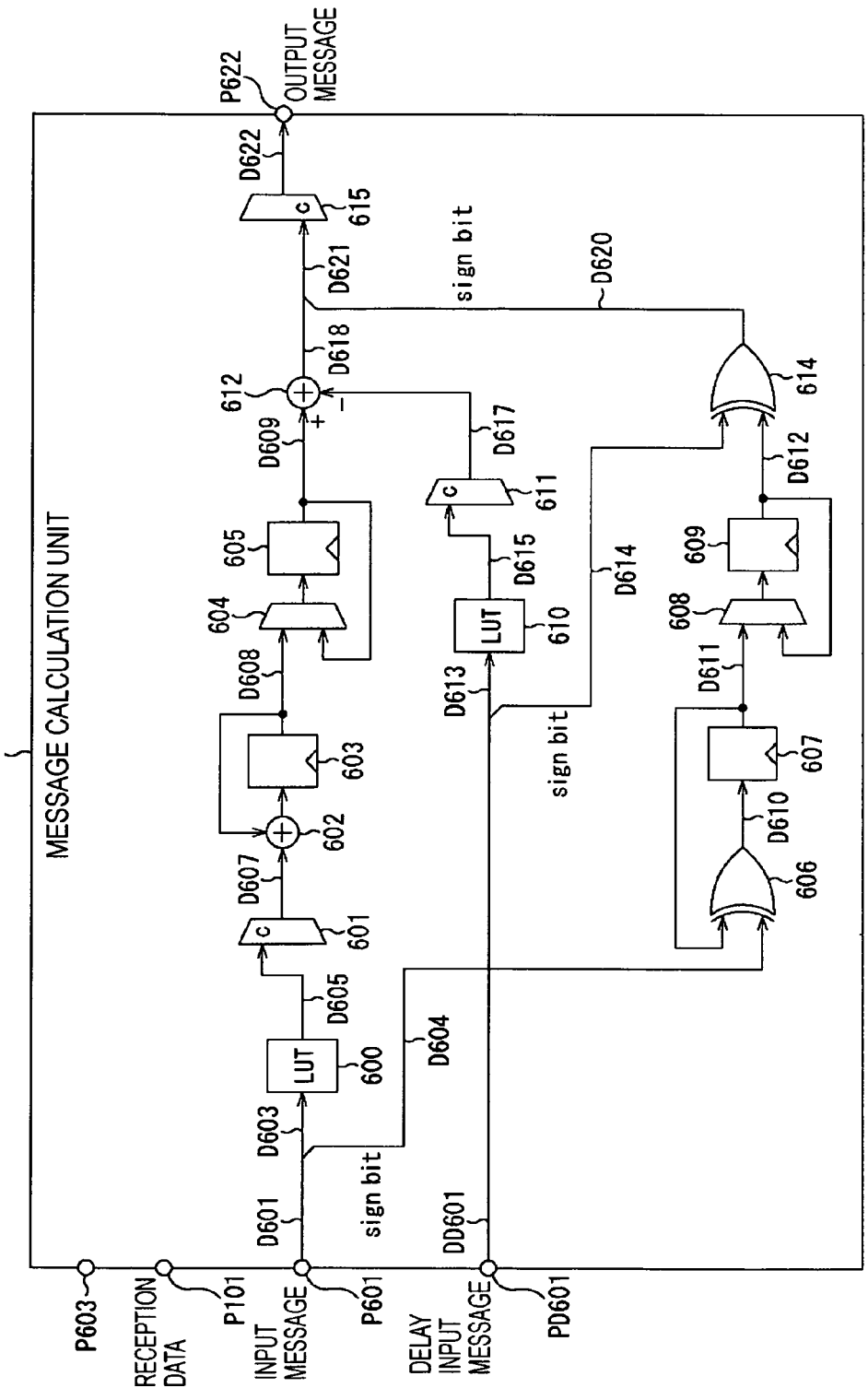
FIG. 30 is a block diagram illustrating an actual configuration of the message calculator 211 at the time of a check node calculation.

FIG. 30 illustrates an essential configuration example of the message control unit 211 in FIG. 27 at the time of the check node calculation illustrated at the right side of FIG. 28.

Note that as described above, at the time of a check node calculation, the selectors 601, 611, and 615 select the terminal c, but in FIG. 30, of the configuration illustrated in FIG. 27, the portions which do not function at the time of a check node calculation by the selectors 601, 611, and 615 selecting the terminal c (portions not relating to a check node calculation) are omitted in the drawing.

At the time of a check node calculation, the input port P601 is sequentially supplied with the variable node message v$_i$ read out from the message memory 104 one by one, obtained from the variable node corresponding to each row of the parity check matrix, as a message D601.

Of the message D601 (message v$_i$) supplied to the input port P601, the lower bits except for the most significant bit, i.e., the absolute value D603 (|v$_i$|) of the message D601 is supplied to the LUT 600, and the most significant bit, i.e., the sign bit D604 of the message D601 is supplied to the EXOR circuit 606.

The LUT 600 reads out the calculation result D605 ($\Phi$(|v$_i$|)) obtained as a result of calculation of the nonlinear function $\Phi$(|v$_i$|) with the absolute value D603 (|v$_i$|) as an argument, and supplies this to the terminal c of the selector 601.

The selector 601 selects the terminal c at the time of a check node calculation, and the calculation result D605 ($\Phi$(|v$_i$|)) from the LUT 600 supplied to the terminal c thereof is supplied to the calculator 602 as a calculation result D607 ($\Phi$(|v$_i$|)).

The calculator 602 integrates the calculation result D607 by adding the calculation result D607 ($\Phi$(|v$_i$|)) and the value D608 stored in the register 603, and restores the integration value obtained as a result thereof in the register 603. Note that in the event that the calculation results D607 ($\Phi$(|v$_i$|)) as to the absolute values D603 ($|v_i|$) of the messages D601 of all of the branches across one line of the parity check matrix are integrated, the register 603 is reset.

In the event that the messages D601 across one line of the parity check matrix are read in one by one, and the integration value wherein the calculation results D607 of one line worth are integrated is stored in the register 603, the selector 604 selects the value stored in the register 603, i.e., the integration value D608 ($\Sigma\Phi(|v_i|)$ of i=1 through i=$d_c$) wherein $\Phi(|v_i|)$ obtained from the messages D601 (messages $v_i$) from all of the branches across one line of the parity check matrix is integrated, and outputs this to the register 605 to store this. The register 605 supplies the stored integration value D608 to the selector 604 and the calculator 612 as a value D609.

The selector 604 selects the value D609 supplied from the register 605, and outputs this to the register 605 to restore this until immediately before the integration value wherein the calculation results D607 of one line worth are integrated is stored in the register 603. That is to say, the register 605 supplies the integration value of $\Phi(|v_i|)$ previously integrated to the selector 604 and the calculator 612 until $\Phi(|v_i|)$ obtained from the messages D601 (messages $v_i$) from all of the branches across one line of the parity check matrix is integrated.

On the other hand, upon output of a new value D609 ($\Sigma\Phi(|v_i|)$ of i=1 through $d_c$) being started from the register 605, i.e., immediately after the integration value ($\Sigma\Phi(|v_i|)$ of i=1 through $d_c$) wherein the calculation results D607 of one line worth are integrated is stored in the register 605, with the message calculation unit 211, the same messages DD601 as the messages D601 (messages $v_i$), i.e., the second-time messages $v_i$ from the message memory 104 (the same messages as the first-time message $v_i$) are input from the input port PD601 one by one, and of the message DD601 thereof, the lower bits except for the most significant bit, i.e., the absolutes value D613 ($|v_i|$) of the message DD601 is supplied to the LUT 610, and also the most significant bit, i.e., the sign bit D614 of the message DD601 is supplied to the EXOR circuit 614.

The LUT 610 reads out the calculation result D615 ($\Phi(|v_i|)$) obtained as a result of calculation of the nonlinear function $\Phi(|v_i|)$ with the absolute value D613 ($|v_i|$) of the message DD601 as an argument, and supplies this to the terminal c of the selector 611.

The selector 611 selects the terminal c at the time of a check node calculation, and the calculation result D615 ($\Phi(|v_i|)$) from the LUT 610 supplied to the terminal c thereof is supplied to the calculator 612 as a calculation result D617 ($\Phi(|v_i|)$).

The calculator 612 subtracts the value D617 supplied from the selector 611 from the value D609 supplied from the register 605, and outputs the subtraction result thereof as a subtraction value D618. That is to say, the calculator 612 subtracts the value D617 of $\Phi(|v_i|)$ obtained from the message DD601 (message $v_i$) supplied from a desired branch from the integration value D609 ($\Sigma\Phi(|v_i|)$ of i=1 through i=$d_c$) of $\Phi(|v_i|)$ obtained from the messages D601 (messages $v_i$) from all of the branches across one line of the parity check matrix, and outputs the subtraction value thereof ($\Sigma\Phi(|v_i|)$ of i=1 through i=$d_c$-1) as a subtraction value D618.

In parallel with the above processing, the EXOR circuit 606 calculates exclusive OR between the value D611 stored in the register 607 and the sign bit D604 that is the most significant bit of the first-time message D601 (message $v_i$), whereby multiplication is made between the sign bits, and the multiplication result D610 thereof is restored in the register 607. Note that in the event that the sign bits D604 of the messages D601 from all of the branches across one line of the parity check matrix are multiplied, the register 607 is reset.

In the event that the multiplication result D610 ($\Pi sign(v_i)$ of i=1 through i=$d_c$) wherein the sign bits D604 of the messages D601 from all of the branches across one line of the parity check matrix are multiplied is stored in the register 607, the selector 608 selects the value stored in the register 607, i.e., the value D611 ($\Pi sign(v_i)$ of i=1 through i=$d_c$) wherein the sign bits D604 of the messages D601 from all of the branches across one line of the parity check matrix are multiplied, and outputs this to the register 609 to store this. The register 609 supplies the stored value D612 to the selector 608 and the EXOR circuit 614.

The selector 608 selects the value D612 supplied from the register 609, and outputs this to the register 609 to restore this until immediately before the multiplication result D610 ($\Pi sign(v_i)$ of i=1 through i=$d_c$) wherein the sign bits D604 of the messages D601 from all of the branches across one line of the parity check matrix are multiplied is stored in the register 607. That is to say, the register 609 supplies the value previously stored to the selector 608 and the EXOR circuit 614 until the sign bits D604 of the messages D601 (messages $v_i$) from all of the branches across one line of the parity check matrix are multiplied.

On the other hand, when a new value D612 ($\Pi sign(v_i)$ of i=1 through i=$d_c$) is supplied to the EXOR circuit 614 from the register 609, i.e., when the value D611 ($\Pi sign(v_i)$ of i=1 through i=$d_c$) wherein the sign bits D604 of the messages D601 from all of the branches across one line are multiplied is stored in the register 607, as described above, the integration value ($\Sigma\Phi(|v_i|)$ of i=1 through i=$d_c$) wherein the calculation results D607 of one line worth are integrated is stored in the register 605.

Upon the integration value ($\Sigma\Phi(|v_i|)$ of i=1 through $d_c$) wherein the calculation results D607 of one row worth are integrated is stored in the register 605, as described above, with the message calculation unit 211, the same messages DD601 as the messages D601 (messages $v_i$), i.e., the second-time messages $v_i$ from the message memory 104 are input from the input port PD601 one by one, and of the message DD601 thereof, the lower bits except for the most significant bit, i.e., the absolutes value ($|v_i|$) of the message DD601 is supplied to the LUT 610, and also the most significant bit, i.e., the sign bit D614 of the message DD601 is supplied to the EXOR circuit 614.

The EXOR circuit 614 calculates exclusive OR between the value D612 supplied from the register 609 and the sign bit of the message DD601 from the input port PD601, whereby the value D612 is divided by the sign bit of the message DD601, and the division result thereof is output as a division value D620. That is to say, the EXOR circuit 614 divides the multiplication value ($\Pi sign(v_i)$ of i=1 through i=$d_c$) of the sign bits D604 of the messages D601 from all of the branches across one line of the parity check matrix by the sign bit D614 (sign($v_i$) of i=$d_c$) of the message DD601 serving as the message $v_i$ from a desired branch, and outputs the division value ($\Pi sign(v_i)$ of i=1 to i=$d_c$-1) thereof as a division value D620.

Subsequently, with the message calculation unit 211, a bit string D621 (message $u'_j$) wherein the calculation result D618 output from the LUT 612 is taken as lower bits, and also the division value D620 output from the EXOR circuit 614 is taken as the most significant bit (sign bit) is supplied to the terminal c of the selector 615.

The selector 615 selects the terminal c at the time of a check node calculation, and the bit string D621 (message $u'_j$) supplied to the terminal c thereof is output from the output port P622 as a message D622.

As described above, the message calculation unit 211 wherein the selectors 601, 611, and 615 select the terminal c performs the check node calculation of Expression (10), and outputs the message (message) $u'_j$ obtained as a result thereof from the output port P622.

Note that with the decoding device in FIG. 26, the calculation of Expression (5) is performed instead of the variable node calculation of Expression (9) at the final stage of decoding, and the calculation result thereof is output as the final decoding result.

Also, with the decoding device in FIG. 26, the control unit 212 performs the same read/write control as that in the control unit 174 of the decoding device in FIG. 12 as read/write control of a message (data) as to the message memory 104, such as described with the flowchart in FIG. 15.

Further, the read/write timing of a message as to the message memory 104 of the decoding device in FIG. 26 is also the same as that in the case of FIG. 16 described regarding the decoding device in FIG. 12, and it is also necessary for the decoding device in FIG. 26 to perform somewhat high-speed operations, but the device scale can be reduced for the worth wherein there is no need to provide delaying memory. Further, with the message calculation unit 211 of the decoding device in FIG. 26, a part of a circuit for performing a variable node calculation and a circuit for performing a check node calculation (LUT 600, calculator 602, register 603, selector 604, register 605, LUT 610, and calculator 612) are shared, and accordingly, the scale can be reduced as much as the extent of sharing, as compared with the decoding device in FIG. 12.

The message calculation unit 211 of the decoding device in FIG. 26 also performs a variable node calculation and a check node calculation in accordance with Expression (9) and Expression (10) each including the inverse function $\Phi^{-1}(x)$ and the nonlinear function $\Phi(x)$ that can obtain the same calculation result with the absolute value |x| of input data x input to a node as an argument.

Therefore, as illustrated in FIG. 27, it is sufficient for the message calculation unit 211 to include only the two LUTs of the LUT 600 for subjecting the first-time message supplied from the input port P601 to the calculations of the inverse function $\Phi^{-1}(x)$ and the nonlinear function $\Phi(x)$, and the LUT 610 for subjecting the second-time message supplied from the input port PD601 to the calculations of the inverse function $\Phi^{-1}(x)$ and the nonlinear function $\Phi(x)$, and accordingly, as illustrated in FIG. 22, the scale can be reduced as compared with the message calculation unit 201 wherein there is the need to provide the three LUTs of the LUT 300 for subjecting the first-time message to the calculation of the nonlinear function $\Phi(x)$, the LUT 310 for subjecting the second-time message to the calculation of the nonlinear function $\Phi(x)$, and the LUT 314 for subjecting the calculation of the inverse function $\Phi^{-1}(x)$.

Figure 31:
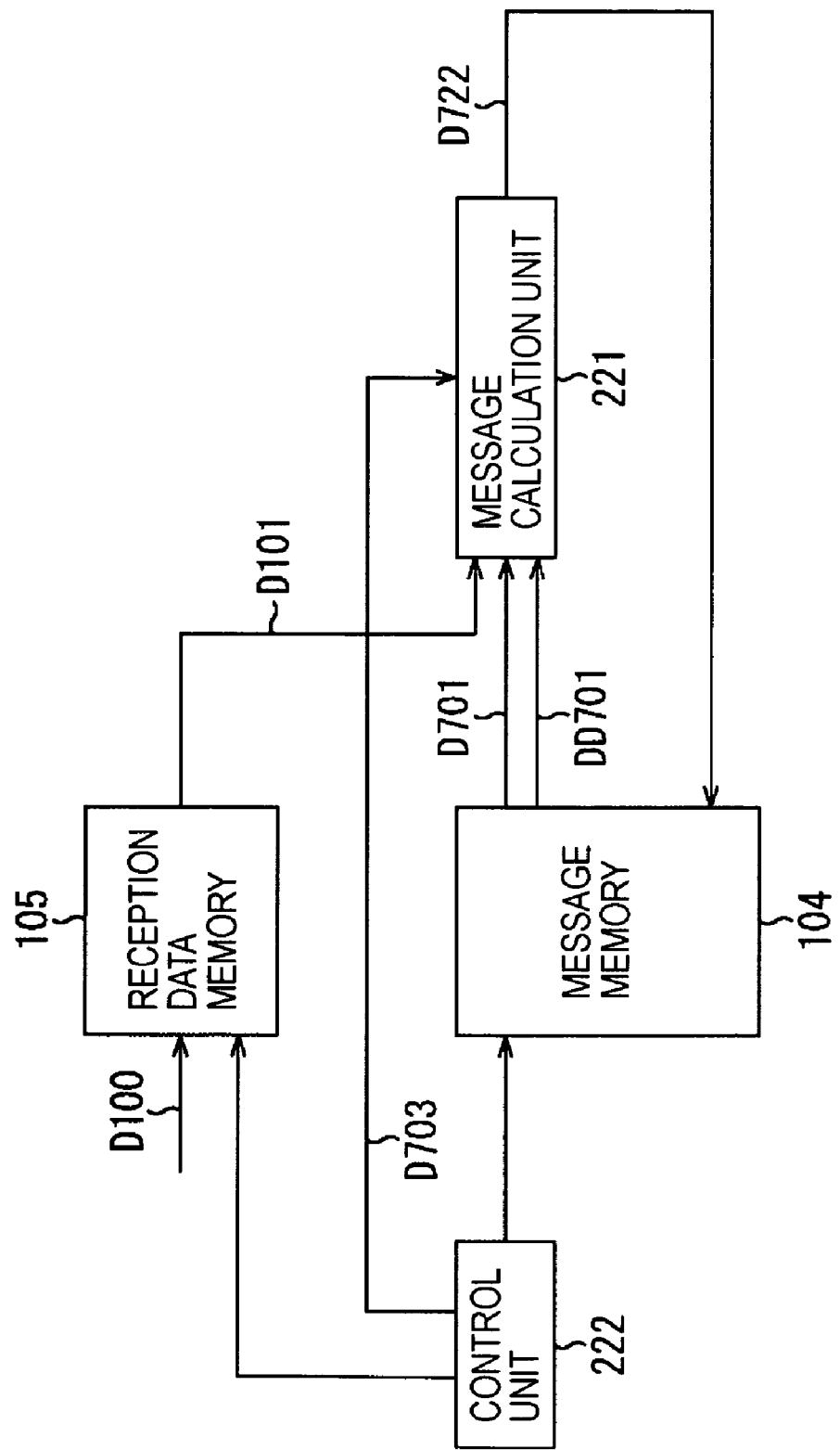
FIG. 31 is a block diagram illustrating a configuration example of a fourth embodiment of a decoding device to which the present invention is applied.

FIG. 31 is a block diagram illustrating a configuration example of a fourth embodiment of a decoding device to which the present invention is applied. Note that in the drawing, the portions corresponding to those in the decoding device in FIG. 21 are appended with the same reference numerals, and description thereof will be omitted below as appropriate. That is to say, the decoding device in FIG. 31 is configured in the same way as the decoding device in FIG. 21 except that a message calculation unit 221 is provided instead of the message calculation unit 201, and also a control unit 222 is provided instead of the control unit 202.

With the decoding device in FIG. 31, the message calculation unit 221 is configured so as to share a part of a circuit for performing a variable node calculation, and a circuit for performing a check node calculation, further without proving delaying memory.

With the decoding device in FIG. 31, the messages stored in the message memory 104 are read out one by one, and are supplied to the message calculation unit 221. The message calculation unit 221 performs a calculation using a message obtained from the message memory 104, and the message obtained by the calculation thereof is stored in the message memory 104. The decoding device in FIG. 31 performs full-serial repeat decoding by repeatedly performing the above processing.

That is to say, reception data (LDPC code) D100 that is a log likelihood ratio representing the identity of code 0 (or 1) that can be obtained by receiving an LDPC code transmitted is supplied to the reception data memory 105, and the reception data memory 105 stores the reception data D100 thereof.

At the time of a variable node calculation, the reception data memory 105 reads out the stored reception data in accordance with the control signal supplied from the control unit 222, and supplies this to the message calculation unit 221 as reception data D101.

Also, at the time of a variable node calculation, the message memory 104 reads out the stored same message twice in accordance with the control signal supplied from the control unit 222, supplies the message read out at the first time to the message calculation unit 221 as a message D701, and supplies the message read out at the second time to the message calculation unit 221 as a message DD701. Further, the control unit 222 supplies a control signal D703 for instructing a variable node calculation to the message calculation unit 221. The message calculation unit 221 performs a variable node calculation using the messages D701 and DD701 supplied from the message memory 104, and the reception data D101 supplied from the reception data memory 105 in accordance with the control signal D703 supplied from the control unit 222, and supplies the message obtained as a result of the variable node calculation thereof to the message memory 104 as a message D722.

Subsequently, the message memory 104 stores the message D722 to be supplied from the message calculation unit 221 in accordance with the control signal to be supplied from the control unit 222.

On the other hand, at the time of a check node calculation, the message memory 104 reads out the stored same message twice in accordance with the control signal supplied from the control unit 222, supplies the message read out at the first time to the message calculation unit 221 as a message D701, and supplies the message read out at the second time to the message calculation unit 221 as a message DD701. Further, the control unit 222 supplies a control signal D703 for instructing a check node calculation to the message calculation unit 221.

The message calculation unit 221 performs a check node calculation using the messages D701 and DD701 supplied from the message memory 104, and supplies the message obtained by the check node calculation thereof to the message memory 104 as a message D722.

Subsequently, the message memory 104 stores the message D722 supplied from the message calculation unit 221 in accordance with the control signal supplied from the control unit 222.

Now, description will be made regarding a calculation performed by the message calculation unit 211 in FIG. 31.

Now, if we say that a message $v'_i$ represented with Expression $v'_i = \Phi(|v_i|) \times \text{sign}(v_i)$ is introduced as a message (data) that is output from the i'th branch of the branches connected to a variable node, Expression (1) and Expression (7) can be rewritten with Expression (11) and Expression (13) respectively.

$$v_i = u_{0i} + \sum_{j=1}^{d_v-1} u_j \quad (11)$$

$$v'_i = \phi(|v_i|) \times \text{sign}(v_i) \quad (12)$$

$$u_j = \phi^{-1}\left(\sum_{i=1}^{d_c-1} |v'_i|\right) \times \prod_{i=1}^{d_c-1} \text{sign}(v'_i) \quad (13)$$

Here, the variable node calculation of Expression (1) corresponds to the calculations of Expression (11) and Expression (12), and the check node calculation of Expression (7) corresponds to the calculation of Expression (13), respectively.

With the variable node calculations of Expression (11) and Expression (12), the input data (message) $u_j$ that is input to a variable node is integrated including the sign ($u_j$) ($\Sigma u_j$), and further the reception data $u_{0i}$ is added thereto, and then with the absolute value $|v_i|$ of the addition value $v_i$ ($=u_{0i}+\Sigma u_j$) obtained as a result thereof as an argument, the calculation of the nonlinear function $\Phi(|v_i|)$ is performed, whereby the message $v'_i$ can be obtained.

Also, with the check node calculation of Expression (13), the absolute value $|v'_i|$ of the input data (message) $v'_i$ that is input to a check node is integrated ($\Sigma|v'_i|$), and with the integration value $\Sigma|v'_i|$ thereof as an argument, while performing the calculation of the inverse function $\Phi^{-1}(\Sigma|v'_i|)$, and separately therefrom, the multiplier AND of the sign bit of the input data $v'_i$ ($\Pi\text{sign}(v'_i)$) is obtained, and then the calculation result of the inverse function $\Phi^{-1}(\Sigma|v'_i|)$ and the multiplier AND of the sign bit of the input data $v'_i$ ($\Pi\text{sign}(v'_i)$) are multiplied, whereby the message $u_j$ can be obtained.

Here, as described above, the nonlinear function $\Phi(x)$ and the inverse function $\Phi^{-1}(x)$ thereof are equal in x>0. Therefore, with both of the variable node calculation of Expression (11) and Expression (12), and the check node calculation of Expression (13), the calculation of a function $\Phi(x)(\Phi^{-1}(x))$ is performed with the absolute value |x| of output data x.

With the message calculation unit 211 in FIG. 31, the variable node calculations of Expression (11) and Expression (12), and the check node calculation of Expression (13) are performed, such as described above.

Figure 32:
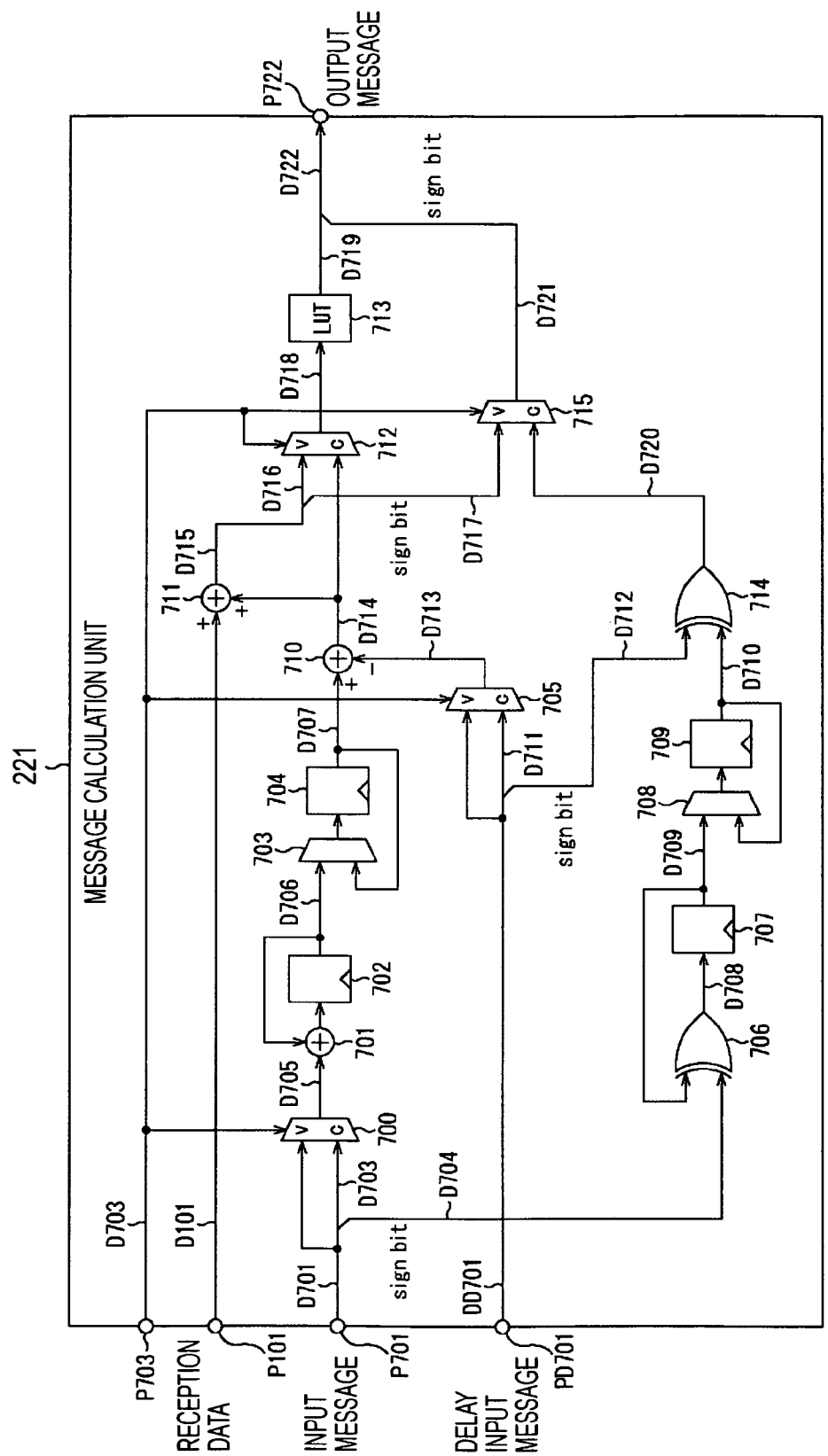
FIG. 32 is a block diagram illustrating a configuration example of a message calculator 221.

FIG. 32 illustrates a configuration example of the message calculation unit 211 in FIG. 31.

The message calculation unit 221 is configured without providing delaying memory in the same way as the message calculation unit 201 in FIG. 22. Also, the message calculation unit 221 is provided with input ports P101, P701, PD701, and P703, and an output port P722.

The input port P101 is supplied (input) with the reception data D101 read out from the reception data memory 105. The input port P701 is supplied (input) with a message (first-time message) D701 that is read out at the first time of the same messages D701 and DD701 read out twice from the message memory 104, and the input port PD701 is supplied with a message (second-time message) DD701 that is read out at the second time. Also, the input port P703 is supplied with a control signal D703 from the control unit 222 (FIG. 31).

The message calculation unit 221 performs the variable node calculations of Expression (11) and Expression (12), or the check node calculation of Expression (13) using the first-time message D701 input from the input port P701, the second-time message DD701 input from the input port PD701, and further if necessary, a message (reception data) input from the input port P101, in accordance with the control signal D703 input from the input port P703, and outputs a message D722 obtained as a result thereof from the output port P722.

Now, description will be made regarding a variable node calculation and a check node calculation performed by the message calculation unit 221 in FIG. 32 with reference to FIG. 33.

Figure 33:
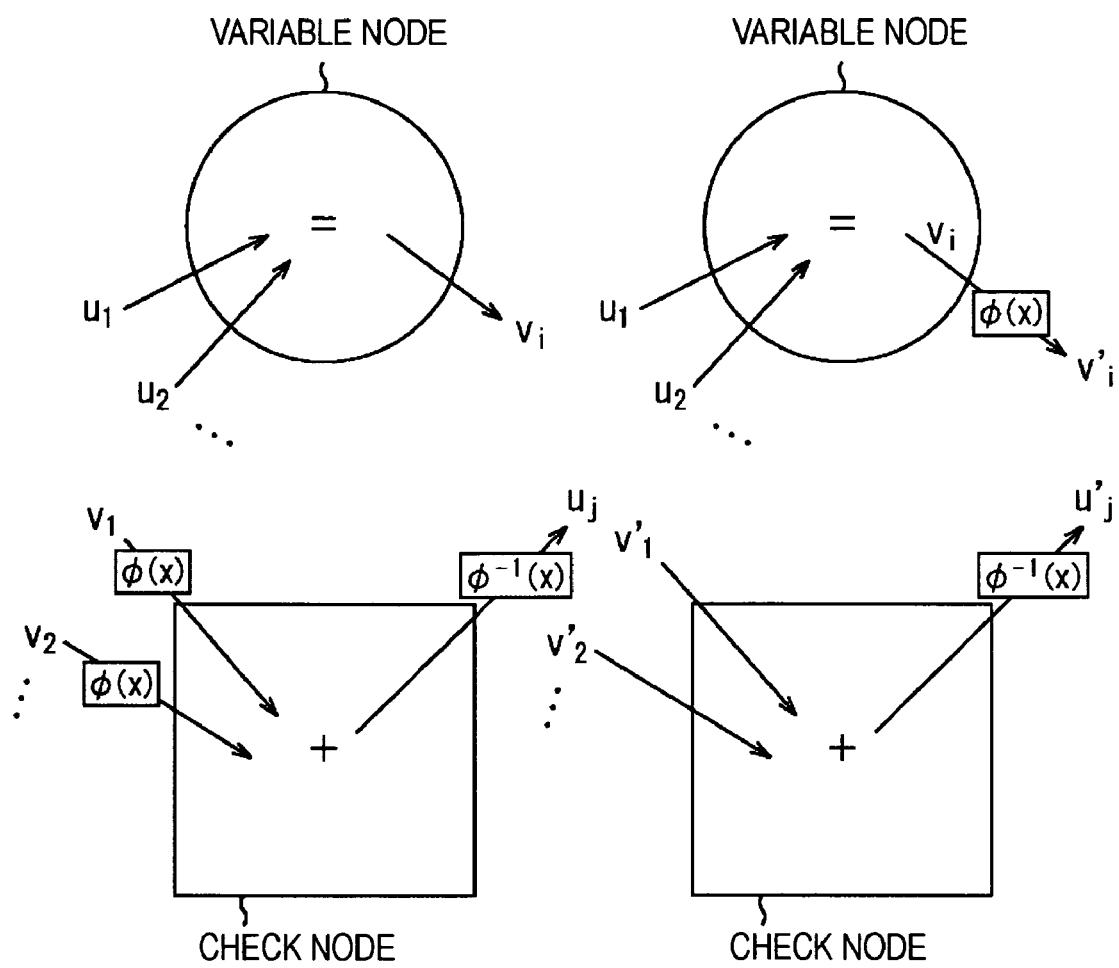
FIG. 33 is a diagram describing a variable node calculation and a check node calculation performed by the message calculator 221.

The left side of FIG. 33 schematically illustrates a variable node for performing the variable node calculation of Expression (1), and a check node for performing the check node calculation of Expression (7), which is the same diagram as that at the right side of FIG. 23.

At the left side of FIG. 33, as described with the right side of FIG. 23, input data that is input to the check node is subjected to the calculation of the nonlinear function $\Phi(x)$, following which the calculation result thereof is input to the check node, and the calculation result of the nonlinear function $\Phi(x)$ is integrated at the check node. Further, the output data output from the check node (the integration value of the calculation result of the nonlinear function $\Phi(x)$ before being subjected to the calculation of the inverse function $\Phi^{-1}(x)$) is subjected to the calculation of the inverse $\Phi^{-1}(x)$, whereby the message $u_j$ is obtained.

As described above, at the left side of FIG. 33, the message $v_i$ serving as the output data output from the variable node is subjected to the calculation of the nonlinear function $\Phi(x)$ as input data x that is input to the check node, and then is input to the check node.

Therefore, instead of the input data x that is input to the check node being subjected to the calculation of the nonlinear function $\Phi(x)$ as illustrated at the left side of FIG. 33, even if the output data x output from the variable node (variable node message $v_i$) is subjected to the calculation of the nonlinear function $\Phi(x)$ as illustrated at the right side of FIG. 33, a variable node calculation and a check node calculation can be performed.

That is to say, at the right side of FIG. 33, as described with Expression (11) and Expression (12), with the variable node, the input data $u_j$ that is input to the variable node thereof is integrated, whereby the message $v_i$ is obtained and output as output data. Subsequently, the message $v_i$ output from the variable node is subjected to the calculation of the nonlinear function $\Phi(x)$, whereby the message $v'_i$ is obtained. This message $v'_i$ (the calculation result obtained by subjecting the message $v_i$ to the calculation of the nonlinear function $\Phi(x)$) is input to the check node, integrated as described with Expression (13), and output as output data. Subsequently, the output data thereof (the integration value obtained by subjecting the message $v_i$ to the calculation of the nonlinear function $\Phi(x)$) is subjected to the calculation of the inverse function $\Phi^{-1}(x)$, whereby the message $u_j$ can be obtained.

With the message calculation unit 221 in FIG. 32, the variable node calculations of Expression (11) and Expression (12), and the check node calculation of Expression (13) for obtaining the messages $v'_i$ and $u_j$ are performed, such as illustrated at the right side of FIG. 33.

Thus, the message calculation unit 221 performs both of the variable node calculations of Expression (11) and Expression (12), and the check node calculation of Expression (13) for obtaining the messages $v'_i$ and $u_j$ illustrated at the right side of FIG. 33, and accordingly, the message calculation unit 221 is provided with an LUT 713 for outputting the calculation result of the nonlinear function $\Phi(x)$ that can obtain the same calculation result as the inverse function $\Phi^{-1}(x)$ as to the output data x output from the variable node, and also outputting the calculation result of the inverse function $\Phi^{-1}(x)$ as to the output data x output from the check node.

Subsequently, the message calculation unit 221 changes its essential configuration in accordance with the control signal D703 supplied to the input port P703, and selectively performs the variable node calculations of Expression (11) and Expression (12), and the check node calculation of Expression (13).

Specifically, the message calculation unit 221 includes selectors 700, 705, 712, and 715, and the control signal D703 supplied to the input port P703 is supplied to the selectors 700, 705, 712, and 715.

The selectors 700, 705, 712, and 715 include a terminal v and a terminal c, and select a value that is supplied to one of the terminal v and terminal c in accordance with the control signal D703, and output this to the subsequent stage. That is to say, in the event that the control signal D703 is a control signal for instructing a variable node calculation, the selectors 700, 705, 712, and 715 select the value supplied to the terminal v to output this to the subsequent stage, and in the event that the control signal D703 is a control signal for instructing a check node calculation, the selectors 700, 705, 712, and 715 select the value supplied to the terminal c to output this to the subsequent stage.

As a result thereof, with the message calculation unit 221 in FIG. 32, when the control signal D703 instructs a variable node calculation, a variable node calculation is performed, and when the controls signal D703 instructs a check node calculation, a check node calculation is performed.

Figure 34:
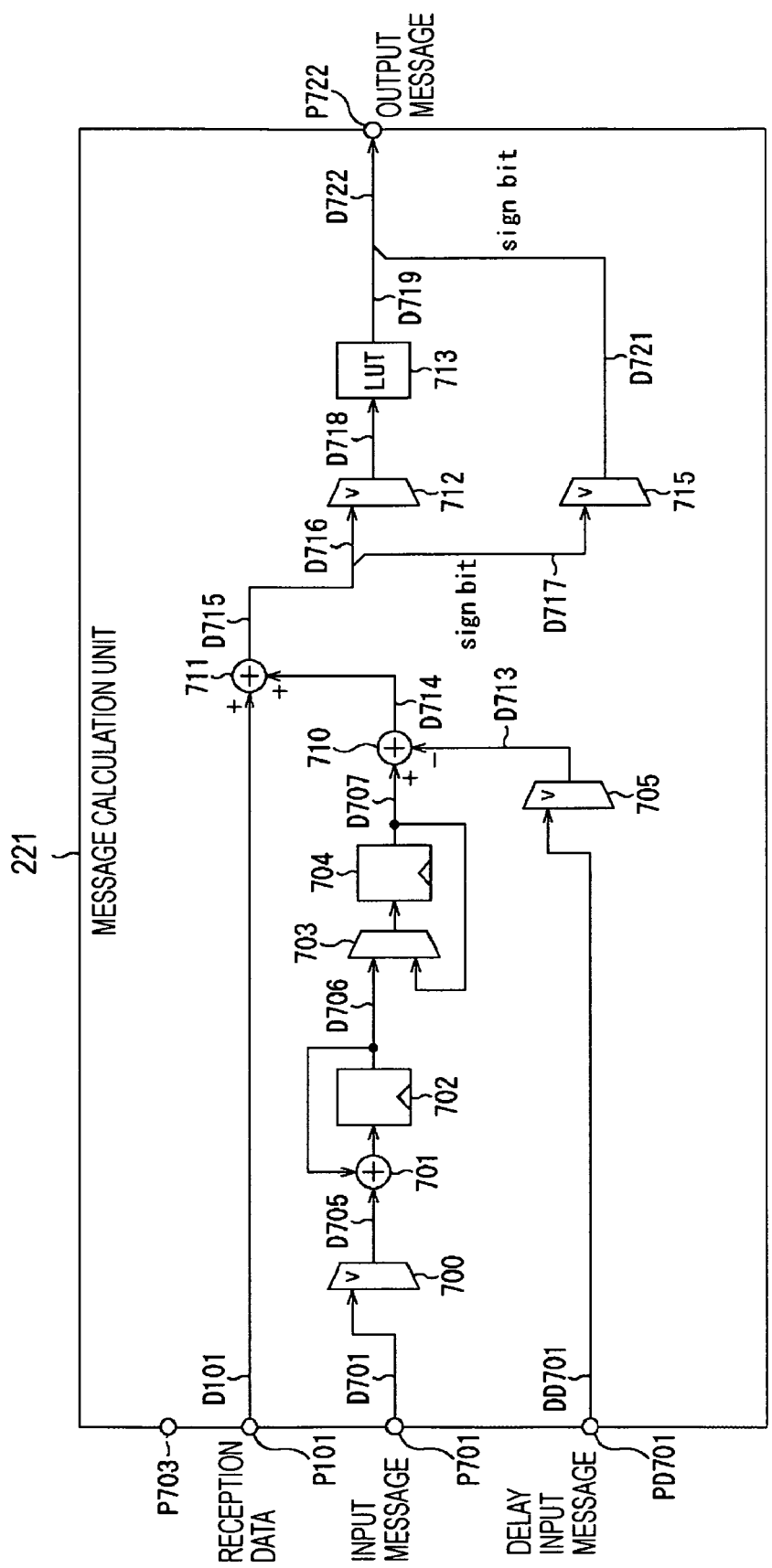
FIG. 34 is a block diagram illustrating an actual configuration of the message calculator 221 at the time of a variable node calculation.

FIG. 34 illustrates an essential configuration example of the message control unit 221 in FIG. 32 at the time of the variable node calculation illustrated at the right side of FIG. 33.

Note that as described above, at the time of a variable node calculation, the selectors 700, 705, 712, and 715 select the terminal v, but in FIG. 34, of the configuration illustrated in FIG. 32, the portions which do not function at the time of a variable node calculation by the selectors 700, 705, 712, and 715 selecting the terminal v (portions not relating to a variable node calculation) are omitted in the drawing.

The message calculation unit 221 performs the variable node calculations of Expression (11) and Expression (12) using the message input from each of the input ports P101, P701, and PD701, and outputs the message D722 obtained as a result thereof from the output port P722.

That is to say, the input port P101 is supplied with the reception data D101 read out from the reception data memory 105. Also, the input port P701 is supplied with the first-time message D701 (message $u_j$) read out from the message memory 104 one by one, obtained from the check node corresponding to each line of the parity check matrix.

The reception data D101 supplied to the input port P101 is supplied to the calculator 711.

Also, the message D701 (message $u_j$) supplied to the input port P701 is supplied to the terminal v of the selector 700.

The selector 700 selects the terminal v at the time of a variable node calculation as described above, and the message D701 (check node message $u_j$) supplied to the terminal v thereof is supplied to the calculator 701 as a message D705.

The calculator 701 integrates the message D705 by adding the message D705 (message $u_j$) from the selector 700 and the value D706 stored in the register 702, and restores the integration value obtained as a result thereof in the register 702. Note that in the event of the messages D705 (messages $u_j$) from all of the branches across one row of the parity check matrix being integrated, the register 702 is reset.

In the event that the messages D701 (messages $u_j$) across one row of the parity check matrix are read in one by one, and thus the value wherein the messages D705 (messages $u_j$) of one row worth are integrated is stored in the register 702, i.e., in the event that the integration value ($\Sigma u_j$ of j=1 through $d_v$) wherein the messages D705 (messages $u_j$) from all of the branches across one row of the parity check matrix are integrated is stored in the register 702, the selector 703 selects the value stored in the register 702, i.e., the integration value D706 ($\Sigma u_j$ of j=1 through $d_v$) wherein the messages D705 (messages $u_j$) from all of the branches across one row of the parity check matrix are integrated, and outputs this to the register 704 to store this.

The register 704 supplies the stored value D706 to the selector 703 and the calculator 710 as a value D707. The selector 703 selects the value D707 supplied from the register 704, and outputs this to the register 704 to restore this until immediately before the value wherein the messages D705 (messages $u_j$) of one row worth are integrated is stored in the register 702. That is to say, the register 704 supplies the value previously integrated to the selector 703 and the calculator 710 until the messages D705 (messages $u_j$) from all of the branches across one row of the parity check matrix are integrated.

On the other hand, upon output of a new value D707 ($\Sigma u_j$ of j=1 through $d_v$) being started from the register 704, i.e., immediately after the integration value ($\Sigma u_j$ of j=1 through $d_v$) wherein the messages D705 (messages $u_j$) of one row worth are integrated is stored in the register 702, with the message calculation unit 221, the same messages DD701 as the messages D701 (messages $u_j$), i.e., the second-time messages $u_j$ from the message memory 104 are input from the input port PD701 one by one, and the messages DD701 thereof are supplied to the terminal v of the selector 705.

The selector 705 selects the terminal v at the time of a variable node calculation as described above, and the message DD701 (check node message $u_j$) supplied to the terminal v thereof is supplied to the calculator 710 as a message D713.

The calculator 710 subtracts the message D713 (check node message $u_j$) obtained from the selector 705 from the integration value D707 ($\Sigma u_j$ of j=1 through $d_v$) supplied from the register 704. That is to say, the calculator 710 subtracts the message D713 that is the message $u_j$ ($u_j$ of j=$d_v$) supplied from a desired branch from the integration value D707 ($\Sigma u_j$ of j=1 through $d_v$) of the messages D705 (messages $u_j$) of all of the branches across one row of the parity check matrix to obtain the subtraction value D714 ($\Sigma u_j$ of j=1 through $d_v$-1), and supplies this to the calculator 711.

The calculator 711 adds the reception data D101 from the input port P101 and the subtraction value D714 ($\Sigma u_j$ of j=1 through $d_v$-1) from the calculator 710 to obtain and output the message D715 (variable node message $v_i$).

Thus, the calculation of Expression (11) is performed, and the variable node message $v_i$ is output from the calculator 711.

Of the message D715 (message $v_i$) that the calculator 711 outputs, the lower bits except for the most significant bit, i.e., the absolute value D716 ($|v_i|$) of the message D715 is supplied to the terminal v of the selector 712, and the most significant bit, i.e., the sign bit D717 (sign($v_i$)) of the message D715 (message $v_i$) is supplied to the terminal v of the selector 715.

The selector 712 selects the terminal v at the time of a variable node calculation, and supplies the absolute value D716 ($|v_i|$) of the message D715 (message $v_i$) that the calculator 711 outputs, supplied to the terminal v thereof to the LUT 713 as an absolute value D718.

The LUT 713 reads out and outputs the calculation result D719 ($\Phi(|v_i|)$) obtained as a result of calculation of the non-linear function $\Phi(|v_i|)$ with the absolute value D718 ($|v_i|$) from the selector 712 as an argument.

The selector 715 also selects the terminal v at the time of a variable node calculation, and outputs the sign bit D717 (sign($v_i$)) of the message D715 (message $v_i$) that the calculator 711 outputs, supplied to the terminal v thereof as a sign bit D721 (sign($v_i$)).

The message calculation unit 211 appends the sign bit D721 (sign($v_i$)) that the selector 715 outputs to the most significant bit as the sign bit of the calculation result D719 ($\Phi(|v_i|)$) that the LUT 713 outputs, and thus, obtains the message D722 (message $v'_i$) to output this from the output port P722.

Thus, the calculation of Expression (12) is performed, and the message v'i is obtained.

As described above, the message calculation unit 221 wherein the selectors 700, 705, 712, and 715 select the terminal v performs the variable node calculations of Expression (11) and Expression (12), and outputs the message $v'_i$ obtained as a result thereof from the output port P722.

Figure 35:
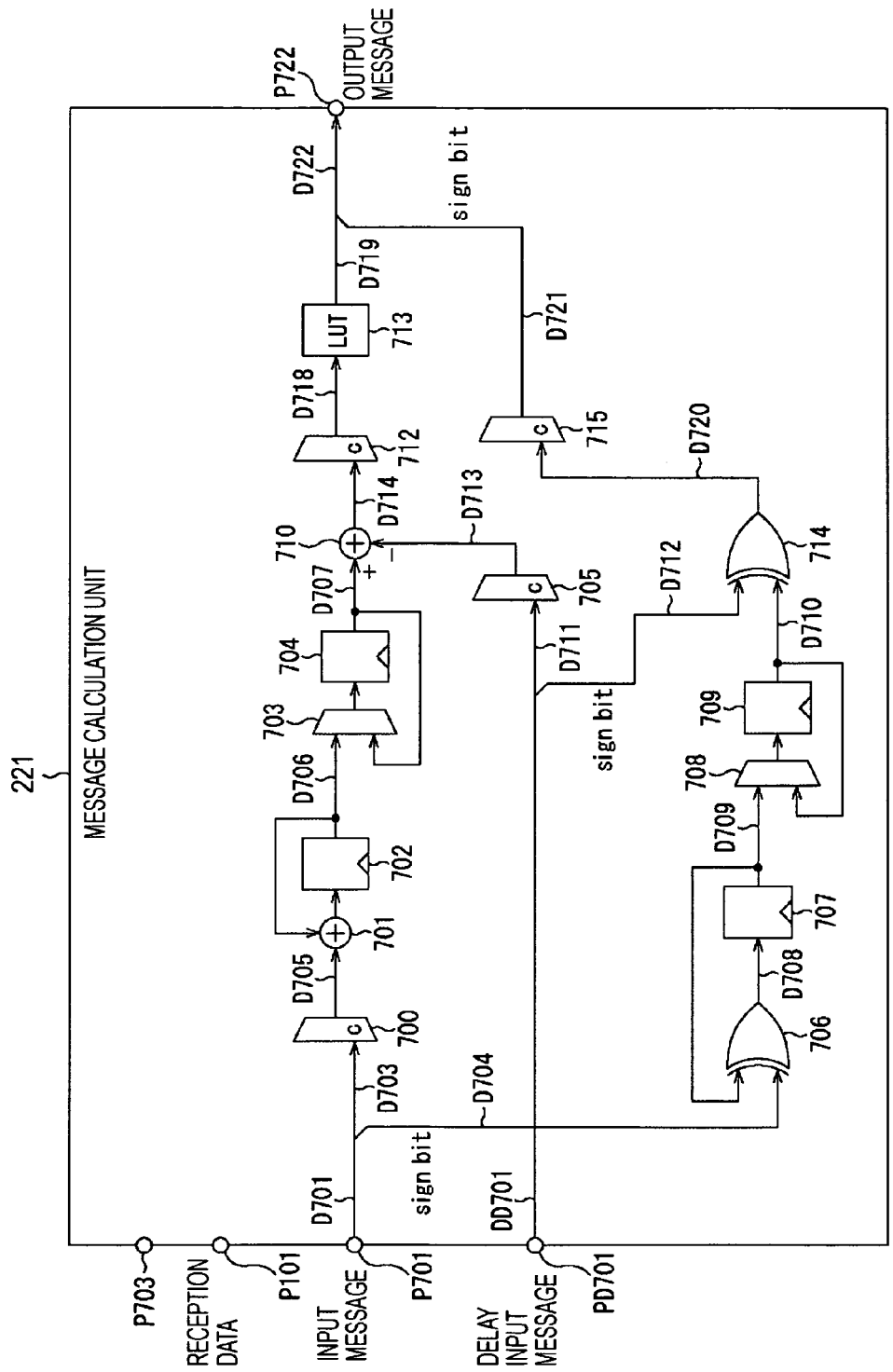
FIG. 35 is a block diagram illustrating an actual configuration of the message calculator 221 at the time of a check node calculation.

FIG. 35 illustrates an essential configuration example of the message control unit 221 in FIG. 32 at the time of the check node calculation illustrated at the right side of FIG. 33.

Note that as described above, at the time of a check node calculation, the selectors 700, 705, 712, and 715 select the terminal c, but in FIG. 35, of the configuration illustrated in FIG. 32, the portions which do not function at the time of a check node calculation by the selectors 700, 705, 712, and 715 selecting the terminal c (portions not relating to a check node calculation) are omitted in the drawing.

At the time of a check node calculation, the input port P701 is sequentially supplied with the message (message obtained by the variable node calculations of Expression (11) and Expression (12)) $v'_i$ obtained from the variable node message $v_i$ from the variable node corresponding to each row of the parity check matrix, read out from the message memory 104 one by one, as a message D701.

Of the message D701 (message $v'_i$) supplied to the input port P701, the lower bits except for the most significant bit, i.e., the absolute value D703 ($|v'_i|$) of the message D701 is supplied to the terminal c of the selector 700, and the most significant bit, i.e., the sign bit D704 of the message D701 is supplied to the EXOR circuit 706.

The selector 700 selects the terminal c at the time of a check node calculation, and supplies the absolute value D703 ($|v'_i|$) of the message D701 supplied to the terminal c thereof to the calculator 701 as an absolute value D705 ($|v'_i|$).

The calculator 701 integrates the absolute value D705 by adding the absolute value D705 ($|v'_i|$) and the value D706 stored in the register 702, and restores the integration value obtained as a result thereof in the register 702. Note that in the event that the absolute values D705 (D703) ($|v'_i|$) of the messages D701 (obtained from the messages $v_i$) from all of the branches across one line of the parity check matrix are integrated, the register 702 is reset.

In the event that the messages D701 across one line of the parity check matrix are read in one by one, and the integration value wherein the absolute values D705 of one line worth are integrated is stored in the register 702, the selector 703 selects the value stored in the register 702, i.e., the integration value D706 ($\Sigma|v'_i|$ of i=1 through i=$d_c$) wherein the messages D701 (messages $v'_i$) from all of the branches across one line of the parity check matrix are integrated, and outputs this to the register 704 to store this. The register 704 supplies the stored integration value D706 to the selector 703 and the calculator 710 as a value D707.

The selector 703 selects the value D707 supplied from the register 704, and outputs this to the register 704 to restore this until immediately before the integration value wherein the absolute values D705 of one line worth are integrated is stored in the register 702. That is to say, the register 704 supplies the integration value of the absolute values $|v'_i|$ previously integrated to the selector 703 and the calculator 710 until the absolute values $|v'_i|$ of the messages D701 (message $v'_i$) from all of the branches across one line of the parity check matrix are integrated.

On the other hand, upon output of a new value D707 ($\Sigma|v'_i|$ of i=1 through $d_c$) being started from the register 704, i.e., immediately after the integration value ($\Sigma|v'_i|$ of i=1 through $d_c$) wherein the absolute values D705 ($|v'_i|$) of one line worth are integrated is stored in the register 704, with the message calculation unit 221, the same messages DD701 as the messages D701 (messages $v'_i$), i.e., the second-time messages $v'_i$ from the message memory 104 (the same messages as the first-time messages $v'_i$) are input from the input port PD701 one by one, and of the message DD701 ($v'_i$) thereof, the lower bits thereof except for the most significant bit, i.e., the absolute value D711 ($|v'_i|$) of the message DD701 is supplied to the terminal c of the selector 705, and also the most significant bit, i.e., the sign bit D712 (sign($v'_i$)) of the message DD701 ($v'_i$) is supplied to the EXOR circuit 714.

The selector 705 selects the terminal c at the time of a check node calculation, and supplies the absolute value D711 ($|v'_i|$) of the message DD701 ($v'_i$) supplied to the terminal c thereof to the calculator 710 as an absolute value D713 ($|v'_i|$).

The calculator 710 subtracts the value D713 ($|v'_i|$) supplied from the selector 705 from the value D707 ($\Sigma|v'_i|$) supplied from the register 704, and outputs the subtraction result thereof as a subtraction value D714. That is to say, the calculator 710 subtracts the absolute value D713 ($|v'_i|$) of the message DD701 ($v'_i$ of I=$d_c$) obtained from a desired branch from the integration value D707 ($\Sigma|v'_i|$ of i=1 through i=$d_c$) of the absolute values $|v'_i|$ of the messages D701 (messages $v'_i$) obtained from all of the branches across one line of the parity check matrix, and supplies the subtraction value thereof ($\Sigma|v'_i|$ of i=1 through i=$d_c$-1) to the terminal c of the selector 712 as a value D714.

The selector 712 selects the terminal c at the time of a check node calculation, and supplies the value D714 ($\Sigma|v'_i|$ of i=1 through i=$d_c$-1) supplied to the terminal c thereof to the LUT 713 as a value D718.

The LUT 713 reads out and outputs the calculation result D719 ($\Phi^{-1}(\Sigma|v'_i|)$) obtained as a result of calculation of the inverse function $\Phi^{-1}(\Sigma|v'_i|)$ with the value D718 ($\Sigma|v'_i|$) from the selector 712 as an argument.

In parallel with the above processing, the EXOR circuit 706 calculates exclusive OR between the value D709 stored in the register 707 and the sign bit D704 (sign($v'_i$)) that is the most significant bit of the first-time message D701 (message $v'_i$), whereby multiplication is made between the sign bits D704, and the multiplication result D708 thereof is restored in the register 707. Note that in the event that the sign bits D704 of the messages D701 from all of the branches across one line of the parity check matrix are multiplied, the register 707 is reset.

In the event that the multiplication result D708 ($\Pi$sign($v'_i$) of i=1 through i=$d_c$) wherein the sign bits D704 of the messages D701 from all of the branches across one line of the parity check matrix are multiplied is stored in the register 707, the selector 708 selects the value stored in the register 707, i.e., the value D709 ($\Pi sign(v'_i)$ of i=1 through i=$d_c$) wherein the sign bits D704 of the messages D701 from all of the branches across one line of the parity check matrix are multiplied, and outputs this to the register 709 to store this. The register 709 supplies the stored value D710 to the selector 708 and the EXOR circuit 714.

The selector 708 selects the value D710 supplied from the register 709, and outputs this to the register 709 to restore this until immediately before the multiplication result D708 ($\Pi sign(v'_i)$ of i=1 through i=$d_c$) wherein the sign bits D704 of the messages D701 from all of the branches across one line of the parity check matrix are multiplied is restored in the register 707. That is to say, the register 709 supplies the value previously stored to the selector 708 and the EXOR circuit 714 until the sign bits D704 of the messages D701 (messages $v'_i$) from all of the branches across one line of the parity check matrix are multiplied.

On the other hand, when a new value D710 ($\Pi sign(v'_i)$ of i=1 through i=$d_c$) is supplied to the EXOR circuit 714 from the register 709, i.e., when the value D709 ($\Pi sign(v'_i)$ of i=1 through i=$d_c$) wherein the sign bits D704 of the messages D701 from all of the branches across one line are multiplied is stored in the register 707, as described above, the integration value ($\Sigma |v'_i|$ of i=1 through i=$d_c$) wherein the absolute values D705 ($|v'_i|$) of one line worth are integrated is stored in the register 704.

Upon the integration value ($\Sigma |v'_i|$ of i=1 through i=$d_c$) wherein the absolute values D705 of one row worth are integrated is stored in the register 704, as described above, with the message calculation unit 221, the same messages DD701 as the messages D701 (messages $v'_i$), i.e., the second-time messages $v'_i$ from the message memory 104 are input from the input port PD701 one by one, and of the message DD701 thereof, the lower bits thereof except for the most significant bit, i.e., the absolutes value ($|v'_i|$) of the message DD701 is supplied to the terminal c of the selector 705, and also the most significant bit, i.e., the sign bit D712 ($sign(v'_i)$) of the message DD701 is supplied to the EXOR circuit 714.

The EXOR circuit 714 calculates exclusive OR between the value D710 supplied from the register 709 and the sign bit D712 of the message DD701 from the input port PD701, whereby the value D710 is divided by the sign bit D712 of the message DD701, and the division result thereof is supplied to the terminal c of the selector 715 as a division value D720. That is to say, the EXOR circuit 714 divides the multiplication value of the sign bits D704 of the messages D701 from all of the branches across one line of the parity check matrix ($\Pi sign(v'_i)$ of i=1 through i=$d_c$) by the sign bit D712 of the message DD701 serving as the message $v'_i$ from a desired branch ($sign(v'_i)$ of i=$d_c$), and supplies the division value ($\Pi sign(v'_i)$ of i=1 to i=$d_c$-1) thereof to the terminal c of the selector 715 as a division value D720.

The selector 715 selects the terminal c at the time of a check node calculation, and outputs the division value D720 supplied to the terminal c thereof ($\Pi sign(v'_i)$ of i=1 through i=$d_c$-1) as a sign bit D721.

Subsequently, the message calculation unit 221 appends (multiplies) the D721 ($\Pi sign(v'_i)$) output from the selector 715 as described above to the calculation result D719 ($\Phi^{-1}(\Sigma|v'_i|)$) that the LUT 713 outputs as a sign bit, and thus obtains the message (check node message) $u_j$ represented with Expression (13) to output this from the output port P722 as a message D722.

As described above, the message calculation unit 221 wherein the selectors 700, 705, 712, and 715 select the terminal c performs the check node calculation of Expression (13), and outputs the message $u_j$ obtained as a result thereof from the output port P722.

Note that with the decoding device in FIG. 31, the calculation of Expression (5) is performed instead of the variable node calculations of Expression (11) and Expression (12) at the final stage of decoding, and the calculation result thereof is output as the final decoding result.

Also, with the decoding device in FIG. 31, the control unit 222 performs the same read/write control as that in the control unit 174 of the decoding device in FIG. 12 as read/write control of a message (data) as to the message memory 104, such as described with the flowchart in FIG. 15.

Further, the read/write timing of a message as to the message memory 104 of the decoding device in FIG. 31 is also the same as that in the case of FIG. 16 described regarding the decoding device in FIG. 12, and it is also necessary for the decoding device in FIG. 31 to perform somewhat high-speed operations, but there is no need to provide delaying memory, and the device scale can be reduced accordingly. Further, with the message calculation unit 221 of the decoding device in FIG. 31, a part of a circuit for performing a variable node calculation and a circuit for performing a check node calculation (calculator 701, register 702, selector 703, register 704, calculator 710, and LUT 713) are shared, and accordingly, the scale can be reduced as much as the extent of sharing, as compared with the decoding device in FIG. 12.

The message calculation unit 221 of the decoding device in FIG. 31 also performs a variable node calculation and a check node calculation each using Expression (12) and Expression (13) each including the inverse function $\Phi^{-1}(x)$ and the nonlinear function $\Phi(x)$ that can obtain the same calculation result with the absolute value |x| of output data x output from a node as an argument.

Accordingly, the message calculation unit 221 needs only one LUT of the LUT 713 for subjecting the absolute value |x| of the output data x to the calculations of the inverse function $\Phi^{-1}(x)$ and the nonlinear function $\Phi(x)$ as illustrated in FIG. 32, and the message calculation unit 221 can be reduced in its scale as compared with the message calculation unit 201 which needs the three LUTs of the LUTs 300, 310, and 314 illustrated in FIG. 22, and further the message calculation unit 211 which needs the two LUTs of the LUTs 600 and 610 illustrated in FIG. 27.

Figure 36:
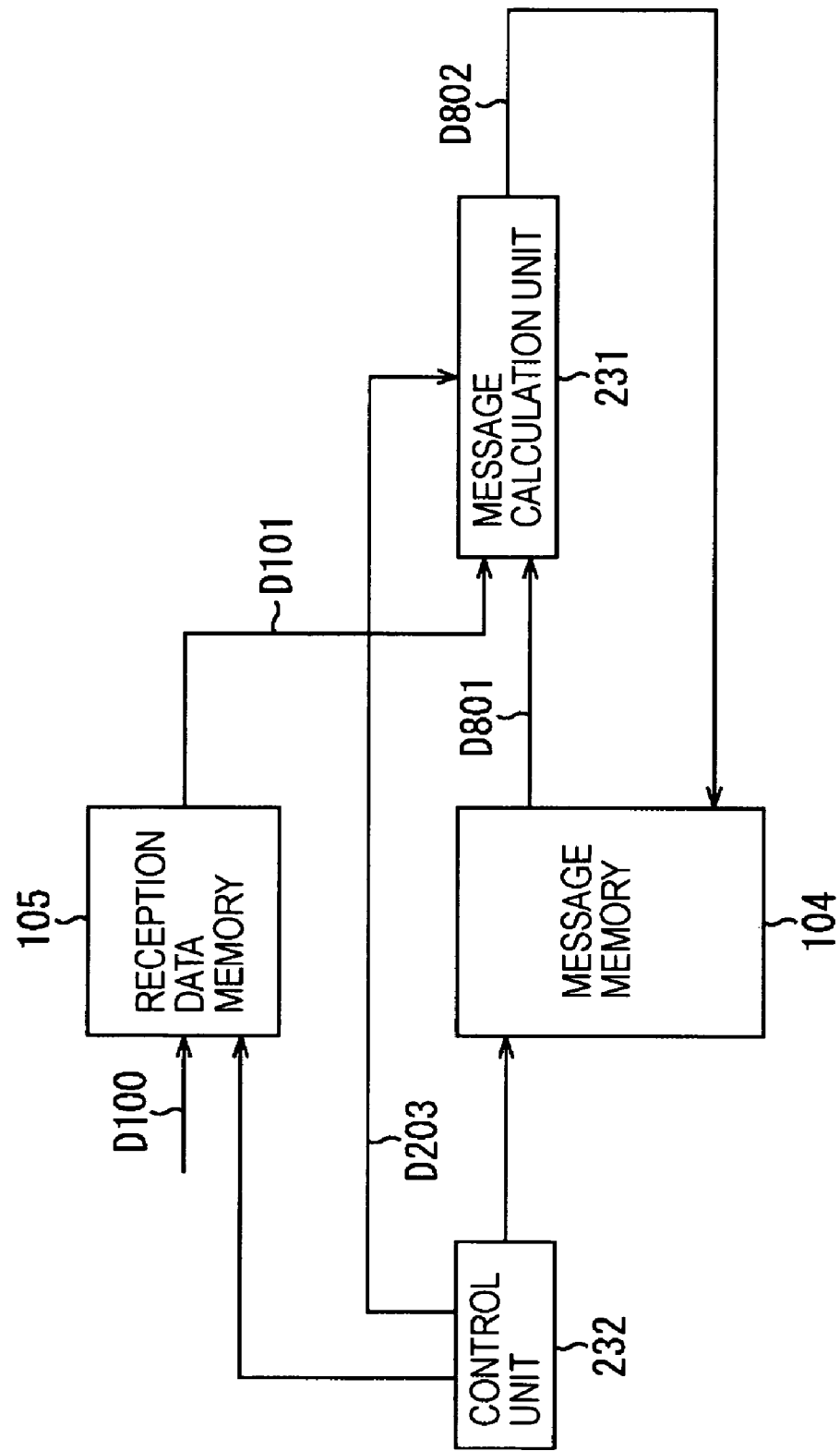
FIG. 36 is a block diagram illustrating a configuration example of a fifth embodiment of a decoding device to which the present invention is applied.

FIG. 36 is a block diagram illustrating a configuration example of a fifth embodiment of a decoding device to which the present invention is applied. Note that in the drawing, the portions corresponding to those in the decoding device in FIG. 21 are appended with the same reference numerals, and description thereof will be omitted below as appropriate. That is to say, the decoding device in FIG. 36 is configured in the same way as the decoding device in FIG. 21 except that a message calculation unit 231 is provided instead of the message calculation unit 201, and also a control unit 232 is provided instead of the control unit 202.

The decoding device in FIG. 36 is configured wherein the message calculation unit 231 shares a part of a circuit for performing a variable node calculation and a circuit for performing a check node calculation, as with the message calculation unit 201 of the decoding device in FIG. 21. Further, with the decoding device in FIG. 36, the message calculation unit 231 for performing a variable node calculation and a check node calculation is configured without providing delaying memory.

With the decoding device in FIG. 36, the message calculation unit 231 sequentially reads out an input message from the message memory 104 one by one, and calculates the output message corresponding to a desired branch using the input message thereof. Subsequently, the output message obtained by the calculation thereof is stored in the message memory 104. The decoding device in FIG. 36 performs full-serial repeat decoding by repeatedly performing the above processing.

That is to say, reception data (LDPC code) D100 that is a log likelihood ratio representing the identity of code 0 (or 1) that can be obtained by receiving an LDPC code transmitted is supplied to the reception data memory 105, and the reception data memory 105 stores the reception data D100 thereof.

At the time of a variable node calculation, the reception data memory 105 reads out the stored reception data in accordance with the control signal supplied from the control unit 232, and supplies this to the message calculation unit 231 as reception data D101.

Also, at the time of a variable node calculation, the message memory 104 reads out the stored same message twice in accordance with the control signal supplied from the control unit 232, supplies the message read out at the first time to the message calculation unit 231 as a message D801, and supplies the message read out at the second time to the message calculation unit 231 also as a message D801. The message calculation unit 231 performs the variable node calculation of Expression (1) using the message D801 supplied twice from the message memory 104, and the reception data D101 supplied from the reception data memory 105 in accordance with the control signal D203 supplied from the control unit 232, and supplies the message (variable node message) $v_i$ obtained as a result of the variable node calculation thereof to the message memory 104 as a message D802.

Subsequently, the message memory 104 stores the message D802 (variable node message $v_i$) supplied from the message calculation unit 231 in accordance with the control signal supplied from the control unit 232.

On the other hand, at the time of a check node calculation, the message memory 104 reads out the stored same message (variable node message $v_i$) twice in accordance with the control signal supplied from the control unit 232, supplies the message read out at the first time to the message calculation unit 231 as a message D801, and supplies the message read out at the second time to the message calculation unit 231 also as a message D801.

The message calculation unit 231 performs the check node calculation of Expression (7) in accordance with the control signal D203 from the control unit 232 using the message D801 supplied twice from the message memory 104, and supplies the message (check node message) $u_j$ obtained by the check node calculation thereof to the message memory 104 as a message D802.

Subsequently, the message memory 104 stores the message D802 (check node message $u_j$) supplied from the message calculation unit 231 in accordance with the control signal supplied from the control unit 232.

The message D802, i.e., check node message $u_j$ from the message calculation unit 231 that the message memory 104 stored is read out twice as the message D801 at the time of the next variable node calculation, and supplied to the message calculation unit 231.

Figure 37:
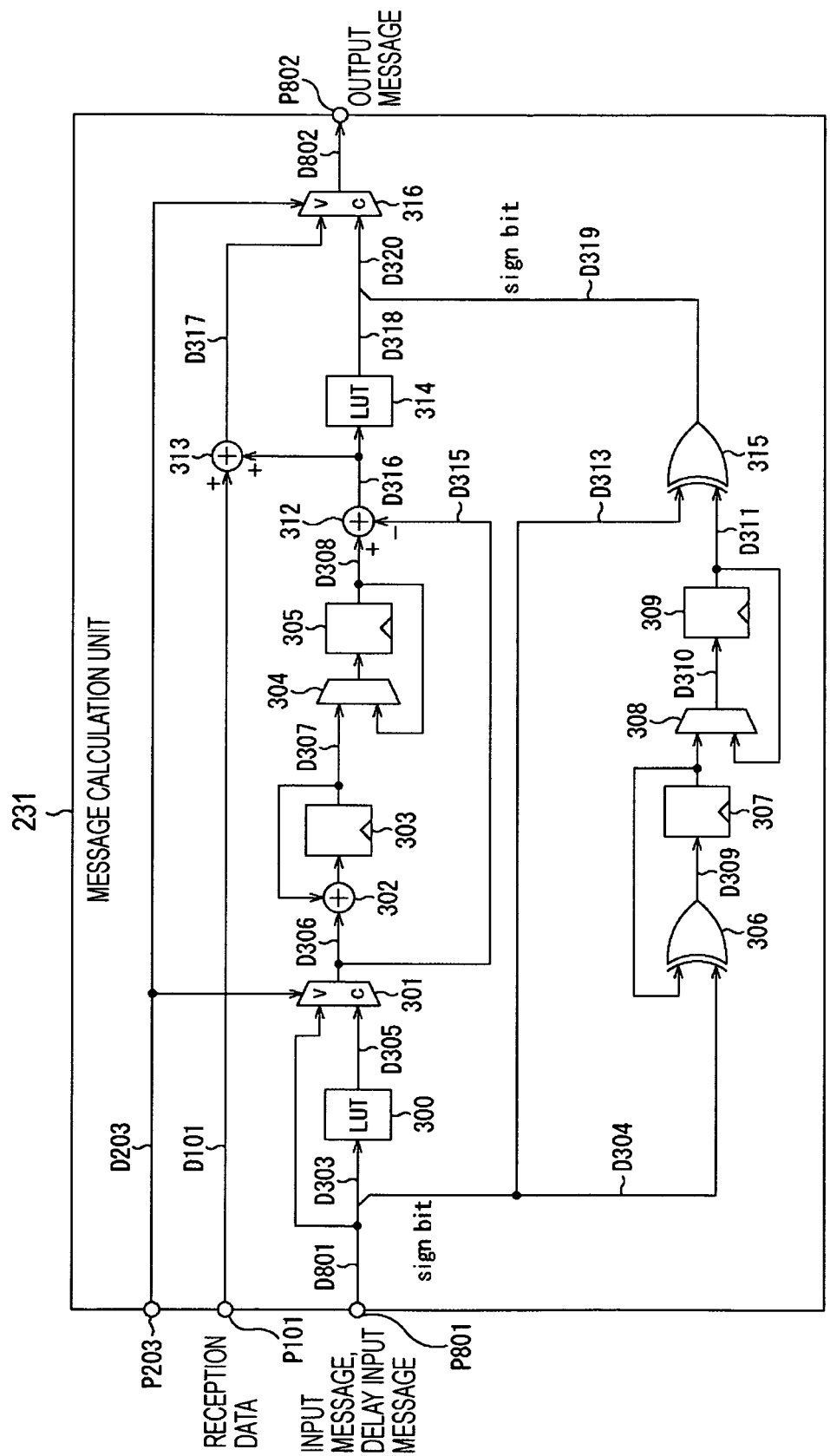
FIG. 37 is a block diagram illustrating a configuration example of a message calculator 231.

FIG. 37 illustrates a configuration example of the message calculation unit 231 in FIG. 36.

Note that in the drawing, the portions corresponding to those in the message calculation unit 201 in FIG. 22 are appended with the same reference numerals, and description thereof will be omitted below as appropriate.

The message calculation unit 231 is configured without providing delaying memory in the same way as the message calculation unit 201 in FIG. 22.

Also, the message calculation unit 201 in FIG. 22 includes, in addition to the input ports P101 and P203, the input port P201 to which the first-time message is supplied (input) externally, and the input port PD201 to which the second-time message is supplied, however, the message calculation unit 231 is provided with the one input port P801 instead of the two input ports P201 and PD201 thereof, and both of the first-time message and the second-time message are arranged so as to be input from the input port P801.

The input port P101 is supplied (input) with the reception data D101 read out from the reception data memory 105. Also, the input port P801 is supplied with the same message D801 read out twice from the message memory 104 (first-time message and second-time message).

The message calculation unit 231 performs the variable node calculation of Expression (1) or the check node calculation of Expression (7) using the first-time message D801 and second-time message D801 input from the input port P801, and further if necessary, a message (reception data) input from the input port P101 in accordance with the control signal D203 input from the input port P203, and outputs the message D802 obtained as a result thereof from the output port P802.

That is to say, the reception data D101 supplied to the input port P101 is supplied to the calculator 313, and the first-time message D801 supplied to the input port P801 is supplied to the terminal v of the selector 301.

Further, of the first-time message D801 supplied to the input port P801, the lower bits except for the most significant bit, i.e., the absolute value of the message D801 is supplied to the LUT 300 as a value D303, and the most significant bit of the first-time message D801, i.e., the sign bit of the message D801 is supplied to the EXOR circuit 306 as a value D304, and also supplied to the EXOR circuit 315 as a value D313.

The second-time message D801 supplied to the input port PD801 is also supplied to the respective parts of the message calculation unit 231, as with the first-time message D801. That is to say, the second-time message D801 supplied to the input port P801 is supplied to the terminal v of the selector 301. Further, the absolute value of the second-time message D801 supplied to the input port P801 is supplied to the LUT 300 as a value D303, the sign bit of the second-time message D801 is supplied to the EXOR circuit 306 as a value D304, and also supplied to the EXOR circuit 315 as a value D313.

Also, the control signal D203 supplied to the input port P203 is supplied to the selectors 301 and 316.

The selectors 301 and 316 include a terminal v and a terminal c, and select a value supplied to one of the terminal v and terminal c in accordance with the control signal D203, and output this to the subsequent stage. That is to say, in the event that the control signal D203 is a control signal for instructing a variable node calculation, the selectors 301 and 316 select the value supplied to the terminal v to output this to the subsequent stage, and in the event that the control signal D203 is a control signal for instructing a check node calculation, the selectors 301 and 316 select the value supplied to the terminal c to output this to the subsequent stage.

As a result thereof, with the message calculation unit 231 in FIG. 37, as with the message calculation unit 201 in FIG. 22, when the control signal D203 instructs a variable node calculation, a variable node calculation is performed, and when the controls signal D203 instructs a check node calculation, a check node calculation is performed.

Figure 38:
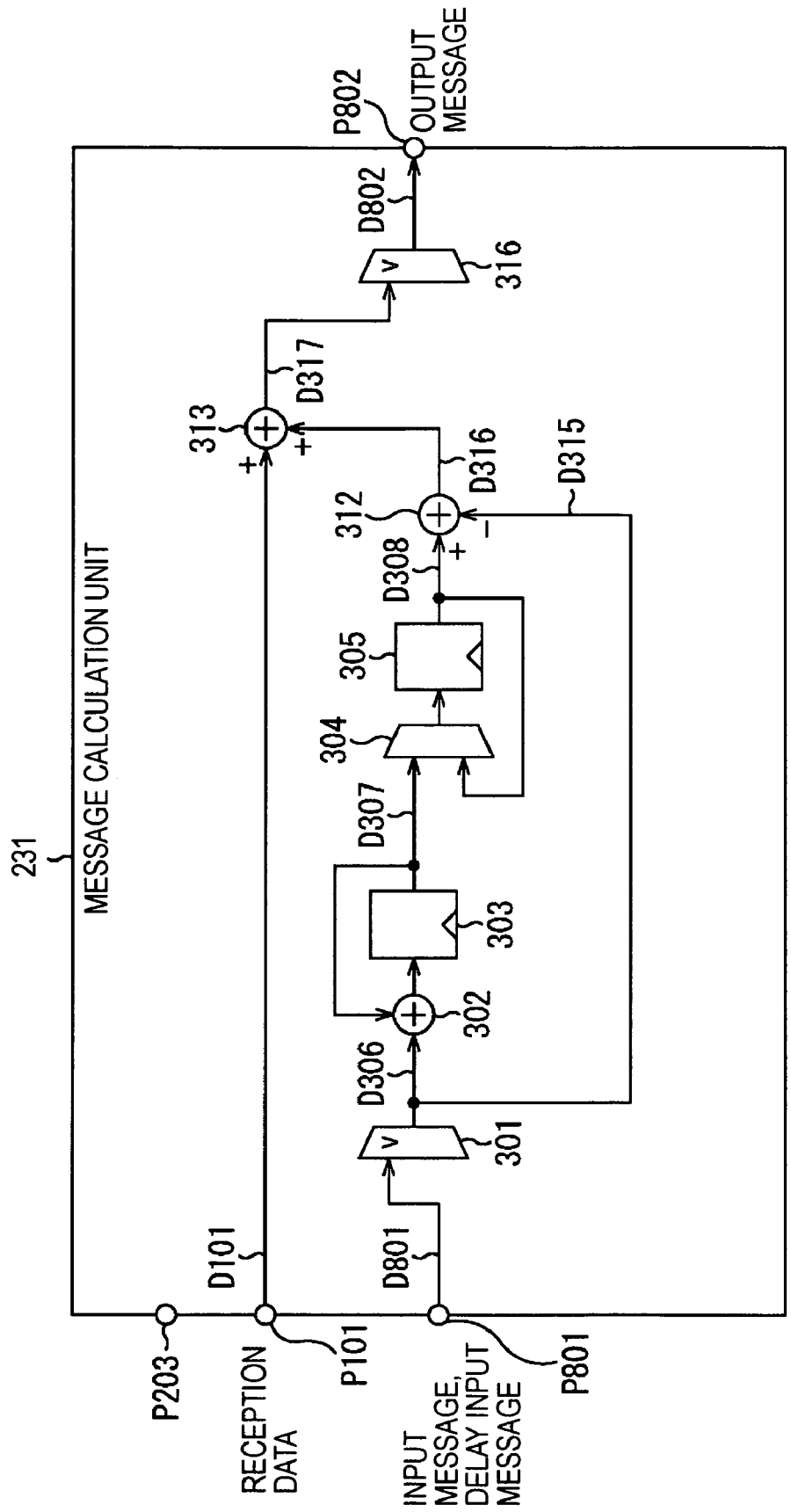
FIG. 38 is a block diagram illustrating an actual configuration of the message calculator 231 at the time of a variable node calculation.

FIG. 38 illustrates a substantial configuration example of the message calculation unit 231 in FIG. 37 at the time of a variable node calculation.

Note that as described above, at the time of a variable node calculation, the selectors 301 and 316 select the terminal v, but in FIG. 38, of the configuration illustrated in FIG. 37, the portions which do not function at the time of a variable node calculation by the selectors 301 and 316 selecting the terminal v (portions not relating to a variable node calculation) are omitted in the drawing.

The message calculation unit 231 performs the variable node calculation of Expression (1) using the message input from each of the input ports P101 and P801, and outputs the message D802 obtained as a result thereof from the output port P802.

That is to say, the input port P101 is supplied with the reception data D101 read out from the reception data memory 105. Also, the input port P801 is supplied with the first-time message D801 (check node message $u_j$) from the check node corresponding to each line of the parity check matrix, which is read out from the message memory 104 one by one.

The reception data D101 supplied to the input port P101 is supplied to the calculator 313.

Also, the message D801 (message $u_j$) supplied to the input port P801 is supplied to the terminal v of the selector 301, and is supplied to the calculator 302 (and calculator 312) from the selector 301 which selects the terminal v at the time of a variable node calculation as a message D306.

The calculator 302 integrates the message D306 by adding the message D306 (message $u_j$) from the selector 301 and the value D307 stored in the register 303, and restores the integration value obtained as a result thereof in the register 303. Note that in the event of the messages D306 from all of the branches across one row of the parity check matrix being integrated, the register 303 is reset.

In the event that the messages D801 across one row of the parity check matrix are read in one by one, and the integration value wherein the messages D306 of the one row worth are integrated is stored in the register 303, i.e., in the event that the integration value ($\Sigma u_j$ of j=1 through $d_v$) wherein the messages D306 (messages $u_j$) from all of the branches across one row of the parity check matrix are integrated is stored in the register 303, the selector 304 selects the value stored in the register 303, i.e., the integration value D307 ($\Sigma u_j$ of j=1 through $d_v$) wherein the messages D306 (messages $u_j$) of all of the branches across the one row of the parity check matrix are integrated, and outputs this to the register 305 to store this.

The register 305 supplies the stored value D307 to the selector 304 and the calculator 312 as a value D308. The selector 304 selects the value D308 supplied from the register 305, and outputs this to the register 305 to restore this until immediately before the value wherein the messages D306 of one row worth are integrated is stored in the register 303. That is to say, the register 305 supplies the value previously integrated to the selector 304 and the calculator 312 until the messages D306 (messages $u_j$) from all of the branches across one row of the parity check matrix are integrated.

On the other hand, upon output of a new value D308 ($\Sigma u_j$ of j=1 through $d_v$) being started from the register 305, i.e., immediately after the integration value ($\Sigma u_j$ of j=1 through $d_v$) wherein the messages D801 of one row worth are integrated is stored in the register 303, with the message calculation unit 231, the same messages D801 as the messages D801 (messages $u_j$), i.e., the second-time messages $u_j$ from the message memory 104 are input from the input port P801 one by one, and the messages D801 thereof are supplied to the terminal v of the selector 301.

The selector 301 selects the terminal v as described above, and supplies the message (second-time message) D801 supplied to the terminal v thereof to the calculator 312 as a message D315 (and also supplied to the calculator 302 as a message D306).

The calculator 312 subtracts the messages D315 supplied from the input port P801 via the selector 301 from the integration value D308 supplied from the register 305. That is to say, the calculator 312 subtracts the message D315 that is the message $u_j$ ($u_j$ of j=$d_v$) obtained from a desired branch from the integration value D308 ($\Sigma u_j$ of j=1 through $d_v$) of the messages D801 (messages $u_j$) of all of the branches across one row of the parity check matrix to obtain the subtraction value ($\Sigma u_j$ of j=1 through $d_v$–1), and supplies this to the calculator 313.

The calculator 313 adds the reception data D101 from the input port P101 and the subtraction value ($\Sigma u_j$ of j=1 through $d_v$–1) from the calculator 312, and supplies the addition value D317 obtained as a result thereof to the terminal v of the selector 316.

The selector 316 selects the terminal v at the time of a variable node calculation, and the addition value D317 from the calculator 313 supplied to the terminal v thereof is output from the output port P802 as a message D802 (message $v_i$).

As described above, the message calculation unit 231 wherein the selectors 301 and 304 select the terminal v performs the variable node calculation of Expression (1), and outputs the message (variable node message) $v_i$ obtained as a result thereof from the output port P802.

Figure 39:
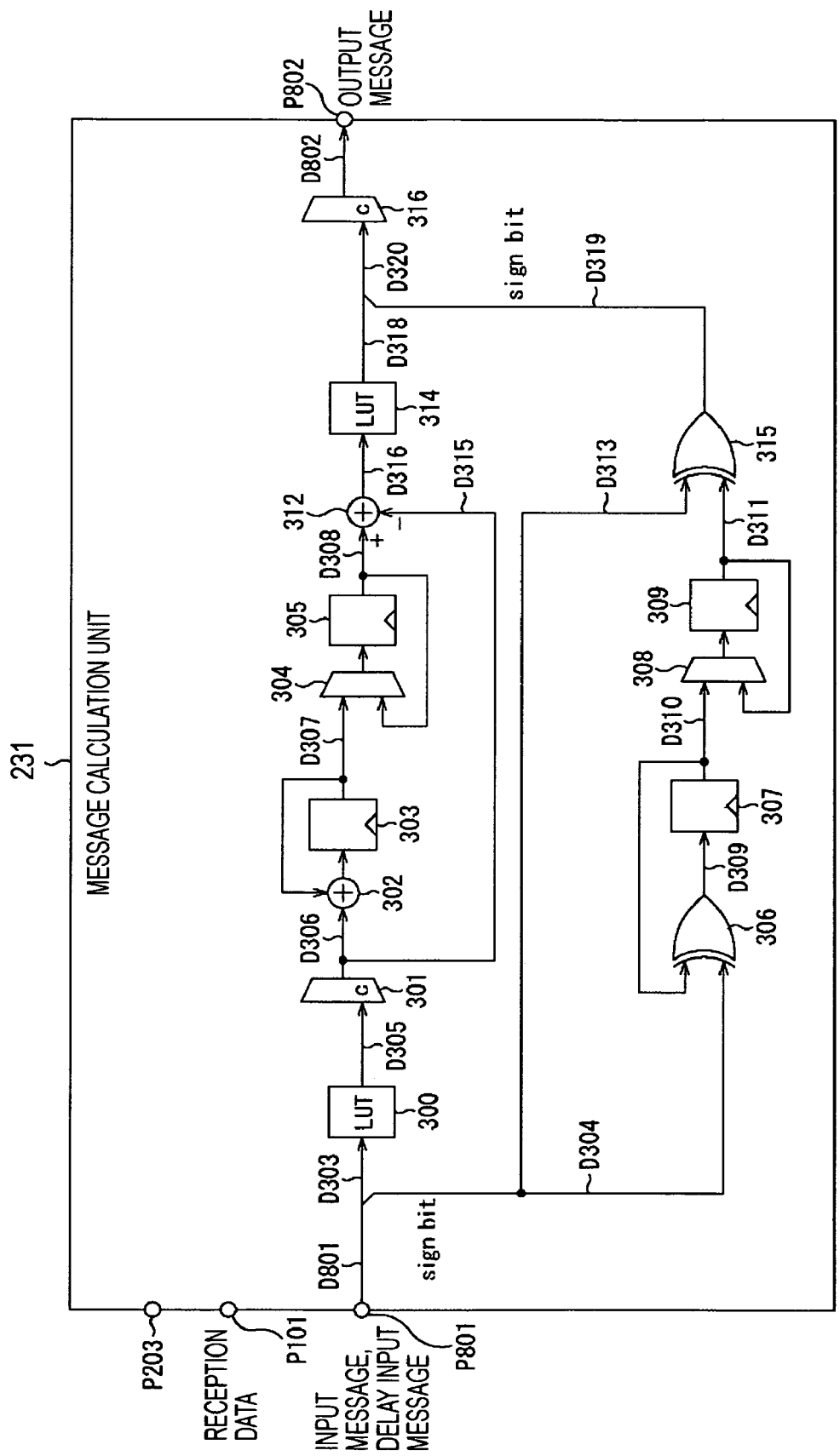
FIG. 39 is a block diagram illustrating an actual configuration of the message calculator 231 at the time of a check node calculation.

FIG. 39 illustrates a substantial configuration example of the message calculation unit 231 in FIG. 37 at the time of a check node calculation.

Note that as described above, at the time of a check node calculation, the selectors 301 and 316 select the terminal c, but in FIG. 39, of the configuration illustrated in FIG. 37, the portions which do not function at the time of a check node calculation by the selectors 301 and 316 selecting the terminal c (portions not relating to a check node calculation) are omitted in the drawing.

At the time of a check node calculation, the input port P801 is sequentially supplied with the variable node message $v_i$ from the variable node corresponding to each row of the parity check matrix as a message D801, which is read out from the message memory 104 one by one.

Of the message D801 (message $u_j$) supplied to the input port P801, the lower bits except for the most significant bit, i.e., the absolute value D303 ($|v_i|$) of the message D801 is supplied to the LUT 300, and the most significant bit, i.e., the sign bit of the message D801 is supplied to the EXOR circuit 306 as a sign bit D304 (and also supplied to the EXOR circuit 315 as a value D313).

The LUT 300 reads out the calculation result D305 ($\Phi(|v_i|)$) obtained as a result of calculation of the nonlinear function $\Phi(|v_i|)$ with the absolute value D303 ($|v_i|$) as an argument, and supplies this to the terminal c of the selector 301.

The selector 301 selects the terminal c at the time of a check node calculation, and the calculation result D305 ($\Phi(|v_i|)$) from the LUT 300 supplied to the terminal c thereof is supplied to the calculator 302 as a calculation result D306 ($\Phi(|v_i|)$) (and also supplied to the calculator 312 as a calculation result D315 ($\Phi(|v_i|)$)).

The calculator 302 integrates the calculation result D306 by adding the calculation result D306 ($\Phi(|v_i|)$) and the value D307 stored in the register 303, and restores the integration value obtained as a result thereof in the register 303. Note that in the event that the calculation results D306 ($\Phi(|v_i|)$) as to the absolute values D303 ($|v_i|$) of the messages D801 of all of the branches across one line of the parity check matrix are integrated, the register 303 is reset.

In the event that the messages D801 across one line of the parity check matrix are read in one by one, and the integration value wherein the calculation results D306 of one line worth are integrated is stored in the register 303, the selector 304 selects the value stored in the register 303, i.e., the integration value D307 ($\Sigma\Phi(|v_i|)$ of i=1 through i=$d_c$) wherein $\Phi(|v_i|)$ obtained from the messages D801 (messages $v_i$) from all of the branches across one line of the parity check matrix is integrated, and outputs this to the register 305 to store this. The register 305 supplies the stored integration value D307 to the selector 304 and the calculator 312 as a value D308.

The selector 304 selects the value D308 supplied from the register 305, and outputs this to the register 305 to restore this until immediately before the integration value wherein the calculation results D306 of one line worth are integrated is stored in the register 303. That is to say, the register 305 supplies the integration value of $\Phi(|v_i|)$ previously integrated to the selector 304 and the calculator 312 until $\Phi(|v_i|)$ obtained from the messages D801 (messages $v_i$) from all of the branches across one line of the parity check matrix is integrated.

On the other hand, upon output of a new value D308 ($\Sigma\Phi(|v_i|)$ of i=1 through $d_c$) being started from the register 305, i.e., immediately after the integration value ($\Sigma\Phi(|v_i|)$ of i=1 through $d_c$) wherein the calculation results D306 of one row worth are integrated is stored in the register 305, with the message calculation unit 231, the second-time message D801 ($v_i$) from the message memory 104 is input from the input port P801 one by one, the absolute value D303 ($|v_i|$) of the message D801 thereof is supplied to the LUT 300, and the sign bit of the message D801 is supplied to the EXOR circuit 315 as a sign bit D313 (and also supplied to the EXOR circuit 315 as a sign bit D304).

The LUT 300 reads out the calculation result D305 ($\Phi(|v_i|)$) obtained as a result of calculation of the nonlinear function $\Phi(|v_i|)$ with the absolute value D303 ($|v_i|$) of the message D801 as an argument, and supplies this to the terminal c of the selector 301.

The selector 301 selects the terminal c at the time of a check node calculation, and the calculation result D305 ($\Phi(|v_i|)$) from the LUT 300 supplied to the terminal c thereof is supplied to the calculator 312 as a calculation result D315 ($\Phi(|v_i|)$) (and also supplied to the calculator 302 as a calculation result D306).

The calculator 312 subtracts the value D315 supplied from the selector 301 from the value D308 supplied from the register 305, and supplies the subtraction result thereof to the LUT 314 as a subtraction value D316. That is to say, the calculator 312 subtracts the value D315 of $\Phi(|v_i|)$ obtained from the message D801 (message $v_i$) obtained from a desired branch from the integration value D308 ($\Sigma\Phi(|v_i|)$ of i=1 through i=$d_c$) of $\Phi(|v_i|)$ obtained from the messages D801 (messages $v_i$) from all of the branches across one line of the parity check matrix, and supplies the subtraction value thereof ($\Sigma\Phi(|v_i|)$ of i=1 through i=$d_c$−1) to the LUT 314 as a subtraction value D316.

The LUT 314 outputs the calculation result D318 ($\Phi^{-1}(\Sigma\Phi(|v_i|))$) as a result of calculation of the inverse function $\Phi^{-1}(\Sigma\Phi(|v_i|))$ with the subtraction value D316 ($\Sigma\Phi(|v_i|)$ of i=1 through i=$d_c$−1) from the calculator 312 as an argument.

In parallel with the above processing, the EXOR circuit 306 calculates exclusive OR between the value D310 stored in the register 307 and the sign bit D304, whereby multiplication is made between the sign bits, and the multiplication result D309 is restored in the register 307. Note that in the event that the sign bits D304 of the messages D801 from all of the branches across one line of the parity check matrix are multiplied, the register 307 is reset.

In the event that the multiplication result D309 ($\Pi sign(v_i)$ of i=1 through i=$d_c$) wherein the sign bits D304 of the messages D801 from all of the branches across one line of the parity check matrix are multiplied is stored in the register 307, the selector 308 selects the value stored in the register 307, i.e., the value D310 ($\Pi sign(v_i)$ of i=1 through i=$d_c$) wherein the sign bits D304 of the messages D801 from all of the branches across one line of the parity check matrix are multiplied, and outputs this to the register 309 to store this. The register 309 supplies the stored value D311 to the selector 308 and the EXOR circuit 315.

The selector 308 selects the value D311 supplied from the register 309, and outputs this to the register 309 to restore this until immediately before the multiplication result D309 ($\Pi sign(v_i)$ of i=1 through i=$d_c$) wherein the sign bits D304 of the messages D801 from all of the branches across one line of the parity check matrix are multiplied is stored in the register 307. That is to say, the register 309 supplies the value previously stored to the selector 308 and the EXOR circuit 315 until the sign bits D304 of the messages D801 (message $v_i$) from all of the branches across one line of the parity check matrix are multiplied.

On the other hand, when a new value D311 ($\Pi sign(v_i)$ of i=1 through i=$d_c$) is supplied to the EXOR circuit 315 from the register 309, i.e., when the value D310 ($\Pi sign(v_i)$ of i=1 through i=$d_c$) wherein the sign bits D304 of the messages D801 from all of the branches across one line are multiplied is stored in the register 307, as described above, the integration value ($\Sigma\Phi(|v_i|)$ of i=1 through i=$d_c$) wherein the calculation results D306 ($\Phi(|v_i|)$) of one line worth are integrated is stored in the register 305.

When the integration value ($\Sigma\Phi(|v_i|)$ of i=1 through i=$d_c$) wherein the calculation results D306 ($\Phi(|v_i|)$) of one line worth are integrated is stored in the register 305, as described above, with the message calculation unit 231, the second-time message D801 ($v_i$) from the message memory 104 is input from the input port P801 one by one, the absolute value D303 ($|v_i|$) of the second-time message D801 thereof is supplied to the LUT 300, and the sign bit of the message D801 is supplied to the EXOR circuit 315 as a sign bit D313 (and also supplied to the EXOR circuit 306 as a sign bit D304).

The EXOR circuit 315 calculates exclusive OR between the value D311 supplied from the register 309 and the sign bit D313 of the second-time message D801 from the input port P801, whereby the value D311 is divided by the sign bit D313, and the division result thereof is output as a division value D319. That is to say, the EXOR circuit 315 divides the multiplication value of the sign bits D304 ($\Pi sign(v_i)$ of i=1 through i=$d_c$) of the messages D801 from all of the branches across one line of the parity check matrix by the sign bit D313 ($sign(v_i)$ of i=$d_c$) of the message $v_i$ from a desired branch, and outputs the division value ($\Pi sign(v_i)$ of i=1 to i=$d_c$−1) thereof as a division value D319.

Subsequently, with the message calculation unit 231, a bit string D320 (message $u_j$) wherein the calculation result D318 output from the LUT 314 is taken as lower bits, and also the division value D319 output from the EXOR circuit 315 is taken as the most significant bit (sign bit) is supplied to the terminal c of the selector 316.

The selector 316 selects the terminal c at the time of a check node calculation, and the bit string D320 (message $u_j$) supplied to the terminal c thereof is output from the output port P802 as a message D802 (message $v_i$).

As described above, the message calculation unit 231 wherein the selectors 301 and 316 select the terminal c performs the check node calculation of Expression (7), and outputs the message (check node message) $u_j$ obtained as a result thereof from the output port P802.

Note that though not shown in the drawing, with the decoding device in FIG. 36, the calculation of Expression (5) is performed instead of the variable node calculation of Expression (1) at the final stage of decoding, and the calculation result thereof is output as the final decoding result.

Also, with the decoding device in FIG. 36, the control unit 232 performs the same read/write control as that in the control unit 174 of the decoding device in FIG. 12 as read/write control of a message (data) as to the message memory 104, such as described with the flowchart in FIG. 15.

However, the read/write timing of a message as to the message memory 104 of the decoding device in FIG. 36 differs from the case of FIG. 16 described regarding the decoding device in FIG. 12 since the message calculation unit 231 includes the single input port P801 alone as an input port to which a message from the message memory 104 is input.

FIG. 40 is a timing chart illustrating the read/write timing of a message as to the message memory 104 of the decoding device in FIG. 36.

The timing chart in FIG. 40 represents read/write timing as to the RAM#A and RAM#B making up the message memory 104, as with the above timing chart in FIG. 16.

In FIG. 40, first of all, the first-time readout from the RAM#A of the input message necessary for obtaining the output message from a certain node node#1 is performed (R1(node#1). Following the readout thereof, the second-time readout from the RAM#A of the input message necessary for obtaining the output message from the node node#1 is performed (R2(node#1). At this time, in FIG. 16, the first-time readout from the RAM#B of the input message necessary for obtaining the output message from the next node#2 (R1 (node#2)), but the message calculation unit 231 of the decoding device in FIG. 36 includes the single input port P801 alone (as an input port for inputting a message from the message memory 104), and accordingly in FIG. 40, the first-time readout (R1(node#2)) from the RAM#B of the input message necessary for obtaining the output message from the next node#2 is not performed yet.

Upon the second-time readout from the RAM#A of the input message necessary for obtaining the output message from the node node#1 being completed, and the output message from the node node#1 being obtained at the message calculation unit 231, the output message from the node node#1 thereof is written in the RAM#A (W(node#1)), and at the same time, the first-time readout from the RAM#B of the input message necessary for obtaining the output message from the node node#2 is performed (R1(node#2)).

Upon the first-time readout from the RAM#B of the input message necessary for obtaining the output message from the node node#2 being completed, subsequently the first-time readout from the RAM#B of the input message necessary for obtaining the output message from the node node#2 is performed (R2(node#2)), the output message from the node node#2 is obtained at the message calculation unit 231, and subsequently if the output message from the node node#2 is requested, the output message from the node node#2 thereof is written in the RAM#B (W(node#2)), and at the same time, the first-time readout from the RAM#A of the input message necessary for obtaining the output message from the next node node#3 is performed (R1(node#3)).

Hereinafter, in the same way, read/write of the message corresponding to each of the RAM#A and RAM#B making up the message memory 104 is continuously performed.

As can be understood from comparison between FIG. 16 and FIG. 40, with the decoding device in FIG. 36, it takes more time than the case of FIG. 16 to obtain an output message, but decoding can be performed without providing delaying memory, and accordingly, the scale of the decoding device can be reduced.

Note that a configuration wherein one input port to which an input message from the message memory 104 is input such as the message calculation unit 231 (FIG. 31) can be also employed for the variable node calculator 172 (FIG. 13) and check node calculator 173 (FIG. 14) of the message calculation unit 171 in FIG. 12, the message calculation unit 201 in FIG. 22, the message calculation unit 211 in FIG. 27, and the message calculation unit 221 in FIG. 32.

Also, the message memory 104 can be configured of three banks or more using three types of RAM as well as being configured of the two banks made up of the RAM#A and RAM#B.

The read/write control processing as to the message memory 104 illustrated in FIG. 15 that can be performed by the control unit 174 (FIG. 12) and so forth can be performed by using dedicated hardware, or by using software. In the event that the series of processing is performed by software, a program making up the software thereof is installed in a computer such as a microcomputer or the like.

FIG. 41 illustrates a configuration example of one embodiment of a computer in which a program for executing the above series of processing is installed.

The program can be recorded in nonvolatile memory 905 or ROM 903 which is a recording medium built into the computer.

Alternatively, the program can be temporarily or eternally stored (recorded) in a removable recording medium such as a flexible disk, CD-ROM (Compact Disc Read Only Memory), MO (Magneto Optical) disc, DVD (Digital Versatile Disc), a magnetic disk, semiconductor memory, or the like.

Note that the program can be installed in the computer from the removable recording medium 911 such as described above, or through a network.

A CPU (Central Processing Unit) 902 is built into the computer. The CPU 902 is connected with an input/output interface 906 via a bus 901, and the CPU 902 loads the program installed in the ROM (Read Only Memory) 903 or the nonvolatile memory 905 in RAM (Random Access Memory) 904 to execute the program. Thus, the CPU 902 performs read/write control as to the message memory 104 via the input/output interface 906.

It should be further noted that the processing steps for describing a program for causing a computer various types of processing in the present Specification are not restricted to being carried out in the time-sequence described as the flowchart, and may include processing that is executed in parallel or individually (e.g., parallel processing, or processing using an object).

Also, the program may be processed by one computer, or may be processed by multiple computers.

Note that the embodiments of the present invention are not restricted to the above embodiments, and various types of modifications can be made without departing from the spirit and scope of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A decoding device for decoding LDPC (Low Density Parity Check) codes, comprising: message calculation means for performing a variable node calculation for decoding said LPDC codes using a message to be supplied, or performing a check node calculation, and outputting the message to be obtained as a result of said calculation; storing means for storing said message; and control means for performing writing control for writing the message that said message calculation means output in said storing means, and readout control for reading out the same message to be employed for the calculation of said message calculation means from said storing means twice, and supplying these to said message calculation means.

2. The decoding device according to claim 1, said message calculation means including a port from which a message to be read out at the first time is supplied of the same messages to be read out twice from said storing means, and a port from which a message to be read out at the second time is supplied.

3. The decoding device according to claim 1, said message calculation means including variable node calculation means for performing a variable node calculation, and check node calculation means for performing a check node calculation.

4. The decoding device according to claim 1, wherein said storing means include two or more banks.

5. The decoding device according to claim 1, wherein said message calculation means perform a variable node calculation and a check node calculation selectively.

6. The decoding device according to claim 5, wherein with said message calculation means, a part of a circuit for performing a variable node calculation and a circuit for performing a check node calculation is shared.

7. The decoding device according to claim 6, said message calculation means including one LUT (Look Up Table) for outputting the calculation result of a nonlinear function $\Phi(x) = -\ln(\tan h(x/2))$ as to input data x input to a check node, and another one LUT for outputting the calculation result of the inverse function $\Phi^{-1}(x) = 2 \tan h^{-1}(e^{-x})$ of said linear function as to output data x output from a check node, wherein said message calculation means cause data to pass through said one LUT and another one LUT at the time of a check node calculation, and and wherein message calculation means cause data to bypass said one LUT and another one LUT at the time of a variable node calculation.

8. The decoding device according to claim 6, wherein said message calculation means include an LUT (Look Up Table) for outputting the calculation result of a nonlinear function $\Phi(x) = -\ln(\tan h(x/2))$ from which the same calculation result as an inverse function $\Phi^{-1}(x) = 2 \tan h^{-1}(e^{-x})$ as to input data x to be input to a check node, and also outputting the calculation result of said inverse function $\Phi^{-1}(x)$ as to input data x to be input to a variable node.

9. The decoding device according to claim 6, wherein said message calculation means include an LUT (Look Up Table) for outputting the calculation result of a nonlinear function $\Phi(x) = -\ln(\tan h(x/2))$ from which the same calculation result as an inverse function $\Phi^{-1}(x) = 2 \tan h^{-1}(e^{-x})$ as to output data x output from a variable node, and also outputting the calculation result of said inverse function $\Phi^{-1}(x)$ as to output data x output from a check node.

10. A control method for controlling a decoding device for decoding LDPC (Low Density Parity Check) codes, said decoding device comprising: message calculation means for performing a variable node calculation for decoding said LPDC codes using a message to be supplied, or performing a check node calculation, and outputting the message to be obtained as a result of said calculation; and storing means for storing said message; including the steps of: writing control for writing the message that said message calculation means output in said storing means; and readout control for reading out the same message to be employed for the calculation of said message calculation means from said storing means twice, and supplying these to said message calculation means.

11. A non-transitory computer-readable medium including instructions, executable by a processor, for performing a method of controlling a decoding device for decoding LDPC (Low Density Parity Check) codes, wherein said decoding device comprises:
message calculation means for performing a variable node calculation for decoding said LPDC codes using a message to be supplied, or performing a check node calculation, and outputting the message to be obtained as a result of said calculation; and
storing means for storing said message;
including the steps of:
writing control for writing the message that said message calculation means output in said storing means; and
readout control for reading out the same message to be employed for the calculation of said message calculation means from said storing means twice, and supplying these to said message calculation means.

12. A decoding device for decoding LDPC (Low Density Parity Check) codes, comprising: a message calculation unit for performing a variable node calculation for decoding said LPDC codes using a message to be supplied, or performing a check node calculation, and outputting the message to be obtained as a result of said calculation; a storing unit for storing said message; and a control unit for performing writing control for writing the message that said message calculation unit output in said storing unit, and readout control for reading out the same message to be employed for the calculation of said message calculation unit from said storing unit twice, and supplying these to said message calculation unit.

13. A control method for controlling a decoding device for decoding LDPC (Low Density Parity Check) codes, said decoding device comprising: a message calculation unit for performing a variable node calculation for decoding said LPDC codes using a message to be supplied, or performing a check node calculation, and outputting the message to be obtained as a result of said calculation; and a storing unit for storing said message; including the steps of: writing control for writing the message that said message calculation unit output in said storing unit; and readout control for reading out the same message to be employed for the calculation of said message calculation unit from said storing unit twice, and supplying these to said message calculation unit.

14. A non-transitory computer-readable medium including instructions, executable by a processor, for performing a method of controlling a decoding device for decoding LDPC (Low Density Parity Check) codes, wherein said decoding device comprises:
a message calculation unit for performing a variable node calculation for decoding said LPDC codes using a message to be supplied, or performing a check node calculation, and outputting the message to be obtained as a result of said calculation; and
a storing unit for storing said message;
including the steps of:
writing control for writing the message that said message calculation unit output in said storing unit; and
readout control for reading out the same message to be employed for the calculation of said message calculation unit from said storing unit twice, and supplying these to said message calculation unit.

* * * * *